US012627293B2

(12) United States Patent
Hara

(10) Patent No.: US 12,627,293 B2
(45) Date of Patent: May 12, 2026

(54) SEMICONDUCTOR DEVICE

(71) Applicant: Rohm Co., Ltd., Kyoto (JP)

(72) Inventor: Hideo Hara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 103 days.

(21) Appl. No.: 18/590,556

(22) Filed: Feb. 28, 2024

(65) Prior Publication Data

US 2024/0204777 A1      Jun. 20, 2024

Related U.S. Application Data

(63) Continuation of application No. PCT/JP2022/024328, filed on Jun. 17, 2022.

(30) Foreign Application Priority Data

Aug. 30, 2021    (JP) ................................. 2021-139893
Aug. 30, 2021    (JP) ................................. 2021-139895

(Continued)

(51) Int. Cl.
H03K 17/06        (2006.01)
H02M 1/08         (2006.01)
(Continued)

(52) U.S. Cl.
CPC .......... H03K 17/6871 (2013.01); H02M 1/08 (2013.01); H02M 3/07 (2013.01);
(Continued)

(58) Field of Classification Search
CPC ........... H03K 17/6871; H03K 17/6874; H03K 17/063; H03K 2217/0063;
(Continued)

(56) References Cited

U.S. PATENT DOCUMENTS 11,095,229  B1      8/2021  Hsing et al.
2011/0018613  A1*   1/2011  Wang .................. H02M 3/1588
                                                    327/530

(Continued)

FOREIGN PATENT DOCUMENTS

JP          2018-019498          2/2018

OTHER PUBLICATIONS

International Search Report and Written Opinion in International Appln. No. PCT/JP2022/024328, mailed on Aug. 23, 2022, 15 pages (with machine translation).

(Continued)

*Primary Examiner* — Sibin Chen
(74) *Attorney, Agent, or Firm* — Fish & Richardson P.C.

(57)          ABSTRACT

A semiconductor device includes a first and a second output transistor on a high and a low side respectively, a first terminal connected to the connection node between the first and second output transistors, and a second terminal configured to be connected via a bootstrap capacitor to the first terminal. The first output transistor is driven based on a voltage between the first and second terminals. A switching circuit is provided between a terminal fed with a predetermined control supply voltage and the second terminal. The switching circuit includes a first and a second switching element, which are N-channel MOSFETs connected in series. According to the voltage at the first terminal, the first and second switching elements are turned on or off.

6 Claims, 43 Drawing Sheets

(30)          Foreign Application Priority Data

| Aug. 30, 2021 | (JP) | ................................ | 2021-139898 |
| Aug. 30, 2021 | (JP) | ................................ | 2021-139899 |
| Aug. 30, 2021 | (JP) | ................................ | 2021-139902 |

(51)  Int. Cl.
      *H02M 3/07*          (2006.01)
      *H03K 17/687*        (2006.01)
(52)  U.S. Cl.
      CPC ................ *H03K 2217/0063* (2013.01); *H03K 2217/0072* (2013.01)
(58)  Field of Classification Search
      CPC .. H03K 2217/0072; H03K 2217/0081; H02M 1/08; H02M 3/07; H02M 3/155
      See application file for complete search history.

(56)          References Cited

U.S. PATENT DOCUMENTS

| 2014/0176221 A1* | 6/2014 | Lin ........................... H03L 5/00 |
| | | 327/333 |
| 2020/0052687 A1* | 2/2020 | Ming ................... H03K 17/162 |
| 2021/0091655 A1 | 3/2021 | Hegde et al. |
| 2022/0006450 A1* | 1/2022 | Fontana .................. H02M 1/08 |
| 2023/0010711 A1* | 1/2023 | Mayell .................... H02M 1/08 |

OTHER PUBLICATIONS

JP OA—Japanese Patent Office, Office Action in Japanese Appln. No. 2023-545105, dated Feb. 17, 2026, 6 pages (with English translation).

* cited by examiner

BOTH-OFF PERIOD P_DD1

BOTH-OFF PERIOD P_DD2

REFERENCE EXAMPLE

REFERENCE EXAMPLE

FIG.12

| PERIOD | Sig_p | Sig_n | Sig_dff | STATE OF SWITCHING CIRCUIT |
|---|---|---|---|---|
| $P_{HON}$ / $P_{DD2}$ | 1 | 0 | − | M2_D  M1_D  VB (>VCC) DISCHARGING INHIBITED  LN_VB  M1 OFF(ON)  M2 OFF  VCC  LN_VCC |
| $P_{LON}$ | 0 | 0 | − | M2_D  M1_D  VB (≈VCC)  LN_VB  M1 ON  M2 ON  VCC  LN_VCC |
| $P_{DD1}$ | 0 | 1 | 0 | M2_D  M1_D  VB−VS<Vth_dff ≈VCC  VB (<0)  LN_VB  M1 ON  M2 OFF(ON)  VCC  LN_VCC |
| $P_{DD1}$ | 0 | 1 | 1 | M2_D  M1_D  VB−VS>Vth_dff ≈VCC  CHARGING INHIBITED  VB (<0)  LN_VB  M1 OFF  M2 OFF(ON)  VCC  LN_VCC |

VS = VPn2 > Vth_n
(EXAMPLE: VSn2 = 0V OR VP)

FIG.32

STATE ST_p4b
(VS FALLING: VS≈0 OR NEGATIVE)

STATE ST_p5
(VS COMPLETED FALLING: VS<0)

SEMICONDUCTOR DEVICE

CROSS-REFERENCE TO RELATED APPLICATIONS

This nonprovisional application is a continuation application of International Patent Application No. PCT/JP2022/024328 filed on Jun. 17, 2022, which claims priority Japanese Patent Applications No. 2021-139893, No. 2021-139895, No. 2021-139898, No. 2021-139899, and No. 2021-139902 all filed on Aug. 30, 2021, the entire contents of which are hereby incorporated by reference.

TECHNICAL FIELD

The present disclosure relates to semiconductor devices.

BACKGROUND ART

A bootstrap circuit including a bootstrap capacitor is used to drive a high-side transistor in a half-bridge circuit. In a device that includes a bootstrap circuit, generally, one terminal of a bootstrap capacitor is connected to a connection node between a high-side transistor and a low-side transistor and the other terminal of the bootstrap capacitor is connected to the cathode of a bootstrap diode. The anode of the bootstrap diode is fed with a predetermined voltage. Based on the charge voltage of the bootstrap capacitor, the high-side transistor is driven. As the potential at the above-mentioned connection node varies as a result of the high-side and low-side transistors being switched, the bootstrap capacitor is charged.

CITATION LIST

Patent Literature

Patent Document 1: JP-A-2018-19498

BRIEF DESCRIPTION OF DRAWINGS

FIG. 12 is a diagram showing the relationship among a plurality of periods, a plurality of detection signals, and the state of a switching circuit in connection with the first embodiment of the present disclosure.

FIG. 32 is a diagram illustrating a state transition of the high voltage detection circuit in connection with the third embodiment of the present disclosure.

DESCRIPTION OF EMBODIMENTS

Figure 1:
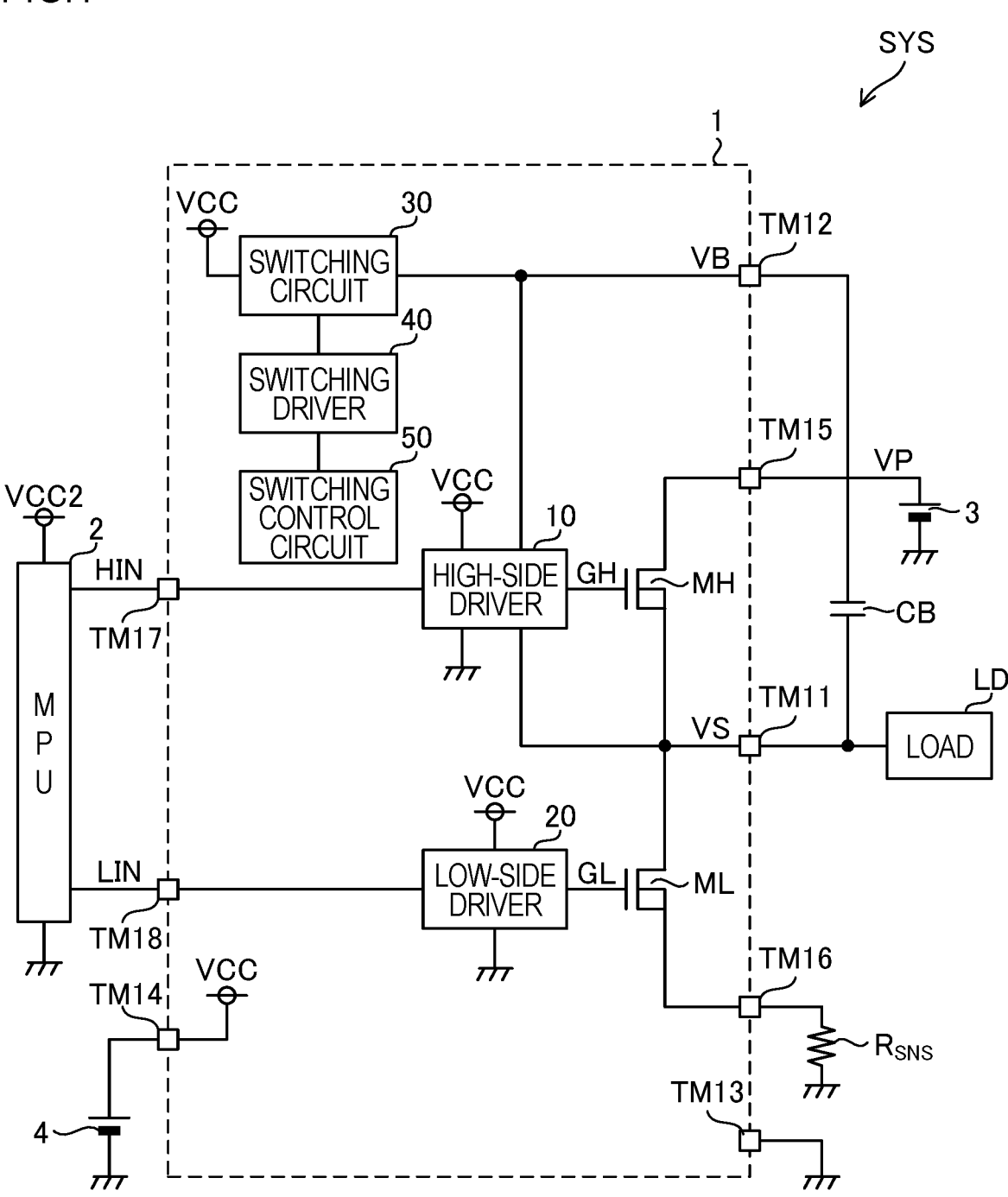
FIG. 1 is an overall configuration diagram of a load driving system according to a first embodiment of the present disclosure.

Examples of implementing the present disclosure will be specifically described below with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the high-side output transistor described later and identified by the reference sign "MH" (see FIG. 1) is sometimes referred to as "high-side output transistor MH" and other times abbreviated to "output transistor MH" or further to "transistor MH", all referring to the same entity.

First, some of the terms used to describe embodiments of the present disclosure will be defined. "Line" refers to a wiring across or to which an electric signal is transmitted or applied. "Ground" denotes a reference conductor at a reference potential of 0 V (zero volts), or to a potential of 0 V itself. A potential of 0 V is occasionally referred to as a ground potential. In embodiments of the present disclosure, any voltage mentioned with no particular reference mentioned is a potential relative to the ground.

"Level" denotes the level of a potential, and for any signal or voltage of interest, "high level" is a potential higher than "low level". For any signal or voltage of interest, its being at high level means, more precisely, its level being equal to high level, and its being at low level means, more precisely, its level being equal to low level. A level with respect to a signal is occasionally referred to as a signal level, and a level with respect to a voltage is occasionally referred to as a voltage level. For any signal of interest, if the signal is at high level, its inversion signal is at low level, and if the signal is at low level, its inversion signal is at high level.

For any signal or voltage, a switch from low level to high level is termed an up edge (or rising edge). Likewise, for any signal or voltage, a switch from high level to low level is termed a down edge (or falling edge).

For any transistor configured as an FET (field-effect transistor), which can be a MOSFET, "on state" refers to a state where the transistor is conducting between its drain and source, and "off state" refers to a state where the transistor is not conducting (is cut off) between its drain and source. Similar definitions apply to any transistor that is not classified as an FET. Unless otherwise stated, any MOSFET can be understood to be an enhancement MOSFET. "MOSFET" is an abbreviation of "metal-oxide-semiconductor field-effect transistor". Unless otherwise stated, for any MOSFET mentioned in the following description, its back gate can be understood to be short-circuited to its source.

The electrical characteristics of a MOSFET include the gate threshold voltage. For any transistor that is an N-channel enhancement MOSFET, when the gate potential of the transistor is higher than the source potential of the transistor and the magnitude of the gate-source voltage of the transistor is equal to or higher than the gate threshold voltage of the transistor, the transistor is in the on state; otherwise, the transistor is in the off state. For any transistor that is a P-channel enhancement MOSFET, when the gate potential of the transistor is lower than the source potential of the transistor and the magnitude of the gate-source voltage of the transistor is equal to or higher than the gate threshold voltage of the transistor, the transistor is in the on state; otherwise, the transistor is in the off state.

For any transistor configured as a MOSFET, the gate-source voltage is the potential at the gate relative to the potential at the source. Any transistor mentioned in the following description has a withstand voltage sufficient to withstand any voltage applied to it.

In the following description, for any transistor, its being in the on or off state is occasionally expressed simply as its being on or off respectively. For any transistor, a switch from the off state to the on state is referred to as a turning-on, and a switch from the on state to the off state is referred to as a turning-off.

For any transistor, a period in which it is in the on state is often referred to as the on period, and a period in which it is in the off state is often referred to as the off period. For any signal that takes as its signal level high or low level, a period in which the signal is at high level is often referred to as the high-level period and a period in which the signal is at low level is often referred to as the low-level period. The same applies to any voltage that takes as its voltage level high or low level.

Unless otherwise stated, wherever "connection" is discussed among a plurality of parts constituting a circuit, as among given circuit elements, wirings (lines), nodes, and the like, the term is to be understood to denote "electrical connection".

First Embodiment

A first embodiment of the present disclosure will be described. FIG. 1 shows the overall configuration of a system SYS according to the first embodiment. The system SYS can be called a load driving system. The system SYS includes a semiconductor device 1 for driving a load LD, an MPU (microprocessor unit) 2, and voltage sources 3 and 4, and further includes a capacitor CB and a sense resistor R$_{SNS}$.

Figure 2:
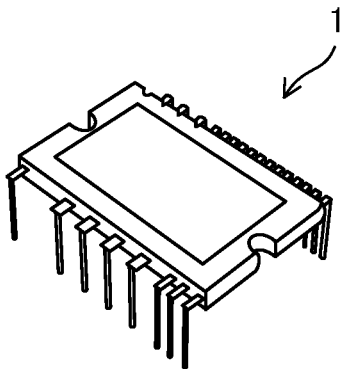
FIG. 2 is an exterior perspective view of a semiconductor device according to the first embodiment of the present disclosure.

FIG. 2 is an exterior perspective view of the semiconductor device 1. The semiconductor device 1 is an electronic component that includes a semiconductor chip having a semiconductor integrated circuit formed on a semiconductor substrate, semiconductor discrete components, a package (case) housing the semiconductor chip and the semiconductor discrete components, and a plurality of external terminals exposed out of the package to outside the semiconductor device 1. Sealing the semiconductor chip and the semiconductor discrete components in the package (case) formed of resin yields the semiconductor device 1. A semiconductor device 1 of this type can be called an IPM (intelligent power module). The number of external terminals, and the type of package, of the semiconductor device 1 shown in FIG. 2 are merely illustrative, and can be designed as desired.

As some of the external terminals provided in the semiconductor device 1, FIG. 1 shows terminals TM11 to TM18. The output terminal TM11 is an output terminal to which an output terminal voltage VS is applied. The terminal TM12 is a boot terminal to which a boot voltage VB is applied. The terminal TM13 is a ground terminal that is connected to a ground. The terminal TM14 is a control supply terminal to which a control supply voltage VCC is applied. The terminal TM15 is a power supply terminal to which a power supply voltage VP is applied. The terminal TM16 is a low-side terminal. The terminal TM17 is a control input terminal to which a driving control signal HIN is applied. The terminal TM18 is a control input terminal to which a driving control signal LIN is applied.

First, the configuration outside the semiconductor device 1 will be described. The load LD is connected to the output terminal TM11, and operates based on the electric power supplied via the output terminal TM11. The load LD includes an inductive load. For example, in a case where the system SYS is employed to form a DC/DC converter, the load LD can include a coil, of which one terminal can be connected to the output terminal TM11 and the other terminal can be connected via a smoothing capacitor (not illustrated) to the ground. The load LD may be a coil (armature winding) of a motor. The current that passes between the output terminal TM11 and the load LD will be referred to as the load current in the following description.

The capacitor CB is a bootstrap capacitor provided outside the semiconductor device 1. Outside the semiconductor device 1, the capacitor CB is provided between the terminals TM11 and TM12. That is, one terminal of the capacitor CB is connected to the output terminal TM11, and the other terminal of the capacitor CB is connected to the boot terminal TM12. A modification is possible where the capacitor CB is incorporated in the semiconductor device 1.

The voltage source 3 outputs a supply voltage VP with a positive direct-current voltage value. The supply voltage VP will occasionally be referred to as the power supply voltage. The power supply voltage VP is fed to the power supply terminal TM15. While the supply voltage VP may have any voltage value, the following description assumes as an example that the supply voltage VP is 600 V (volts).

The voltage source 4 outputs a supply voltage VCC with a positive direct-current voltage value. The supply voltage VCC will occasionally be referred to as the control supply voltage. The control supply voltage VCC is fed to the control supply terminal TM14. While the supply voltage VCC may have any voltage value, the following description assumes as an example that the supply voltage VCC is 18 V (volts).

The low-side terminal TM16 is connected via the sense resistor R$_{SNS}$ to the ground. A modification is possible where the sense resistor R$_{SNS}$ is incorporated in the semiconductor device 1. The low-side terminal TM16 may be connected directly to the ground. In the semiconductor device 1, based on the voltage drop across the sense resistor R$_{SNS}$, overcurrent protection operation can be performed with respect to an output transistor MH or ML, which will be described later. In the system SYS, the sense resistor R$_{SNS}$ may be omitted (the sense resistor R$_{SNS}$ may be understood to have a resistance value of 0Ω).

The MPU 2 is an arithmetic processing device that operates based on a supply voltage VCC2. The MPU 2 generates and outputs driving control signals HIN and LIN. The driving control signal HIN is fed to the control input terminal TM17, and the driving control signal LIN is fed to the control input terminal TM18. The driving control signals HIN and LIN are each a digital signal (binary signal) that takes either high or low level. The high level of the driving control signals HIN and LIN is equal to the level of the supply voltage VCC2, and the low level of the driving control signals HIN and LIN is equal to the level of the ground (see FIG. 3). Here, "being equal" covers "being substantially equal". While the supply voltage VCC2 may have any voltage value, the following description assumes as an example that the supply voltage VCC2 is 5 V (volts).

Next, the configuration inside the semiconductor device 1 will be described. As shown in FIG. 1, the semiconductor device 1 includes a high-side output transistor MH and a low-side output transistor ML, and further includes a high-side driver 10, a low-side driver 20, a switching circuit 30, a switching driver 40, and a switching control circuit 50.

The output transistors MH and ML are configured as N-channel MOSFETs. For example, the output transistors MH and ML can be included as discrete components in the semiconductor device 1. The output transistors MH and ML are configured using silicon carbide (SiC). Instead, any semiconductor material (silicon) other than silicon carbide may be used for the output transistors MH and ML. Though not specifically shown in FIG. 1, the output transistors MH and ML are each accompanied by a parasitic diode. In each output transistor, the forward direction of the parasitic diode coincides with the direction from the source to the drain of the output transistor.

The drain of the output transistor MH is connected to the power supply terminal TM15, which is fed with the supply voltage VP. The source of the output transistor MH and the drain of the output transistor ML are connected together at the output terminal TM11. That is, the output terminal TM11 is connected to the connection node between the output transistors MH and ML. The source of the output transistor ML is connected to the low-side terminal TM16. Thus, the output transistor ML is, at the low-potential side of the output transistor MH, connected in series with the output transistor MH.

The high-side driver 10 is fed with the driving control signal HIN, which is received at the control input terminal TM17. The driver 10 is connected to the ground, and is fed with the control supply voltage VCC, the output terminal voltage VS, and the boot voltage VB. The driver 10 generates a gate signal GH corresponding to the driving control signal HIN, and feeds the gate signal GH to the gate of the output transistor MH, thereby to drive the output transistor MH (control the state of the output transistor MH).

The low-side driver 20 is fed with the driving control signal LIN, which is received at the control input terminal TM18. The driver 20 is connected to the ground, and is fed with the control supply voltage VCC. The driver 20 generates a gate signal GL corresponding to the driving control signal LIN, and feeds the gate signal GL to the gate of the output transistor ML, thereby to drive the output transistor ML (control the state of the output transistor ML).

Figure 3:
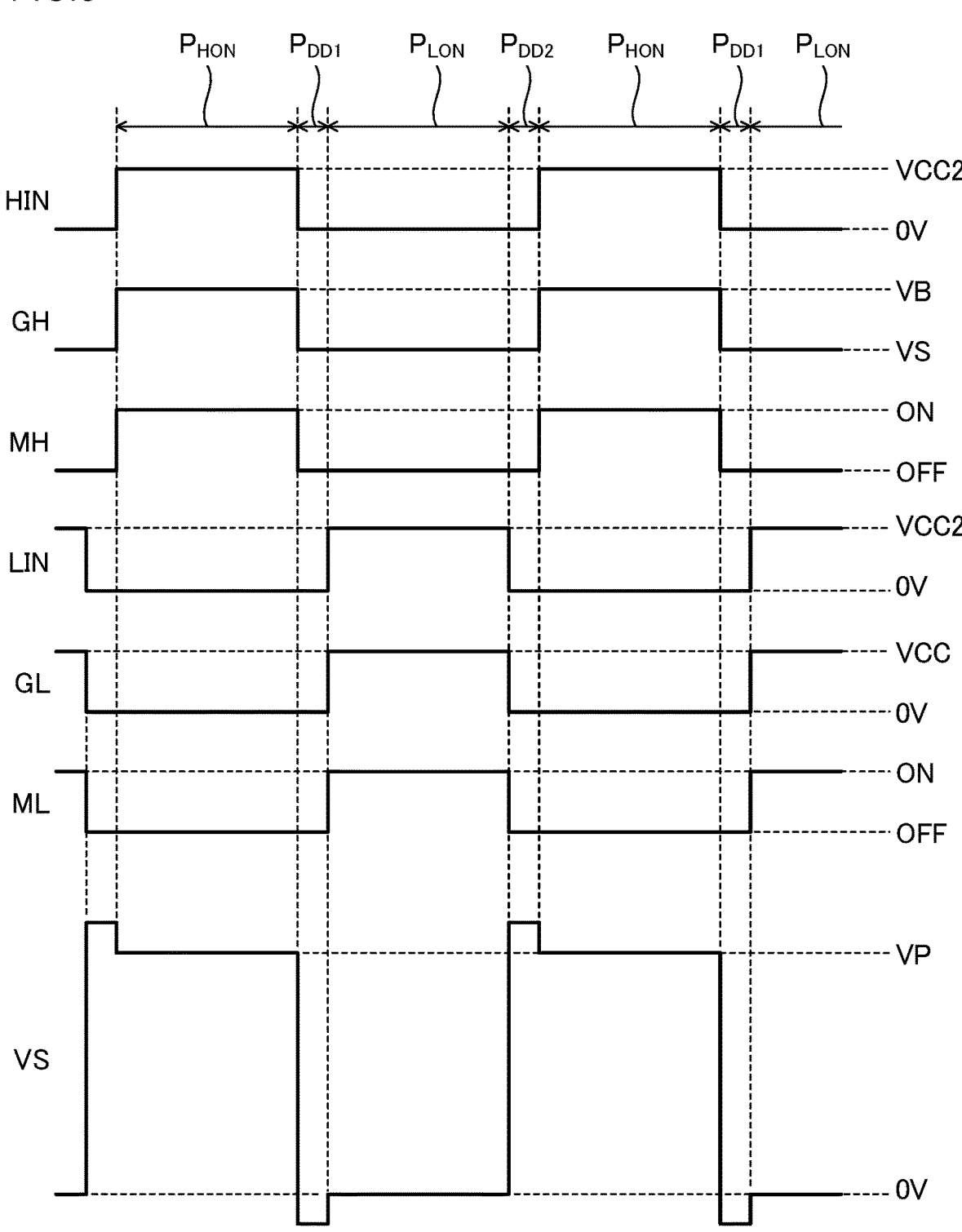
FIG. 3 is a diagram showing the waveforms of signals and the like associated with the semiconductor device in connection with the first embodiment of the present disclosure.

FIG. 3 shows the waveform of the driving control signal HIN, the waveform of the gate signal GH, the state of the output transistor MH, the waveform of the driving control signal LIN, the waveform of the gate signal GL, the state of the output transistor ML, and the waveform of the output terminal voltage VS.

The high-side driver 10 generates and outputs the gate signal GH based on the voltage between the terminals TM11 and TM12, that is, based on the differential voltage (VB–VS). That is, the driver 10 has a high-side output buffer (not illustrated) that operates by using the output terminal voltage VS as the negative-side supply voltage and the boot voltage VB as the positive-side supply voltage. The high-side output buffer keeps the gate signal GH at high level in the high-level period of the driving control signal HIN, and keeps the gate signal GH at low level in the low-level period of the driving control signal HIN. Here, the high level of the gate signal GH is equal to the level of the boot voltage VB, and the low level of the gate signal GH is equal to the level of the output terminal voltage VS.

Note that, for any signal of interest that takes as its signal level high or low level, when the signal of interest is mentioned to have a particular voltage or potential level, the signal of interest does not necessarily have a level equal to the particular voltage or potential level but may have a level substantially equal to the particular voltage or potential level. Accordingly, for example, a high-level gate signal GH can be equivalent in level to the boot voltage VB even if, in precise terms, it slightly differs in level from the boot voltage VB.

The voltage (VB–VS) is the differential voltage between the terminals TM11 and TM12 relative to the potential at the terminal TM11, and corresponds to the level of the boot voltage VB relative to the output terminal voltage VS. As will be clarified later, the boot voltage VB is higher than the output terminal voltage VS and, in the steady state, the voltage (VB–VS) is stabilized at or around the control supply voltage VCC (i.e., the value of the voltage (VB–VS) is stabilized to remain approximately equal to the value of the control supply voltage VCC). The magnitude of the control supply voltage VCC is higher than the magnitude of the gate threshold voltage of the output transistor MH.

Thus, in the high-level period of the gate signal GH (i.e., in the period in which the gate signal GH has the level of the boot voltage VB), the output transistor MH is on, and in the low-level period of the gate signal GH (i.e., in the period in which the gate signal GH has the level of the output terminal voltage VS), the output transistor MH is off. As a result, in synchronization with an up edge in the driving control signal HIN, the output transistor MH turns on. Note here that there occurs some delay after the up edge in the driving control signal HIN before the turning-on of the output transistor MH (the delay is not shown in FIG. 3). Likewise, in synchronization with a down edge in the driving control signal HIN, the output transistor MH turns off. Note here that there occurs some delay after the down edge in the driving control signal HIN before the turning-off of the output transistor MH (the delay is not shown in FIG. 3).

More specifically, the high-side driver 10 includes (though neither is illustrated) a first input stage circuit that operates by using the supply voltage VCC2 (here, 5 V) and that outputs a signal resulting from binarizing the driving control signal HIN and a first level shifter that shifts the level of the output signal of the first input stage circuit by using the control supply voltage VCC (here, 18 V). Based on the signal obtained from the first level shifter, the high-side driver 10 outputs the gate signal GH from the high-side output buffer mentioned above.

On the other hand, the low-side driver 20 generates and outputs the gate signal GL based on the control supply voltage VCC. That is, the low-side driver 20 has a low-side output buffer (not illustrated) that operates by using the ground as the negative-side supply voltage and the control supply voltage VCC as the positive-side supply voltage. The low-side output buffer keeps the gate signal GL at high level in the high-level period of the driving control signal LIN, and keeps the gate signal GL at low level in the low-level period of the driving control signal LIN. Here, the high level of the gate signal GL is equal to the level of the control supply voltage VCC, and the low level of the gate signal GL is equal to the ground potential.

The magnitude of the control supply voltage VCC is higher than the magnitude of the gate threshold voltage of the output transistor ML. Thus, in the high-level period of the gate signal GL (i.e., the period in which the gate signal GL has the level of the control supply voltage VCC), the output transistor ML is on and, in the low-level period of the gate signal GL (i.e., the period in which the gate signal GL has the ground level), the output transistor ML is off. As a result, in synchronization with an up edge in the driving control signal LIN, the output transistor ML turns on. Here, some delay occurs after the up edge in the driving control signal LIN before the turning-on of the output transistor ML (the delay is not shown in FIG. 3). Likewise, in synchronization with a down edge in the driving control signal LIN, the output transistor ML turns off. Here, some delay occurs after the down edge in the driving control signal LIN before the turning-off of the output transistor ML (the delay is not shown in FIG. 3).

More specifically, the low-side driver 20 includes (though neither is illustrated) a second input stage circuit that operates by using the supply voltage VCC2 (here, 5 V) and that outputs a signal resulting from binarizing the driving control signal LIN and a second level shifter that shifts the level of the output signal of the second input stage circuit by using the control supply voltage VCC (here, 18 V). Based on the signal obtained from the second level shifter, the low-side driver 20 outputs the gate signal GL from the low-side output buffer mentioned above.

The switching circuit 30 and the capacitor CB constitute a bootstrap circuit, and this bootstrap circuit generates the boot voltage VB. The switching circuit 30 is provided between a control supply line, to which the control supply voltage VCC is applied, and the boot terminal TM12. The switching driver 40 drives the switching circuit 30 so that the switching circuit 30 is in a state specified by the switching control circuit 50. The switching control circuit 50 controls the charging of the capacitor CB from the control supply line via the switching circuit 30 to make the capacitor CB store electric charge such that (VB−VS)>0.

Prior to a description of the operation and configuration of the switching circuit 30, the switching driver 40, and the switching control circuit 50, with reference back to FIG. 3 an additional description will be given of the relationship among relevant signals and the like.

As shown in FIG. 3, in the system SYS, a period consisting of periods $P_{HON}$, $P_{DD1}$, $P_{LON}$, and $P_{DD2}$ is taken as a unit period, and this unit period occurs repeatedly. Assuming that each unit period starts with the period $P_{HON}$, in each unit period the period $P_{HON}$ is followed by the period $P_{DD1}$, which is then followed by the period $P_{LON}$, which is finally followed by the period $P_{DD2}$.

The period $P_{HON}$ is a high-side-on period in which the driving control signal HIN is at high level and the driving control signal LIN is at low level. In the high-side-on period $P_{HON}$, the output transistors MH and ML are on and off respectively. Accordingly, in the high-side-on period $P_{HON}$, the load current passes through the channel (between the drain and the source) of the output transistor MH, and meanwhile the output terminal voltage VS is generally equal to the supply voltage VP. In precise terms, depending on the on resistance, the drain current, and the like in the output transistor MH, the output terminal voltage VS in the high-side-on period $P_{HON}$ differs slightly from the supply voltage VP. In the following description, however, to avoid complicated description, the output terminal voltage VS in the high-side-on period $P_{HON}$ is occasionally regarded as having the same voltage value as the supply voltage VP.

Figure 4:
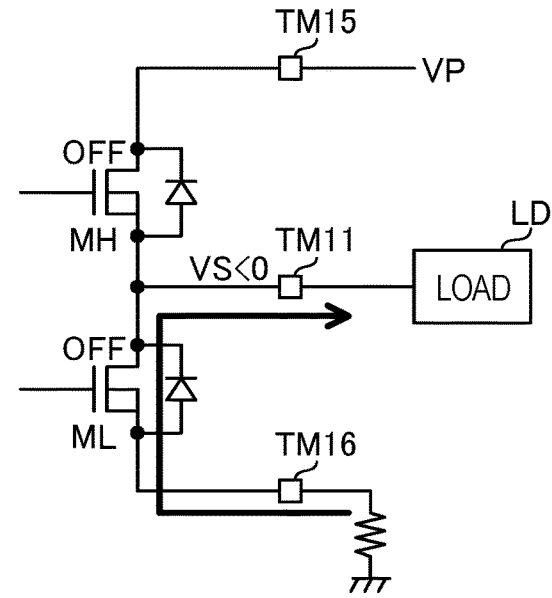
FIG. 4 is a diagram showing the flow of a current in a both-off period in connection with the first embodiment of the present disclosure.

The period $P_{DD1}$ is a both-off period in which the driving control signals HIN and LIN are both at low level. In the both-off period $P_{DD1}$, the output transistors MH and ML are both off. Immediately before the transition from the high-side-on period $P_{HON}$ to the both-off period $P_{DD1}$, a current passes in the direction from the output terminal TM11 toward the load LD. Then, since the load LD includes an inductive load, as shown in FIG. 4, the output of the current from the output terminal TM11 toward the load LD continues from the high-side-on period $P_{HON}$ into the both-off period $P_{DD1}$. The load current in the both-off period $P_{DD1}$ is supplied via the parasitic diode in the output transistor ML.

That is, in the both-off period $P_{DD1}$, a current passes from the ground via the low-side terminal TM16, the parasitic diode in the output transistor ML, and the output terminal TM11 toward the load LD, and meanwhile the output terminal voltage VS is lower than 0 V by the voltage drop across the parasitic diode in the output transistor ML (see FIG. 3). While it depends on the magnitude of the load current and the like, here, for concrete description, it is assumed that, in the both-off period $P_{DD1}$, the output terminal voltage VS falls down to (−100 V). A low-side parallel diode of which the forward direction coincides with that of the parasitic diode in the output transistor ML may be separately arranged and connected between the drain and the source of the output transistor ML. In that case, the load current in the both-off period $P_{DD1}$ passes via the low-side parallel diode.

The period $P_{LON}$ is a low-side-on period in which the driving control signal HIN is at low level and the driving control signal LIN is at high level. In the low-side-on period $P_{LON}$, the output transistors MH and ML are off and on respectively. Accordingly, in the low-side-on period $P_{LON}$, the load current passes through the channel (between the drain and the source) of the output transistor ML, and meanwhile the output terminal voltage VS is generally equal to the ground voltage (0 V). In precise terms, depending on the on resistance, the drain current, and the like in the output transistor ML, the output terminal voltage VS in the low-side-on period $P_{LON}$ differs slightly from the ground voltage (0 V). In the following description, however, to avoid complicated description, the output terminal voltage VS in the low-side-on period $P_{LON}$ is occasionally regarded as 0V.

Figure 5:
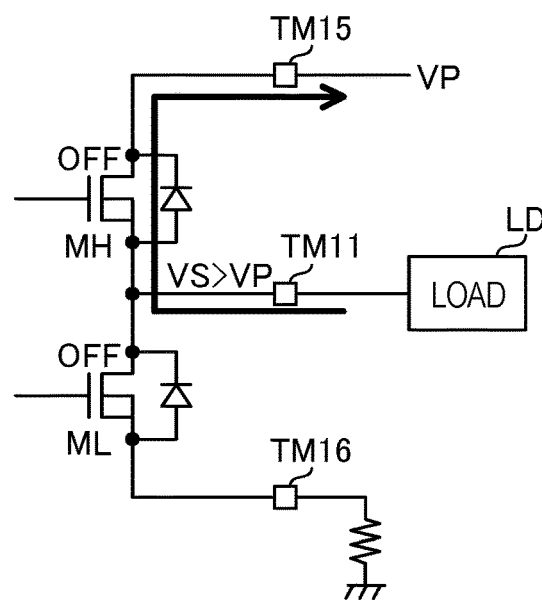
FIG. 5 is a diagram showing the flow of a current in a both-off period in connection with the first embodiment of the present disclosure.

The period $P_{DD2}$, like the period $P_{DD1}$, is a both-off period in which the driving control signals HIN and LIN are both at low level. In the both-off period $P_{DD2}$, the output transistors MH and ML are both off. Immediately before the transition from the low-side-on period $P_{LON}$ to the both-off period $P_{DD2}$, a current passes in the direction from the load LD toward the output terminal TM11. Then, because the load LD includes an inductive load, as shown in FIG. 5, the flow of the current from the load LD toward the output terminal TM11 continues from the low-side-on period $P_{LON}$ into the both-off period $P_{DD2}$. The load current in the both-off period $P_{DD2}$ passes via the parasitic diode in the output transistor MH.

That is, in the both-off period $P_{DD2}$, a current passes from the load LD via the output terminal TM11 and the parasitic diode in the output transistor MH toward the power terminal TM15, and meanwhile the output terminal voltage VS is higher than the supply voltage VP by the voltage drop across the parasitic diode in the output transistor MH (see FIG. 3). A high-side parallel diode of which the forward direction coincides with that of the parasitic diode in the output transistor MH may be separately arranged and connected between the drain and the source of the output transistor MH. In that case, the load current in the both-off period $P_{DD2}$ passes via the high-side parallel diode.

The periods $P_{DD1}$ and $P_{DD2}$ are called dead times provided to prevent a through current between the terminals TM15 and TM16.

While it is here assumed that there is a timing at which a current passes from the load LD toward the output terminal TM11 (the connection node between the output transistors MH and ML), there may be no such timing depending on the type of load LD or the driving control signals HIN and LIN.

That is, the load current may always pass in the direction from the output terminal TM11 (the connection node between the output transistors MH and ML) toward the load LD.

Figure 6:
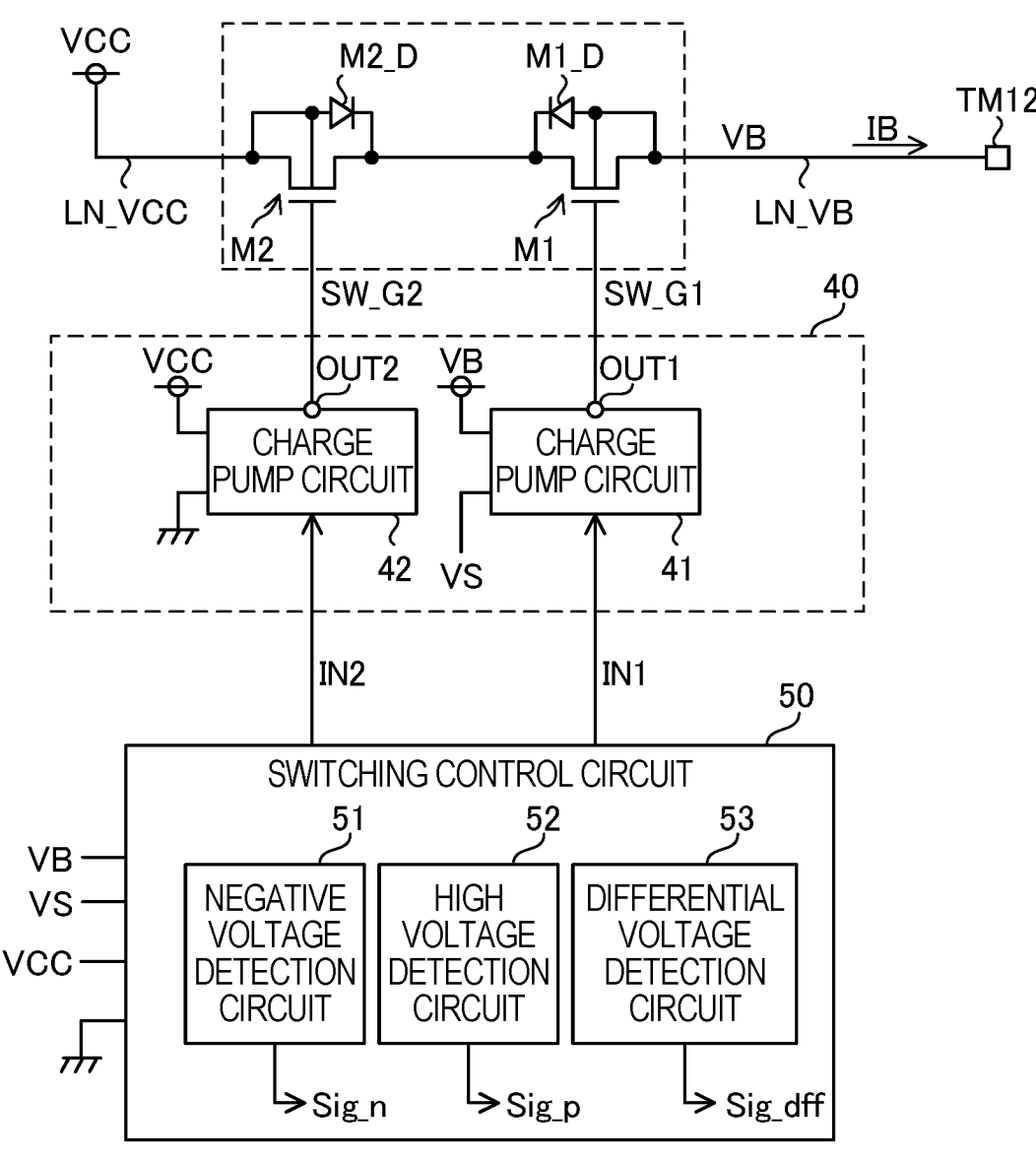
FIG. 6 is a diagram showing a configuration involved in the generation of a boot voltage in connection with the first embodiment of the present disclosure.

FIG. 6 shows the internal configuration of the switching circuit 30, the switching driver 40, and the switching control circuit 50 according to the first embodiment. In this embodiment, the switching circuit 30 is configured as a series circuit of switching elements M1 and M2. The switching elements M1 and M2 are both N-channel MOSFETs. In the following description, the switching elements M1 and M2 will be referred to as the transistors M1 and M2. The transistors M1 and M2 have a withstand voltage higher than the power supply voltage VP (e.g., 600 V).

In FIG. 6, a line LN_VCC is a control supply line connected to the control supply terminal TM14 (not shown in FIG. 6) to be fed with the control supply voltage VCC, and a line LN_VB is a boot voltage line connected to the boot terminal TM12 to be fed with the boot voltage VB. The line LN_VB functions as a supply line relative to the potential at the output terminal voltage VS, and thus the line LN_VB can be called a floating supply line. The source of the transistor M1 is connected via the line LN_VB to the boot terminal TM12. That is, the source of the transistor M1 is connected to the boot voltage line LN_VB, and thus the source of the transistor M1 is fed with the boot voltage VB.

The source of the transistor M2 is connected via the line LN_VCC to the control supply terminal TM14 (see FIG. 1). That is, the source of the transistor M2 is connected to the control supply line LN_VCC, and thus the source of the transistor M2 is fed with the control supply voltage VCC. The drains of the transistors M1 and M2 are connected together. The current that passes between the control supply terminal TM14 and the boot terminal TM12 will be identified by the symbol "IB". The polarity of the current IB when it passes from the control supply terminal TM14 toward the boot terminal TM12 is assumed to be positive.

In each of the transistors M1 and M2, the back gate is short-circuited to the source. In FIG. 6, a diode M1_D is the parasitic diode that accompanies the transistor M1, and a diode M2_D is the parasitic diode that accompanies the transistor M2. The diode M1_D has its forward direction pointing in the direction from the source to the drain of the transistor M1. The diode M2_D has its forward direction pointing in the direction from the source to the drain of the transistor M2.

A parallel diode may be separately connected across the transistor M1, in which case the diode M1_D includes the parallel diode across the transistor M1. The parallel diode across the transistor M1 has an anode connected to the source of the transistor M1 and a cathode connected to the drain of the transistor M1. Likewise, a parallel diode may be separately connected across the transistor M2, in which case the diode M2_D includes the parallel diode across the transistor M2. The parallel diode across the transistor M2 has an anode connected to the source of the transistor M2 and a cathode connected to the drain of the transistor M2.

The switching driver 40 feeds a gate signal SW_G1 to the gate of the transistor M1 to turn on or off the transistor M1, and feeds a gate signal SW_G2 to the gate of the transistor M2 to turn on or off the transistor M2. As shown in FIG. 6, the switching driver 40 includes, as a circuit for generating the gate signal SW_G1, a charge pump circuit 41 and, as a circuit for generating the gate signal SW_G2, a charge pump circuit 42.

The charge pump circuit 41 has an output node OUT1, and the output node OUT1 is connected to the gate of the transistor M1. The charge pump circuit 41 outputs the gate signal SW_G1 from the output node OUT1. The charge pump circuit 41 is fed with the output terminal voltage VS and the boot voltage VB, and is fed with a control signal IN1 from the switching control circuit 50.

Figure 7:
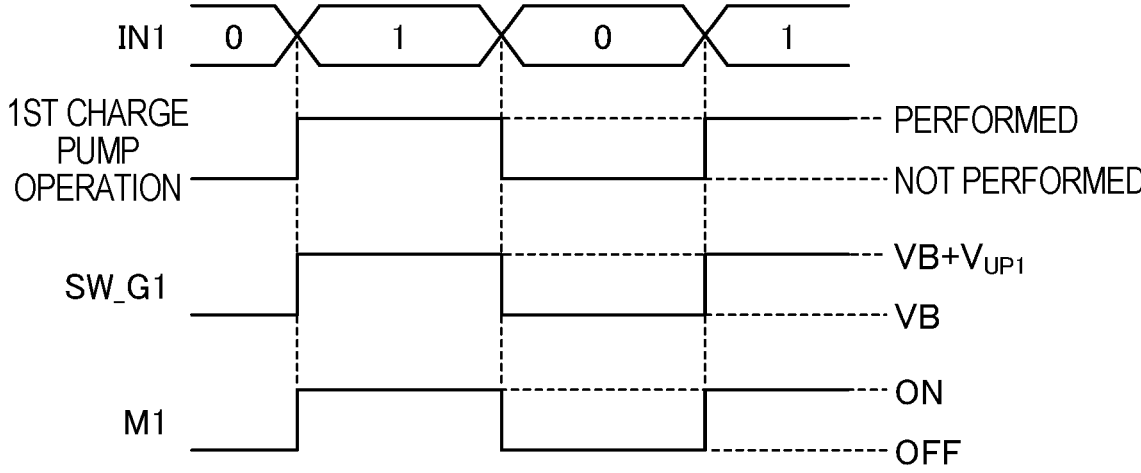
FIG. 7 is a timing chart associated with the on/off control of transistors in a switching circuit in connection with the first embodiment of the present disclosure.

The charge pump circuit 41 can perform first charge pump operation according to the control signal IN1. In the first charge pump operation, the charge pump circuit 41 produces at the output node OUT1 a first boosted voltage higher than the boot voltage VB based on the boot voltage VB relative to the potential at the output terminal TM11. Here, the control signal IN1 is assumed to be a binary signal that takes the value (logic value) of either "0" or "1". As shown in FIG. 7, the control signal IN1 takes the values "0" and "1" alternately. The first boosted voltage produced at the output node OUT1 through the first charge pump operation is a voltage (VB+$V_{UP1}$). The voltage (VB+$V_{UP1}$) is a voltage higher than the boot voltage VB by a predetermined voltage $V_{UP1}$ ($V_{UP1}$>0).

When the control signal IN1 has the value "1", the charge pump circuit 41 performs the first charge pump operation, so that a high-level gate signal SW_G1 is output from the output node OUT1. The high-level gate signal SW_G1 has the potential of the first boosted voltage (VB+$V_{UP1}$). When the control signal IN1 has the value "0", the charge pump circuit 41 does not perform the first charge pump operation, so that a low-level gate signal SW_G1 is output from the output node OUT1. The low-level gate signal SW_G1 has the potential of the boot voltage VB.

The voltage $V_{UP1}$ is higher than the gate threshold voltage of the transistor M1. Accordingly, when the control signal IN1 has the value "1", the first boosted voltage (VB+$V_{UP1}$) is fed as the gate signal SW_G1 to the gate of the transistor M1, and thus the transistor M1 is on. By contrast, when the control signal IN1 has the value "0", the boot voltage VB is fed as the gate signal SW_G1 to the gate of the transistor M1, and thus the transistor M1 is off.

The charge pump circuit 42 has an output node OUT2, and the output node OUT2 is connected to the gate of the transistor M2. The charge pump circuit 42 outputs the gate signal SW_G2 from the output node OUT2. The charge pump circuit 42 is fed with the control supply voltage VCC and the ground voltage, and is fed with a control signal IN2 from the switching control circuit 50.

Figure 8:
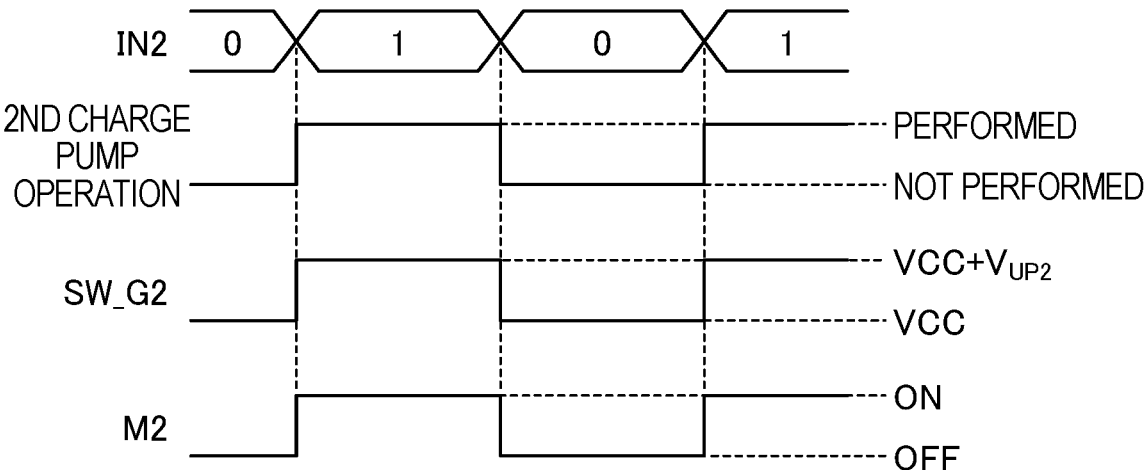
FIG. 8 is a timing chart associated with the on/off control of transistors in a switching circuit in connection with the first embodiment of the present disclosure.

The charge pump circuit 42 can perform second charge pump operation according to the control signal IN2. In the second charge pump operation, the charge pump circuit 42 produces at the output node OUT2 a second boosted voltage higher than the control supply voltage VCC based on the control supply voltage VCC relative to the ground potential. Here, the control signal IN2 is assumed to be a binary signal that takes the value (logic value) of either "0" or "1". As shown in FIG. 8, the control signal IN2 takes the values "0" and "1" alternately. The second boosted voltage produced at the output node OUT2 through the second charge pump operation is a voltage (VCC+$V_{UP2}$). The voltage (VCC+$V_{UP2}$) is a voltage higher than the control supply voltage VCC by a predetermined voltage $V_{UP2}$ ($V_{UP2}$>0).

When the control signal IN2 has the value "1", the charge pump circuit 42 performs the second charge pump operation, so that a high-level gate signal SW_G2 is output from the output node OUT2. The high-level gate signal SW_G2 has the potential of the second boosted voltage (VCC+$V_{UP2}$). When the control signal IN2 has the value "0", the charge pump circuit 42 does not perform the second charge pump operation, so that a low-level gate signal SW_G2 is output from the output node OUT2. The low-level gate signal SW_G2 has the potential of the control supply voltage VCC.

The voltage $V_{UP2}$ is higher than the gate threshold voltage of the transistor M2. Accordingly, when the control signal IN2 has the value "1", the second boosted voltage (VCC+ $V_{UP2}$) is fed as the gate signal SW_G2 to the gate of the transistor M2, and thus the transistor M2 is on. By contrast, when the control signal IN2 has the value "0", the control supply voltage VCC is fed as the gate signal SW_G2 to the gate of the transistor M2, and thus the transistor M2 is off.

The switching control circuit 50 is fed with the boot voltage VB, the output terminal voltage VS, the control supply voltage VCC, and the ground voltage.

The control signal IN1 fed from the switching control circuit 50 to the charge pump circuit 41 takes as its signal level high or low level. A high-level control signal IN1 has the potential of the boot voltage VB (though it may have a potential slightly lower than the boot voltage VB). A low-level control signal IN1 has the potential of the output terminal voltage VS (though it may have a potential slightly higher than the output terminal voltage VS). The switching control circuit 50 can generate the control signal IN1 with a combinational logic circuit (e.g., inverter circuit) that operates by using the boot voltage VB as the positive-side supply voltage and the output terminal voltage VS as the negative-side supply voltage.

The control signal IN2 fed from the switching control circuit 50 to the charge pump circuit 42 takes as its signal level high or low level. A high-level control signal IN2 has the potential of the control supply voltage VCC (though it may have a potential slightly lower than the control supply voltage VCC). A low-level control signal IN2 has the ground potential (though it may have a potential slightly higher than the ground potential). The switching control circuit 50 can generate the control signal IN2 with a combinational logic circuit (e.g., inverter circuit) that operates by using the control supply voltage VCC as the positive-side supply voltage and the ground as the negative-side supply voltage.

The switching control circuit 50 generates the control signals IN1 and IN2 according to the output terminal voltage VS to turn on or off the transistors M1 and M2 individually. To perform this control properly, the switching control circuit 50 includes a negative voltage detection circuit 51, a high voltage detection circuit 52, and a differential voltage detection circuit 53.

The negative voltage detection circuit 51 checks whether the output terminal voltage VS has a negative polarity (i.e., whether the output terminal voltage VS is lower than the ground voltage), and generates and outputs as a signal indicating the detection result a negative voltage detection signal Sig_n. The negative voltage detection signal Sig_n is a binary signal that takes the value (logic value) of either "0" or "1". The negative voltage detection signal Sig_n has the value "1" if the output terminal voltage VS has a negative polarity, and has the value "0" if the output terminal voltage VS does not have a negative polarity. More specifically, for example, the circuit 51 can be a circuit that generates and outputs a signal Sig_n with the value "1" if the output terminal voltage VS is lower than a predetermined negative threshold voltage Vth_n and that generates and outputs a signal Sig_n with the value "0" if the output terminal voltage VS is higher than the predetermined negative threshold voltage Vth_n. In this case, if VS=Vth_n, the signal Sig_n can have the value "0" or "1". The threshold voltage Vth_n has a predetermined negative voltage value (e.g., −10 V).

The high voltage detection circuit 52 checks whether the output terminal voltage VS is higher than a predetermined positive threshold voltage Vth_p, and generates and outputs as a signal indicating the detection result a high voltage detection signal Sig_p. The high voltage detection signal Sig_p is a binary signal that takes the value (logic value) of either "0" or "1". The circuit 52 generates and outputs a signal Sig_p with the value "1" if the output terminal voltage VS is higher than the threshold voltage Vth_p, and generates and outputs a signal Sig_p with the value "0" if the output terminal voltage VS is lower than the threshold voltage Vth_p. If VS=Vth_p, the signal Sig_p can have the value "0" or "1". The threshold voltage Vth_p has a predetermined positive voltage value (e.g., 30 V). The threshold voltage Vth_p is lower than the power supply voltage VP (e.g., 600 V).

The differential voltage detection circuit 53 detects the differential voltage (VB−VS), and generates and outputs as a signal corresponding to the differential voltage (VB−VS) a differential voltage detection signal Sig_dff. The differential voltage detection signal Sig_dff is a binary signal that takes the value (logic value) of either "0" or "1". The circuit 53 generates and outputs a signal Sig_dff with the value "1" if the differential voltage (VB−VS) is higher than a threshold voltage Vth_dff, and generates and outputs a signal Sig_dff with the value "0" if the differential voltage (VB−VS) is lower than the threshold voltage Vth_dff. If VB−VS=Vth_dff, the signal Sig_dff can have the value "0" or "1". Here, the threshold voltage Vth_dff has a predetermined positive voltage value. The threshold voltage Vth_dff can have a voltage value (here, 18 V) equal to or close to that of the control supply voltage VCC.

Based on the negative voltage detection signal Sig_n, the high voltage detection signal Sig_p, and the differential voltage detection signal Sig_dff, the switching control circuit 50 generates the control signals IN1 and IN2. Thus, based on the signals Sig_n, Sig_p, and Sig_dff, the states of the transistors M1 and M2 are controlled.

Here, a reference example in FIG. 9 will be described. In the configuration of the reference example, in place of the switching circuit 30, a diode Dboot having an anode fed with the control supply voltage VCC and a cathode connected to the boot terminal TM12 is provided. FIG. 10 shows an outline of the relevant waveforms in the reference example. In the reference example, in the period in which the output terminal voltage VS is negative (corresponding to the both-off period $P_{DD1}$ in FIG. 3), a high charge current IB is supplied to the capacitor CB. Moreover, if the differential voltage (VB−VS) is equal to or lower than the voltage (VCC−Vf), also in the period in which the output terminal voltage VS is around 0 V (corresponding to the low-side-on period $P_{LON}$ in FIG. 3), some charge current IB is supplied to the capacitor CB. Here, Vf represents the forward voltage of the diode.

Figure 9:
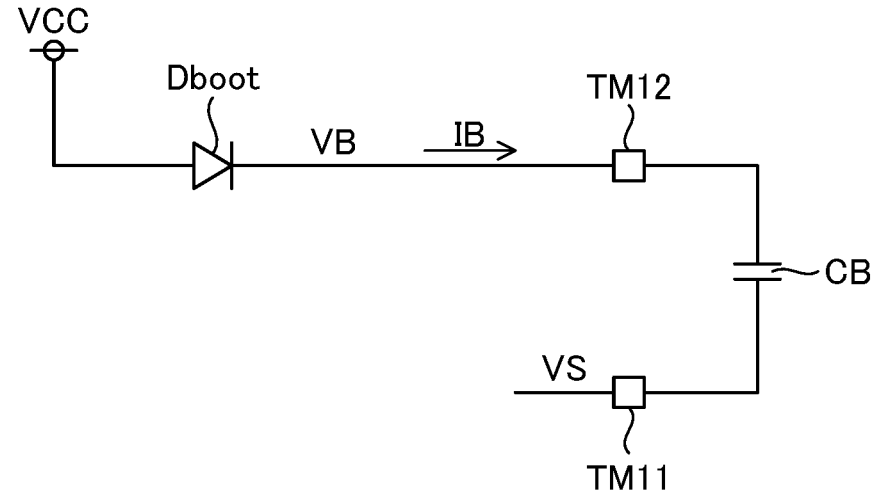
FIG. 9 is a diagram showing a configuration involved in the generation of a boot voltage in connection with a reference example.
Figure 10:
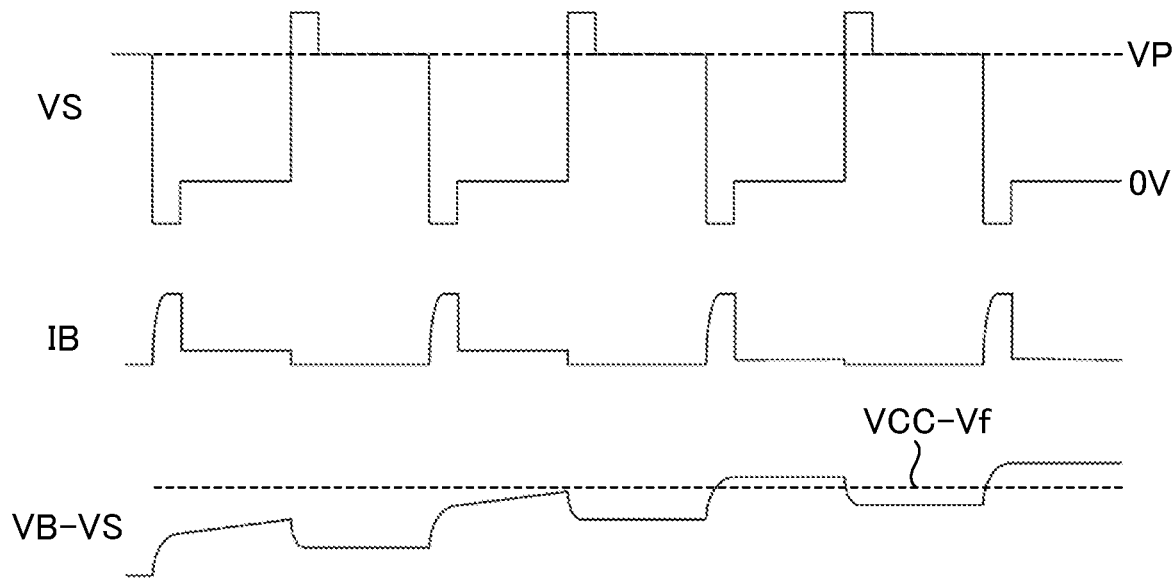
FIG. 10 is a diagram showing the waveforms of voltages and a current according to the reference example.

In the reference example in FIGS. 9 and 10, the capacitor CB may be overcharged. Specifically, in the period in which the output terminal voltage VS is negative (corresponding to the both-off period $P_{DD1}$ in FIG. 3), if the output terminal voltage VS falls down to, for example, (−100 V), the capacitor CB can be charged until a voltage of 100 V or more is applied across the capacitor CB. If such an excessive voltage is applied between the gate and the source of the output transistor MH, the output transistor MH may break. In particular, for example, in a case where the output transistor MH is configured using silicon carbide (SiC), the gate-source withstand voltage is subject to strict requirements, and the capacitor CB has to be strictly prevented from overcharging.

Figure 11:
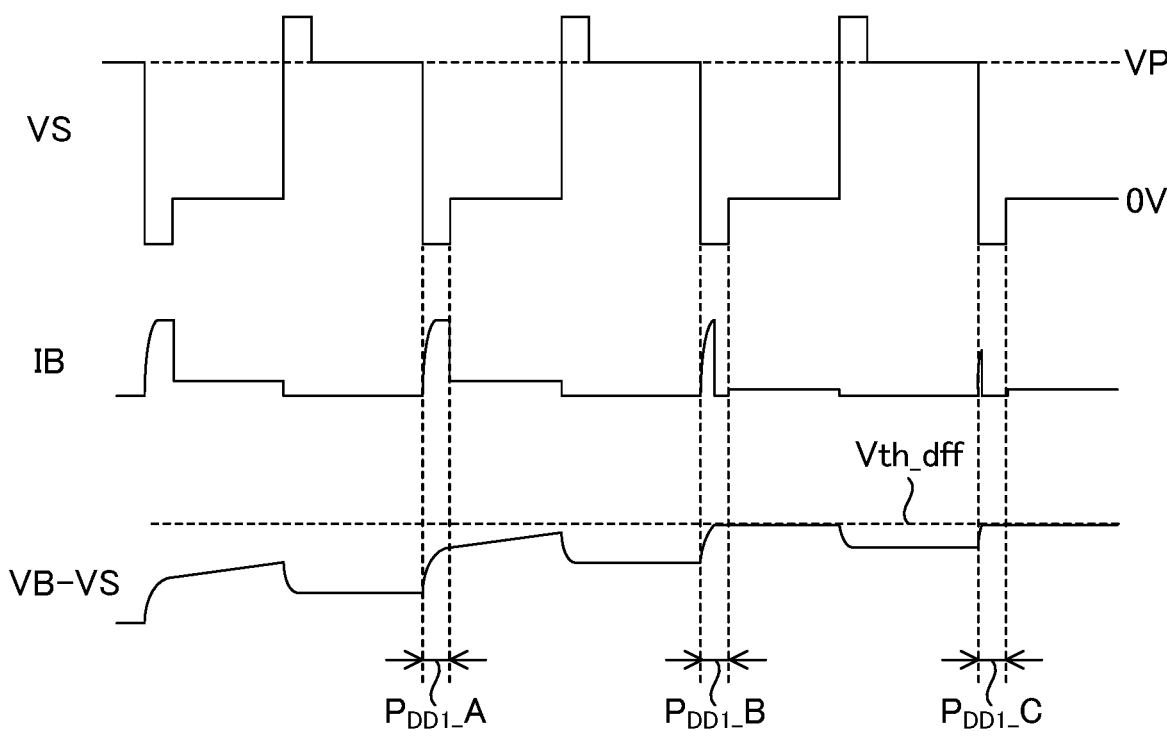
FIG. 11 is a diagram showing the waveforms of voltages and a current according to the first embodiment of the present disclosure.

With this taken into consideration, in this embodiment, as shown in FIG. 6, the switching circuit 30 is configured with the transistors M1 and M2 to ensure proper charging of the capacitor CB. FIG. 11 shows an outline of the relevant waveforms in this embodiment. Also in this embodiment, basically, in the period in which the output terminal voltage VS is negative (corresponding to the both-off period $P_{DD1}$ in FIG. 3), a high charge current IB is supplied to the capacitor CB. However, in the period in which the output terminal voltage VS is negative, when the differential voltage (VB–VS) reaches the predetermined threshold voltage Vth_dff, the capacitor CB is prevented from being further charged. This keeps an adequate charge voltage for the capacitor CB, and makes it possible to drive the output transistor MH safely and properly.

In FIG. 11, three both-off periods $P_{DD1}$ are shown, namely both-off periods $P_{DD1}$_A, $P_{DD1}$_B, and $P^{DD1}$–C. It is here assumed that, during the both-off period $P_{DD1}$_A and before that, the differential voltage (VB–VS) is lower than the threshold voltage Vth_dff and that, during each of the both-off periods $P_{DD1}$_B and $P_{DD1}$_C, the differential voltage (VB–VS) reaches the threshold voltage Vth_dff.

FIG. 12 shows the relationship among the signals Sig_n, Sig_p, and Sig_dff and the states of the transistors M1 and M2. In the following description, the signals Sig_p, Sig_n, and Sig_dff with the value "1" are often expressed as "Sig_p=1", "Sig_n=1", and "Sig_dff=1" respectively; the signals Sig_p, Sig_n, and Sig_dff with the value "0" are often expressed as "Sig_p=0", "Sig_n=0", and "Sig_dff=0" respectively. The same applies to any other signals that can have the value of either "0" or "1" (e.g., IN1 and IN2). The expression "(Sig_p, Sig_n)=$(i_A, i_B)$" indicates that the signals Sig_p and Sig_n have the values $i_A$ and $i_B$ respectively. Likewise, the expression "(IN1, IN2)=$(i_A, i_B)$" indicates that the signals IN1 and IN2 have the values $i_A$ and $i_B$ respectively, and the expression "(Sig_n, Sig_dff)=$(i_A, i_B)$" indicates that the signals Sig_n and Sig_dff have the values $i_A$ and $i_B$ respectively. Any other similar expressions are to be understood likewise. The symbols $i_A$ and $i_B$ each represent the value "0" or "1".

In the high-side-on period $P_{HON}$ and the both-off period $P_{DD2}$ (see FIG. 3), the high voltage detection signal Sig_p has the value "1". When Sig_p=1, the switching control circuit 50 controls such that (IN1, IN2)=(0, 0) to keep the transistors M1 and M2 both off. Note that, when Sig_p=1, the negative voltage detection signal Sig_n has the value "0". Here, when Sig_p=1, regardless of the value of the signal Sig_dff, the switching control circuit 50 controls such that (IN1, IN2)=(0, 0) to keep the transistors M1 and M2 both off. When Sig_p=1, the boot voltage VB is higher than the control supply voltage VCC; even so, with the transistors M1 and M2 (in particular, the transistor M2) kept off, the capacitor CB is inhibited from being discharged. The capacitor CB is said to be discharged when the electric charge stored in the capacitor CB passes via the boot terminal TM12 and the switching circuit 30 to the control supply line LN_VCC. As the capacitor CB discharges, the voltage across the capacitor CB decreases.

When Sig_p=1, if, for the sake of argument, the capacitor CB is discharged, the voltage across the capacitor CB falls further than necessary and impairs proper driving of the output transistor MH. Inhibiting its discharging as described above helps ensure proper driving of the output transistor MH.

Note that a modification is possible where, when Sig_p=1, the transistor M1 is kept on. Even if transistor M1 is on, keeping the transistor M2 off inhibits the capacitor CB from being discharged.

In the low-side-on period $P_{LON}$ (see FIG. 3), (Sig_p, Sig_n)=(0, 0). When (Sig_p, Sig_n)=(0, 0), the switching control circuit 50 controls such that (IN1, IN2)=(1, 1) to keep the transistors M1 and M2 both on. Here, when (Sig_p, Sig_n)=(0, 0), irrespective of the value of the signal Sig_dff, the switching control circuit 50 controls such that (IN1, IN2)=(1, 1) to keep the transistors M1 and M2 both on. With the transistors M1 and M2 both on, a current can pass through the switching circuit 30 in both directions. In the low-side-on period $P_L$ON in the steady state, the voltage across the capacitor CB is generally equal to the control supply voltage VCC. In the low-side-on period $P_{LON}$ with the differential voltage (VB–VS) risen to around the threshold voltage Vth_dff, a current corresponding to the current consumed by the circuits that operate by using the boot voltage VB passes from the control supply line LN_VCC to the boot voltage line LN_VB.

In the both-off period $P_{DD1}$ (see FIG. 3), the negative voltage detection signal Sig_n has the value "1". When Sig_n=1, the output terminal voltage VS is negative and thus the high voltage detection signal Sig_p has the value "0"; the differential voltage detection signal Sig_dff has the value "1" or "0" according to the magnitude relationship between the differential voltage (VB–VS) and the threshold voltage Vth_dff. As mentioned above, the threshold voltage Vth_dff has a voltage value equal to or close to the control supply voltage VCC.

The state where (Sig_n, Sig_dff)=(1, 0) corresponds to a state where the differential voltage (VB–VS) has not risen sufficiently yet, and the capacitor CB has to be charged. Accordingly, when (Sig_n, Sig_dff)=(1, 0), the switching control circuit 50 controls such that IN1=1 to keep the transistor M1 on. When (Sig_n, Sig_dff)=(1, 0), the switching control circuit 50 may control such that IN2=1 to keep also the transistor M2 on. Here, however, it is assumed that the switching control circuit 50 controls such that IN2=0 to keep the transistor M2 off. Even with the transistor M2 off, the capacitor CB can be charged via the parasitic diode (M2_D) in the transistor M2.

By contrast, the state where (Sig_n, Sig_dff)=(1, 1) corresponds to a state where the capacitor CB has been charged up to the prescribed voltage. Accordingly, when (Sig_n, Sig_dff)=(1, 1), the switching control circuit 50 controls such that IN1=0 to keep the transistor M1 off. Thus, the capacitor CB is prevented from being overcharged. Moreover, when (Sig_n, Sig_dff)=(1, 1), the switching control circuit 50 controls such that IN2=0 to keep the transistor M2 off. Here, however, when (Sig_n, Sig_dff)=(1, 1), the switching control circuit 50 may control such that IN2=1 to keep the transistor M2 on. Even with the transistor M2 on, since the transistor M1 is off, the current tending to pass from the control supply line LN_VCC toward the capacitor CB is shut off.

Figure 13:
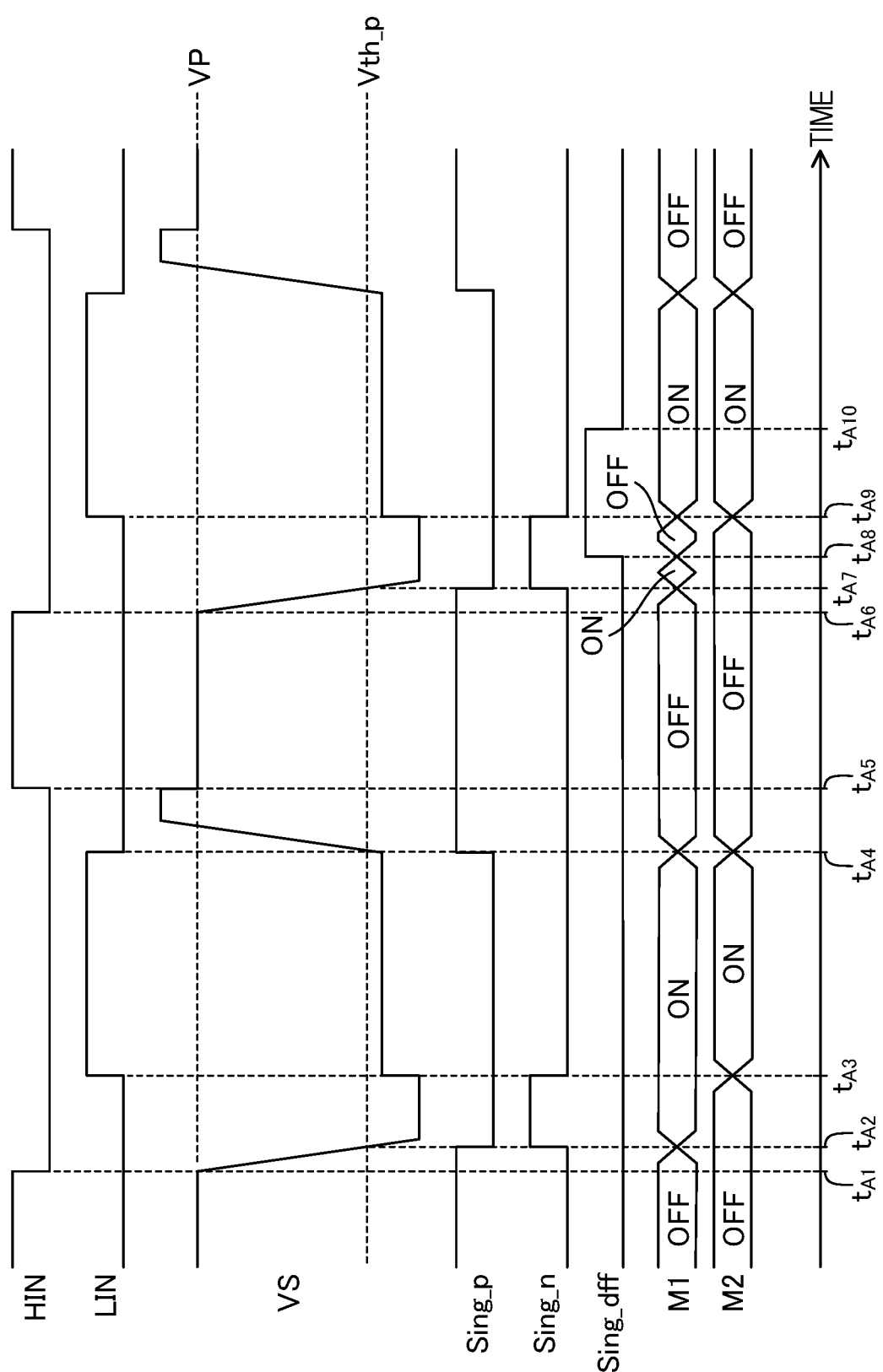
FIG. 13 is a timing chart according to the first embodiment of the present disclosure.

FIG. 13 is a detailed timing chart in connection with this embodiment. FIG. 13 shows, from top down, the waveforms of the driving control signal HIN, the driving control signal LIN, the output terminal voltage VS, the high voltage detection signal Sig_p, the negative voltage detection signal Sig_n, the differential voltage detection signal Sig_dff along with the states of the transistors M1 and M2.

FIG. 13 shows time points $t_{A1}$ to $t_{A10}$. It is assumed that, for any integer i, time point $t_{Ai+1}$ occurs later than $t_{Ai}$.

At time point $t_{41}$, a jth down edge occurs in the driving control signal HIN;

at time point $t_{43}$, a jth up edge occurs in the driving control signal LIN;

at time point $t_{44}$, a jth down edge occurs in the driving control signal LIN;

at time point $t_{45}$, a (j+1)th up edge occurs in the driving control signal HIN;

at time point $t_{46}$, a (j+1)th down edge occurs in the driving control signal HIN; and at time point $t_{49}$, a (j+1)th up edge occurs in the driving control signal LIN.

Here, j is any natural number.

Now, the operation of the system SYS will be described starting immediately before time point $t_{41}$. A timing immediately before time point $t_{41}$ belongs to the high-side-on period $P_{HON}$ (see FIG. 3). At a timing immediately before time point $t_{41}$, the signal HIN is at high level, the signal LIN is at low level, and the output terminal voltage VS is higher than the threshold voltage Vth_p of the high voltage detection circuit 52. Accordingly, at a timing immediately before time point $t_{41}$, (Sig_p, Sig_n)=(1, 0). It is assumed that, at a timing immediately before time point $t_{41}$, the differential voltage (VB–VS) is lower than the threshold voltage Vth_dff and accordingly that Sig_dff=0. At a timing immediately before time point $t_{41}$, the transistors M1 and M2 are both off.

At time point $t_{41}$, in response to the down edge in the driving control signal HIN, the output transistor MH turns from on to off; thus the output terminal voltage VS starts to fall from the supply voltage VP until, under the action of the inductive load in the load LD, the output terminal voltage VS reaches a negative voltage. In the process of the output terminal voltage VS falling, at time point $t_{42}$, or around time point $t_{42}$, the value of the signal Sig_p switches from "1" to "0" and the value of the signal Sig_n switches from "0" to "1". There may occur a time lag between the timing of the value of the signal Sig_p switching from "1" to "0" and the timing of the value of the signal Sig_n switching from "0" to "1" (a similar description applies to time point $t_{47}$ mentioned later). Basically, the switch of the former precedes the switch of the latter, and the time lag is ignorably small and does not exert a notable adverse effect (a similar description applies to time point $t_{47}$ mentioned later).

Between time points $t_{42}$ and $t_{43}$, the differential voltage (VB–VS) is lower than the threshold voltage Vth_dff and thus it is supposed that Sig_dff=0. As a result, in response to the switch at time point $t_{42}$ from (Sig_p, Sig_n)=(1, 0) to (Sig_p, Sig_n)=(0, 1), the transistor M1 turns from off to on, so that, between time points $t_{42}$ and $t_{43}$, a high charge current IB is supplied to the capacitor CB. Note that the both-off period $P_{DD1}$ starting at time point $t_{41}$ corresponds to the both-off period $P_{DD1}$_A in FIG. 11.

After that, when at time point $t_{43}$ an up edge occurs in the driving control signal LIN, a transition from the both-off period $P_{DD1}$ to the low-side-on period $P_{LON}$ takes place (see FIG. 3). In the low-side-on period $P_{LON}$ corresponding to the period between time points $t_{43}$ and $t_{44}$, the transistors M1 and M2 are both on. The transition to the low-side-on period $P_{LON}$ results in the output terminal voltage VS being substantially 0 V, and thus a switch from (Sig_p, Sig_n)=(0, 1) to (Sig_p, Sig_n)=(0, 0) takes place.

When at time point $t_{44}$ a down edge occurs in the driving control signal LIN, a transition from the low-side-on period $P_{LON}$ to the both-off period $P_{DD2}$ takes place (see FIG. 3). In this both-off period $P_{DD2}$, under the action of the inductive load in the load LD, the output terminal voltage VS rises toward the supply voltage VP, eventually exceeding the supply voltage VP. In the process of the output terminal voltage VS rising toward the supply voltage VP, a switch from (Sig_p, Sig_n)=(0, 0) to (Sig_p, Sig_n)=(1, 0) takes place, and in response to this switch the transistors M1 and M2 are both switched from on to off.

When at time point $t_{45}$ an up edge occurs in the driving control signal HIN, a transition from the both-off period $P_{DD2}$ to the high-side-on period $P_{HON}$ takes place (see FIG. 3). In this high-side-on period $P_{HON}$, substantially VS=VP. After that, at time point $t_{46}$, a down edge occurs in the driving control signal HIN. Between time points $t_{45}$ and $t_{46}$, (Sig_p, Sig_n)=(1, 0), and thus transistors M1 and M2 are both held off.

When in response to the down edge in the driving control signal HIN at time point $t_{46}$ the output transistor MH switches from on to off, the output terminal voltage VS starts to fall from the supply voltage VP and then, under the action of the inductive load in the load LD, the output terminal voltage VS reaches a negative voltage. In the process of the output terminal voltage VS falling, at time point $t_{47}$, or around time point $t_{47}$, the value of the signal Sig_p switches from "1" to "0" and the value of the signal Sig_n switches from "0" to "1".

Immediately after time point $t_{47}$, the differential voltage (VB–VS) is lower than the threshold voltage Vth_dff, and thus it is supposed that Sig_dff=0. Accordingly, in response to the switch at time point $t_{47}$ from (Sig_p, Sig_n)=(1, 0) to (Sig_p, Sig_n)=(0, 1), the transistor M1 is switched from off to on. As a result, starting at time point $t_{47}$ the capacitor CB is charged with a high charge current IB.

However, as a result of the differential voltage (VB–VS) reaching the threshold voltage Vth_dff at time point $t_{48}$, a switch from Sig_dff=0 to Sig_dff=1 takes place, and in response to this switch the transistor M1 is turned off. As a result of the transistor M1 turning off here, the charging of the capacitor CB based on a negative output terminal voltage VS (its charging with a high charge current IB) is stopped. Note that the both-off period $P_{DD1}$ starting at the time point $t_{46}$ corresponds to the both-off period $P_{DD1}$_B in FIG. 11.

After that, when at time point $t_{49}$ an up edge occurs in the driving control signal LIN, a transition from the both-off period $P_{DD1}$ to the low-side-on period $P_{LON}$ takes place (see FIG. 3). As a result of a transition to the low-side-on period $P_{LON}$, the output terminal voltage VS becomes substantially 0 V, and thus a switch from (Sig_p, Sig_n)=(0, 1) to (Sig_p, Sig_n)=(0, 0) takes place. Thus, at time point $t_{49}$, the transistors M1 and M2 are both switched from off to on, and the transistors M1 and M2 are then kept on until next time Sig_p=1.

In the example in FIG. 13, at time point $t_{41}$ belonging to the low-side-on period $P_{L}$ON starting at time point $t_{49}$, a transition from Sig_dff=1 to Sig_dff=0 takes place. Accordingly, the subsequent both-off period $P_{DD1}$ (corresponding to the both-off period $P_{DD1}$_C in FIG. 11) includes, though not specifically illustrated, a short period in which the transistor M1 is on so that, on completion of the switch from Sig_dff=0 to Sig_dff=1, the transistor M1 is turned off.

Second Embodiment

A second embodiment of the present disclosure will be described. The second embodiment, as well as the third to fifth embodiments described later, is an embodiment based on the first embodiment. Unless inconsistent, for any features of the second to fifth embodiments that are not specifically described, the corresponding parts of the description of the first embodiment apply to the second to fifth embodiments. In interpreting the description of the second embodiment, for any features that contradict between the first and second embodiments, their description given in connection with the second embodiment can prevail (the same is true with the third to fifth embodiment described later). Unless inconsistent, any two or more of the first to fifth embodiments can be implemented in combination. In particular, the second and third embodiments can be implemented in combination, and even the first to fifth embodiments can all be combined.

Figure 14:
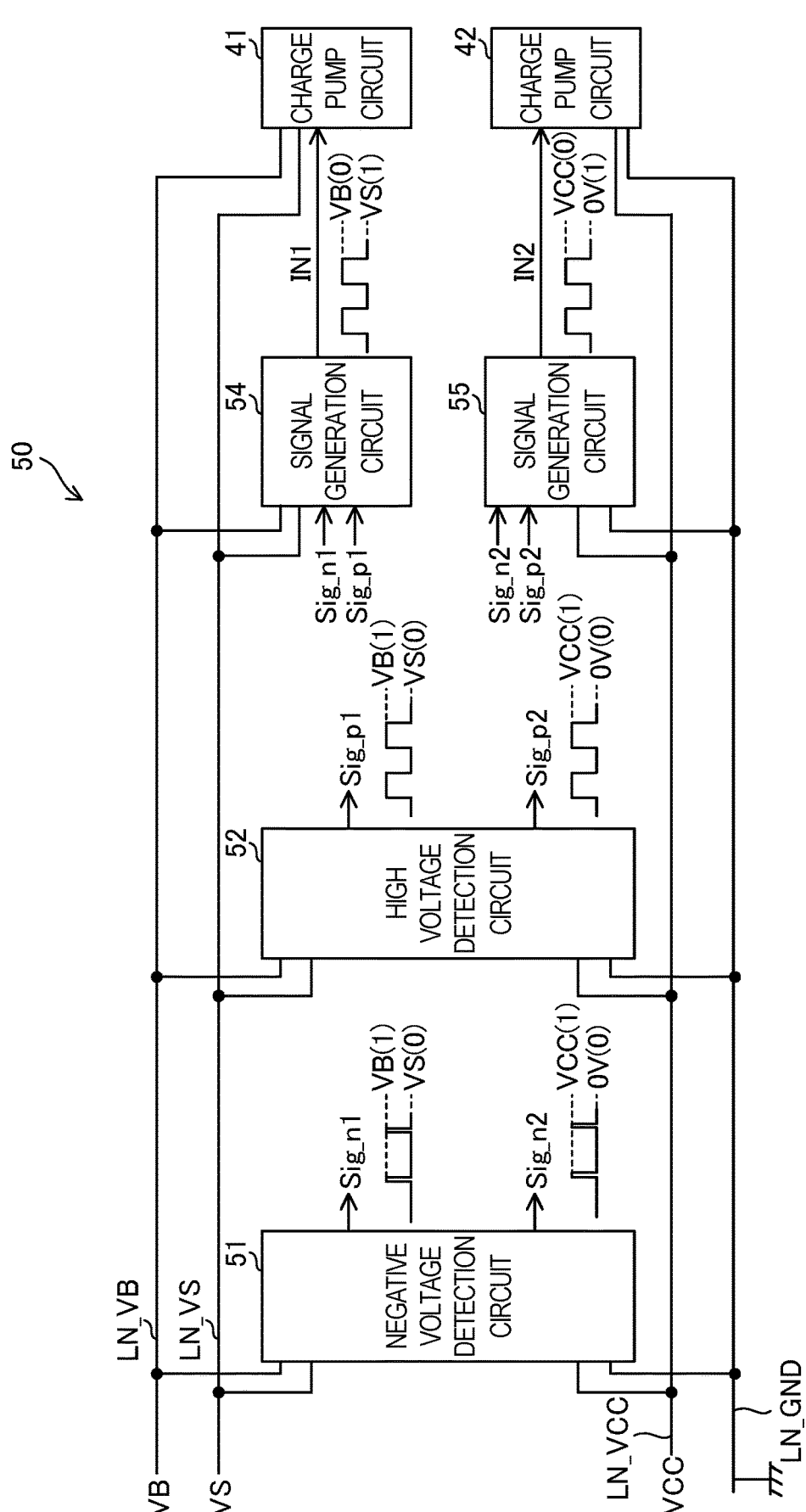
FIG. 14 is a diagram showing the configuration of part of a semiconductor device in connection with a second embodiment of the present disclosure.

FIG. 14 shows the configuration of part of the semiconductor device 1. FIG. 14 shows signal generation circuits 54 and 55 that are included among the components of the switching control circuit 50 in FIG. 6.

In FIG. 14, as mentioned above, the line LN_VB is a boot voltage line (floating supply line) connected to the boot terminal TM12 to be fed with the boot voltage VB, and the line LN_VCC is a control supply line connected to the control supply terminal TM14 to be fed with the control supply voltage VCC (see also FIG. 1). A line LN_VS is an output terminal line connected to the output terminal TM11 to be fed with the output terminal voltage VS, and a line LN_GND is a ground line connected to the ground terminal TM13 to be fed with the ground potential (see also FIG. 1).

The negative voltage detection circuit 51 is connected to the lines LN_VB, LN_VS, LN_VCC, and LN_GND. The negative voltage detection signal Sig_n (see FIG. 6) output from the negative voltage detection circuit 51 specifically comprises negative voltage detection signals Sig_n1 and Sig_n2. Sig_n1 and Sig_n2 are each a binary signal that takes the value (logic value) of "0" or "1". The signal Sig_n1 is a negative voltage detection signal Sig_n relative to the potential at the output terminal TM11 (hence the potential on the output terminal line LN_VS) and the signal Sig_n2 is a negative voltage detection signal Sig_n relative to the ground potential. Except for their difference in reference potential, the signals Sig_n1 and Sig_n2 are negative voltage detection signals that have similar significance.

It has been discussed in connection with the first embodiment that the value of the negative voltage detection signal Sig_n varies according to the magnitude relationship between the output terminal voltage VS and the negative threshold voltage Vth_n; here, Sig_n=1 signifies that Sig_n1=1 and Sig_n2=1 simultaneously, and Sig_n=0 signifies that Sig_n1=0 and Sig_n2=0 simultaneously. That is, the negative voltage detection circuit 51 is a circuit that, when the output terminal voltage VS is lower than the threshold voltage Vth_n, generates and outputs a signal Sig_n1 with the value "1" and a signal Sig_n2 with the value "1" simultaneously and that, when the output terminal voltage VS is higher than the threshold voltage Vth_n, generates and outputs a signal Sig_n1 with the value "0" and a signal Sig_n2 with the value "0" simultaneously. Here, when VS=Vth_n, the signals Sig_n1 and Sig_n2 may each have the value of either "0" or "1".

It is here assumed that a low-level signal Sig_n1 has the value "0" and that a high-level signal Sig_n1 has the value "1". A high-level signal Sig_n1 has the potential of the boot voltage VB (hence the potential on the line LN_VB), and a low-level signal Sig_n1 has the potential of the output terminal voltage VS (hence the potential at line LN_VS). Likewise, it is here assumed that a low-level signal Sig_n2 has the value "0" and that a high-level signal Sig_n2 has the value "1". A high level signal Sig_n2 has the potential of the control supply voltage VCC (hence the potential on the line LN_VCC), and a low-level signal Sig_n2 has the ground potential (hence the potential on the LN_GND).

The high voltage detection circuit 52 is connected to the lines LN_VB, LN_VS, LN_VCC, and LN_GND. The high voltage detection signal Sig_p (see FIG. 6) output from the high voltage detection circuit 52 specifically comprises high voltage detection signals Sig_p1 and Sig_p2. Sig_p1 and Sig_p2 are each a binary signal that takes the value (logic value) of "0" or "1". The signal Sig_p1 is a high voltage detection signal Sig_p relative to the potential at the output terminal TM11 (hence the potential on the output terminal line LN_VS) and the signal Sig_p2 is a high voltage detection signal Sig_p relative to the ground potential. Except for their difference in reference potential, the signals Sig_p1 and Sig_p2 are high voltage detection signals that have similar significance.

It has been discussed in connection with the first embodiment that the value of the high voltage detection signal Sig_p varies according to the magnitude relationship between the output terminal voltage VS and the positive threshold voltage Vth_p; here, Sig_p=1 signifies that Sig_p1=1 and Sig_p2=1 simultaneously, and Sig_p=0 signifies that Sig_p1=0 and Sig_p2=0 simultaneously. That is, the high voltage detection circuit 52 is a circuit that, when the output terminal voltage VS is higher than the threshold voltage Vth_p, generates and outputs a signal Sig_p1 with the value "1" and a signal Sig_p2 with the value "1" simultaneously and that, when the output terminal voltage VS is lower than the threshold voltage Vth_p, generates and outputs a signal Sig_p1 with the value "0" and a signal Sig_p2 with the value "0" simultaneously. Here, when VS=Vth_p, the signals Sig_p1 and Sig_p2 may each have the value of either "0" or "1".

It is here assumed that a low-level signal Sig_p1 has the value "0" and that a high-level signal Sig_p1 has the value "1". A high-level signal Sig_p1 has the potential of the boot voltage VB (hence the potential on the line LN_VB), and a low-level signal Sig_p1 has the potential of the output terminal voltage VS (hence the potential at line LN_VS). Likewise, it is here assumed that a low-level signal Sig_p2 has the value "0" and that a high-level signal Sig_p2 has the value "1". A high level signal Sig_p2 has the potential of the control supply voltage VCC (hence the potential on the line LN_VCC), and a low-level signal Sig_p2 has the ground potential (hence the potential on the LN_GND).

The signal generation circuit 54 is connected to the lines LN_VB and LN_VS, and operates by using the boot voltage VB as the positive-side supply voltage and the output terminal voltage VS as the negative-side supply voltage. The signal generation circuit 54 generates the control signal IN1 based on the negative voltage detection signal Sig_n1 from the negative voltage detection circuit 51 and the high voltage detection signal Sig_p1 from the high voltage detection circuit 52, and feeds the control signal IN1 to the charge pump circuit 41. The differential voltage detection circuit 53 in FIG. 6 is included in the signal generation circuit 54, and the signal generation circuit 54 controls the transistor M1 properly by generating the control signal IN1 while giving consideration to the differential voltage (VB−VS) (see FIG. 12).

It is here assumed that a low-level control signal IN1 has the value "1" and a high-level control signal IN1 has the value "0". A low-level control signal IN1 has the potential of the output terminal voltage VS (hence the potential on the line LN_VS) and a high-level control signal IN1 has the potential of the boot voltage VB (hence the potential on the line LN_VB).

The signal generation circuit 55 is connected to the lines LN_VCC and LN_GND, and operates by using the control supply voltage VCC as the positive-side supply voltage and the ground voltage as the negative-side supply voltage. The signal generation circuit 55 generates the control signal IN2 based on the negative voltage detection signal Sig_n2 from the negative voltage detection circuit 51 and the high voltage detection signal Sig_p2 from the high voltage detection circuit 52, and feeds the control signal IN2 to the charge pump circuit 42.

It is here assumed that a low-level control signal IN2 has the value "1" and a high-level control signal IN2 has the value "0". A low-level control signal IN2 has the ground potential (hence the potential on the line LN_GND) and a high-level control signal IN2 has the potential of the control supply voltage VCC (hence the potential on the line LN_VCC).

The charge pump circuit 41 is connected to the lines LN_VB and LN_VS, and either performs or does not perform the first charge pump operation described above based on the control signal IN1. The charge pump circuit 42 is connected to the lines LN_VCC and LN_GND, and either performs or does not perform the second charge pump operation described above based on the control signal IN2.

Controlling the charge pump circuit 41, which operates relative to the potential of the output terminal voltage VS, requires the control signal IN1, of which the potential is relative to that of the output terminal voltage VS, and the circuit (54) that generates the control signal IN1 requires a negative voltage detection signal and a high voltage detection signal of which the potentials are relative to that of the output terminal voltage VS. On the other hand, controlling the charge pump circuit 42, which operates relative to the ground potential, requires the control signal IN2, of which the potential is relative to the ground potential, and the circuit (55) that generates the control signal IN2 requires a negative voltage detection signal and a high voltage detection signal of which the potentials are relative to the ground potential. This is accomplished by generating the negative voltage detection signals Sig_n1 and Sig_n2 simultaneously in the negative voltage detection circuit 51 and generating the high voltage detection signals Sig_p1 and Sig_p2 simultaneously in the high voltage detection circuit 52.

Consider an imaginary configuration that generates only a negative voltage detection signal relative to the ground potential in the negative voltage detection circuit 51. The imaginary configuration requires a level shifter that generates from the negative voltage detection signal relative to the ground potential a negative voltage detection signal relative to the potential of the output terminal voltage VS, and such a level shifter is extremely difficult to implement. This is because, relative to the reference potential (ground potential) before level-shifting, the reference potential (VS) after level-shifting varies between positive and negative values. It is unfeasible or extremely difficult to implement a level shifter that tolerates such variation. This is true also with the high voltage detection circuit 52.

Figure 15:
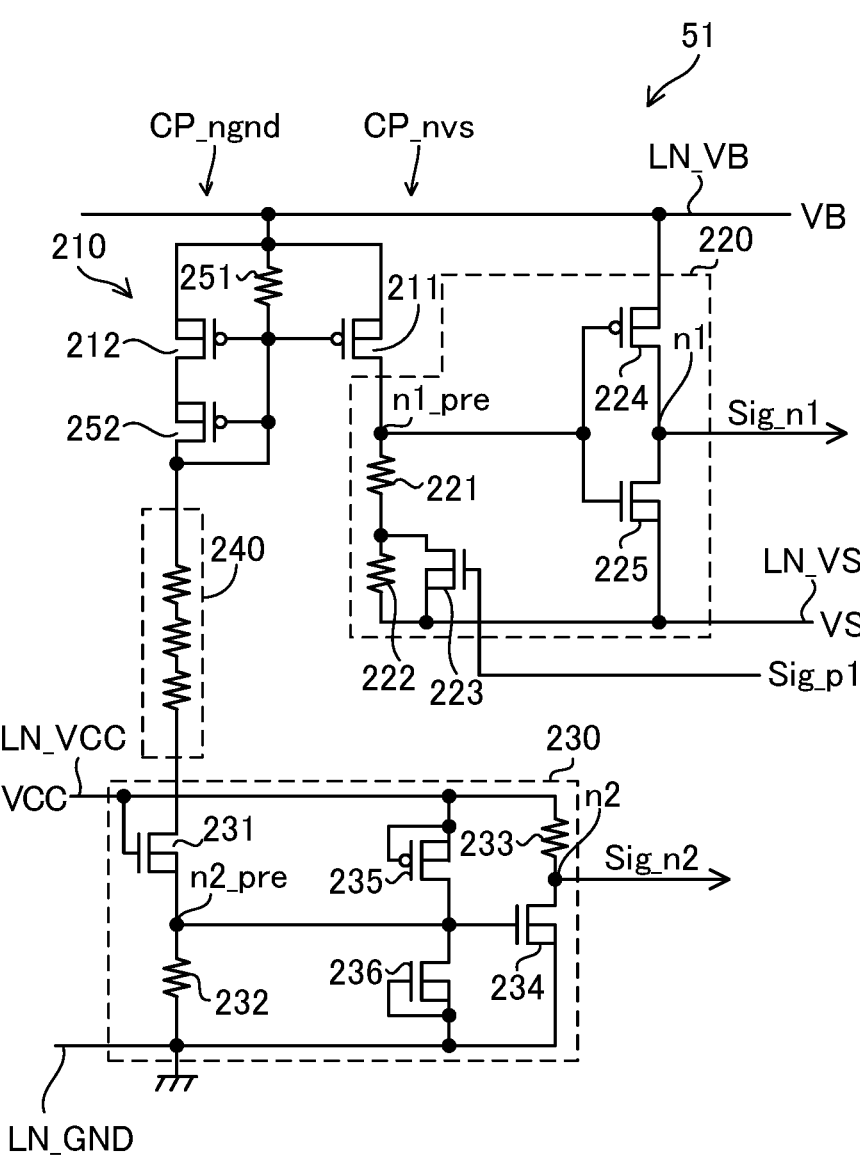
FIG. 15 is a circuit diagram of a negative voltage detection circuit in connection with the second embodiment of the present disclosure.

FIG. 15 shows a circuit diagram of the negative voltage detection circuit 51 that can generate the signals Sig_n1 and Sig_n2 described above. The negative voltage detection circuit 51 in FIG. 15 includes transistors 211, 212, 223 to 225, 231, 234 to 236, and 252, resistors 221, 222, 232, 233, and 251, and a current limiter 240. The current limiter 240 is composed of a series circuit of a plurality of resistors. The current limiter 240 may instead be configured with a single resistor. The transistors 211, 212, 224, 235, and 252 are P-channel MOSFETs, and the transistors 223, 225, 231, 234 and 236 are N-channel MOSFETs.

Figure 16:
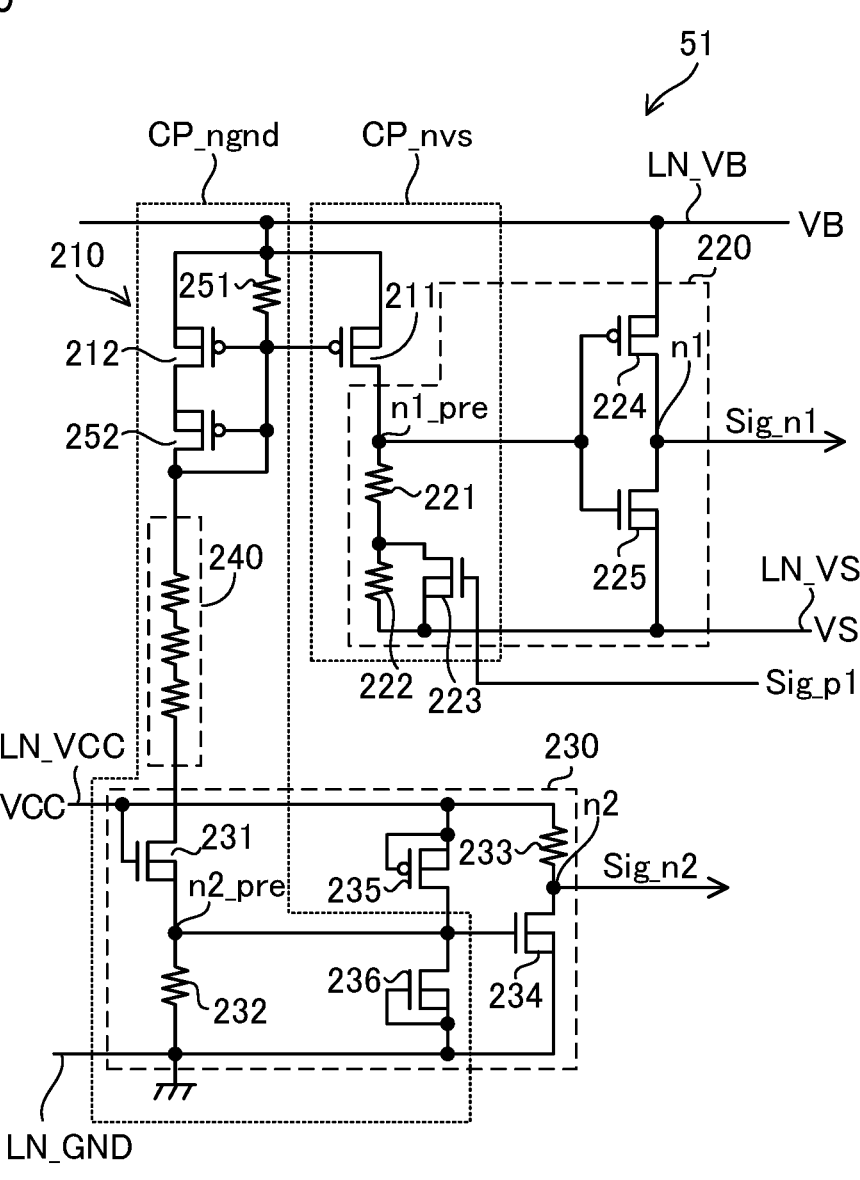
FIG. 16 is a diagram showing two current paths provided in the negative voltage detection circuit in connection with the second embodiment of the present disclosure.

As shown in FIG. 16, the negative voltage detection circuit 51 has a current path CP_ngnd provided between the boot voltage line LN_VB and the ground line LN_GND and a current path CP_nvs provided between the boot voltage line LN_VB and the output terminal line LN_VS. FIG. 16 is a diagram in which the current paths CP_nvs and CP_ngnd are emphasized in broken-line frames as compared with FIG. 15. The transistors 211 and 212 constitute a current mirror circuit 210. Of those transistors, the transistor 211 is a current mirror transistor inserted in the current path CP_nvs, and the transistor 212 is a current mirror transistor inserted in the current path CP_ngnd.

Along the current path CP_ngnd are arranged the transistor 212, the resistor 251, the transistor 252, the current limiter 240, the transistor 231, the resistor 232, and the transistor 236. Along the current path CP_nvs are arranged the transistor 211, the resistor 221, the resistor 222, and the transistor 223.

The operation and functions of the negative voltage detection circuit 51 in FIG. 15 will now be described in outline. An output terminal voltage VS (target voltage) that varies between positive and negative polarities relative to the ground is applied to the output terminal line LN_VS. Its variation is transmitted via the bootstrap capacitor CB to the boot voltage line LN_VB. It is here assumed that, in the steady state, the differential voltage (VB–VS) is 18 V and the output terminal voltage VS varies in the voltage range between –100 V and 600 V. At least in the both-off period $P_{DD1}$, the absolute value (100 V) of the negative output terminal voltage VS is higher than the differential voltage (VB–VS) in the steady state. Accordingly, like the output terminal voltage VS, the boot voltage VB varies between positive and negative polarities relative to the ground.

As a result, a current corresponding to the output terminal voltage VS (a current in a direction corresponding to the polarity of the output terminal voltage VS) may pass across the current path CP_ngnd in FIG. 16 and, if the transistor 212 is on, the current mirror circuit 210 so acts that a current corresponding to the current across the current path CP_ngnd passes across the current path CP_nvs. Whether a current passes across the current path CP_ngnd and, if so, the magnitude and direction of that current depend on the output terminal voltage VS.

A detection signal generation circuit 220 provided in the negative voltage detection circuit 51 generates and outputs the negative voltage detection signal Sig_n1 based on the current in the current path CP_nvs. Specifically, for example, the detection signal generation circuit 220 generates and outputs the negative voltage detection signal Sig_n1 by converting the current in the current path CP_nvs into a voltage relative to the potential on the output terminal line LN_VS. Note that the current in the current path CP_nvs can pass via the channels of the MOSFETs along the current path CP_nvs or via the parasitic diodes of the MOSFETs along the current path CP_nvs.

A detection signal generation circuit 230 provided in the negative voltage detection circuit 51 generates and outputs the negative voltage detection signal Sig_n2 based on the current in the current path CP_ngnd. Specifically, for example, the detection signal generation circuit 230 generates and outputs the negative voltage detection signal Sig_n2 by converting the current in the current path CP_ngnd into a voltage relative to the ground potential. Note that the current in the current path CP_ngnd can pass via the channels of the MOSFETs along the current path CP_ngnd or via the parasitic diodes of the MOSFETs along the current path CP_ngnd.

The detection signal generation circuit 220 can be understood to be constituted by the resistors 221 and 222 and the transistors 223 to 225. Of these components, the resistors 221 and 222 constitute a first resistor unit that is provided in series with the transistor 211 and that is inserted between a node n1_pre and the output terminal line LN_VS. The transistors 224 and 225 constitute a first binarizing circuit that generates the detection signal Sig_n1 by binarizing the voltage at the node n1_pre relative to the potential on the output terminal line LN_VS. The gate of the transistor 223 is fed with the high voltage detection signal Sig_p1 fed from the high voltage detection circuit 52. The transistor 223 functions as an adjustment circuit that adjusts the resistance value between the node n1_pre and the output terminal line LN_VS. The significance of this adjustment will be described later.

The detection signal generation circuit 230 can be understood to be constituted by the resistors 232 and 233 and the transistors 231 and 234 to 236. Of these components, the resistor 232 constitutes a second resistor unit that is provided in series with the transistor 212 and that is inserted between a node n2_pre and the ground line LN_GND. The resistor 233 and the transistor 234 constitute a second binarizing circuit that generates the detection signal Sig_n2 by binarizing the voltage at the node n2_pre relative to the potential on the ground line LN_GND.

In accordance with the output terminal voltage VS, the detection signals Sig_n1 and Sig_n2 are generated simultaneously such that if the detection signal Sig_n1 is at low level ("0") the detection signal Sig_n2 too is at low level ("0") and that if the detection signal Sig_n1 is at high level ("1") the detection signal Sig_n2 too is at high level ("1") (there can be a very small time lag).

The transistor 235 is provided to prevent the voltage at the node n2_pre from rising excessively in the process of the output terminal voltage VS rising from about 0 V toward the supply voltage VP, and this suppresses an excessive rise in the gate potential of the transistor 234. The transistor 236 is provided to prevent the voltage at the node n2_pre from falling excessively when the output terminal voltage VS is negative (e.g., −100V), and this suppresses an excessive fall in the gate potential of the transistor 234.

The interconnections among the circuit elements shown in FIG. 15 will now be described. The sources of the transistors 211 and 212 are connected to the boot voltage line LN_VB. The gates of the transistors 211, 212, and 252 are connected together. The gates of the transistors 211, 212, and 252 are connected via the resistor 251 to the boot voltage line LN_VB. The drain of the transistor 212 is connected to the source of the transistor 252. In the transistor 252, the drain and the gate are short-circuited together. The drain of the transistor 252 is connected via the current limiter 240 to the drain of the transistor 231.

The gate of the transistor 231 is connected to the control supply line LN_VCC. The source of the transistor 231 is connected to the node n2_pre. The node n2_pre is connected via the resistor 232 to the ground line LN_GND. The source and the gate of the transistor 235 and one terminal of the resistor 233 are connected to the control supply line LN_VCC. The other terminal of the resistor 233 is connected, at a node n2, to the drain of the transistor 234. The drains of the transistors 235 and 236 and the gate of the transistor 234 are connected to the node n2_pre. The gate and the source of the transistor 236 and the source of the transistor 234 are connected to the ground line LN_GND.

The drain of the transistor 211 is connected to the node n1_pre. One terminal of the resistor 221 is connected to the node n1_pre, and the other terminal of the resistor 221 is connected to one terminal of the resistor 222 and to the drain of the transistor 223. The other terminal of the resistor 222 and the source of the transistor 223 are connected to the output terminal line LN_VS. The source of the transistor 224 is connected to the boot voltage line LN_VB. The drains of the transistors 224 and 225 are connected together at the node n1. The source of the transistor 225 is connected to the output terminal line LN_VS. The gates of the transistors 224 and 225 are connected to the node n1_pre.

The signal that appears at the node n1 is the negative voltage detection signal Sig_n1. The transistors 224 and 225 constitute an inverter circuit, and this inverter circuit (224, 225) generates at the node n1 the negative voltage detection signal Sig_n1 corresponding to the voltage at the node n1_pre. The resistors 221 and 222 and the transistor 223 constitute an inverter gate signal generation circuit that generates a gate signal to the inverter circuit (224, 225).

The signal that appears at the node n2 is the negative voltage detection signal Sig_n2. The transistor 234, operating along with the resistor 233, generates at the node n2 the negative voltage detection signal Sig_n2 corresponding to the voltage at the node n2_pre.

With respect to the potentials (voltage levels) at the nodes n1_pre and n2_pre, high and low levels are defined as follows. If the potential at the node n1_pre is high level, the transistor 224 is off and the transistor 225 is on, so that the signal Sig_n1 is at low level; if the potential at the node n1_pre is low level, the transistor 224 is on and the transistor 225 is off, so that the signal Sig_n1 is at high level. If the potential at the node n2_pre is high level, the transistor 234 is on, so that the Sig_n2 is at low level; if the potential at the node n2_pre is low level, the transistor 234 is off, so that the Sig_n2 is at high level.

Figure 17:
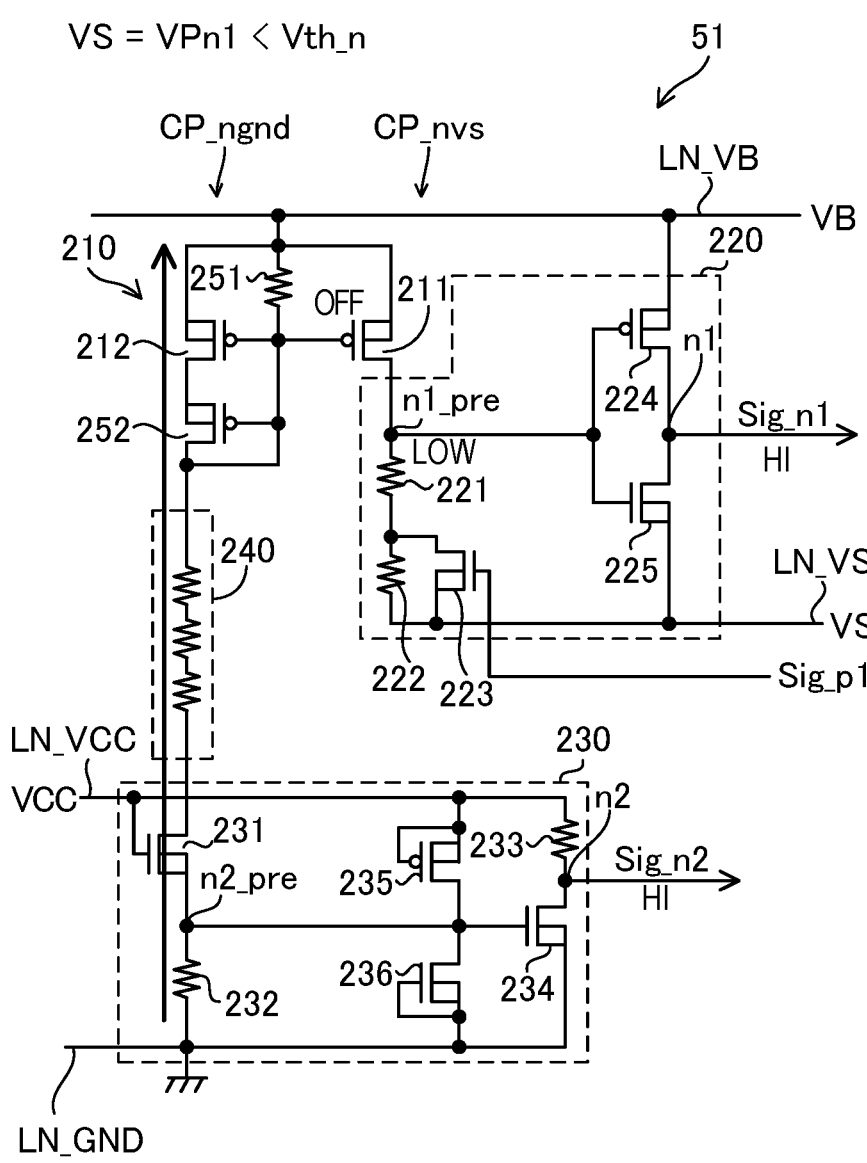
FIG. 17 is a diagram illustrating a static state of the negative voltage detection circuit in connection with the second embodiment of the present disclosure.
Figure 18:
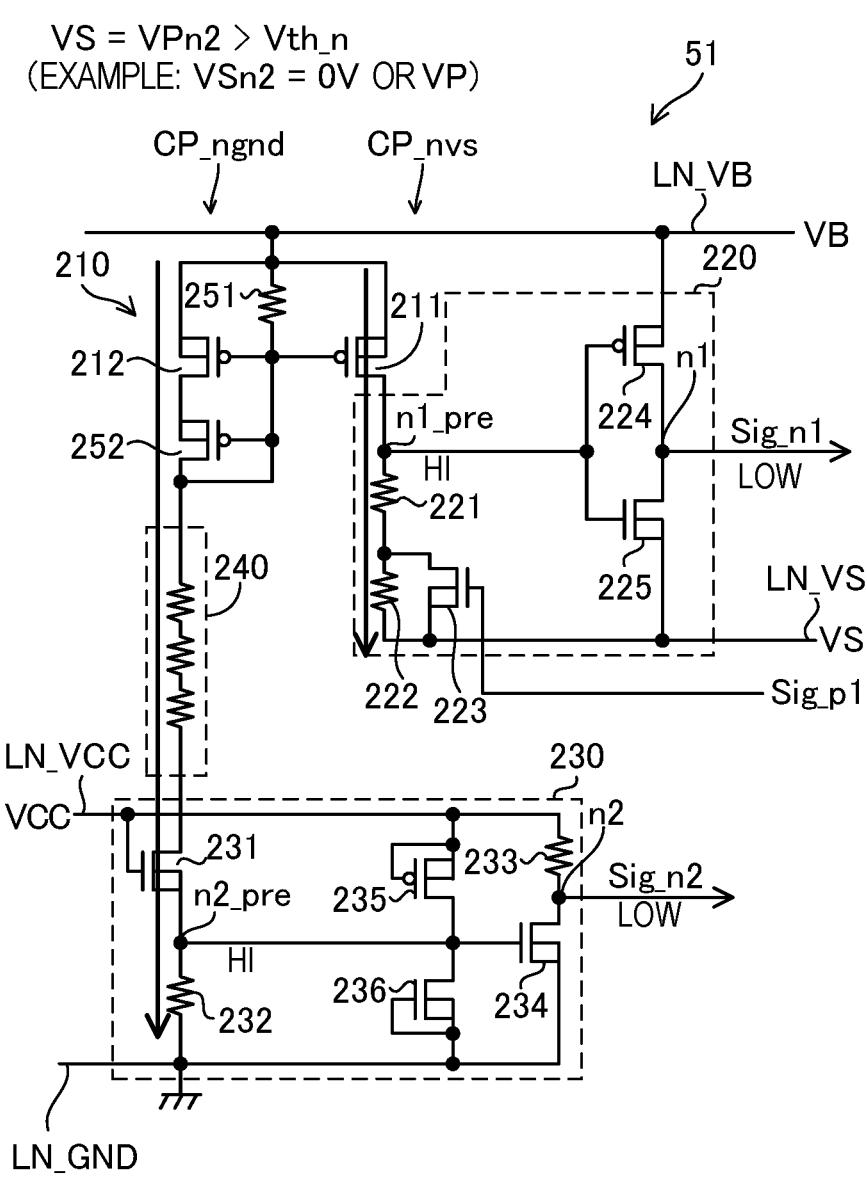
FIG. 18 is a diagram illustrating a static state of the negative voltage detection circuit in connection with the second embodiment of the present disclosure.

With reference to FIGS. 17 and 18, the static operation of the negative voltage detection circuit 51 will be described.

FIG. 17 shows the state of the negative voltage detection circuit 51 as observed if the value of the output terminal voltage VS is stably equal to a predetermined voltage VSn1 lower than the threshold voltage Vth_n. In the state in FIG. 17, a current passes from the ground line LN_GND toward the boot voltage line LN_VB, and meanwhile the gate of the transistor 234 is fed with a negative potential, so that the transistor 234 is off. Thus, the detection signal Sig_n2 is at high level. In the state in FIG. 17, no voltage that turns on the transistor 211 is applied between the gate and the source of the transistor 211, and thus the transistor 211 is off. Accordingly, in the state in FIG. 17, the node n1_pre is at low level (the node n1_pre has the potential of the output terminal line LN_VS), and thus the detection signal Sig_n1 is at high level.

FIG. 18 shows the state of the negative voltage detection circuit 51 as observed if the value of the output terminal voltage VS is stably equal to a predetermined voltage VSn2 higher than the threshold voltage Vth_n. The voltage VSn2 is, for example, 0 V or equal to the supply voltage VP. In the state in FIG. 18, the transistor 212 is on and a current passes from the boot voltage line LN_VB toward the ground line LN_GND. Thus, the node n2_pre is at high level and the detection signal Sig_n2 is at low level. Moreover, in the state in FIG. 18, a drain current corresponding to the drain current through the transistor 212 passes through the transistor 211, so that the node n1_pre is at high level; thus, the negative voltage detection signal Sig_n1 is at low level.

The negative voltage detection circuit 51 is a circuit that switches the negative voltage detection signals (Sig_n1, Sig_n2) between high and low levels in accordance with the magnitude relationship between the output terminal voltage VS and the threshold voltage Vth_n. Here, the threshold voltage Vth_n can be understood to lie within a predetermined voltage width. Under this understanding, the voltage VSn1 is lower than the lower limit of the voltage width of the threshold voltage Vth_n, and the voltage VSn2 is higher than the upper limit of the voltage width of the threshold voltage Vth_n. If the output terminal voltage VS lies within the voltage width of the threshold voltage Vth_n, the negative voltage detection signals (Sig_n1, Sig_n2) may have a medium potential that is not determined as either high or low level. This however does not pose a notable problem because, in the semiconductor device 1, the magnitude relationship between the output terminal voltage VS and the threshold voltage Vth_n switches quickly as the output terminal voltage VS varies.

Figure 19:
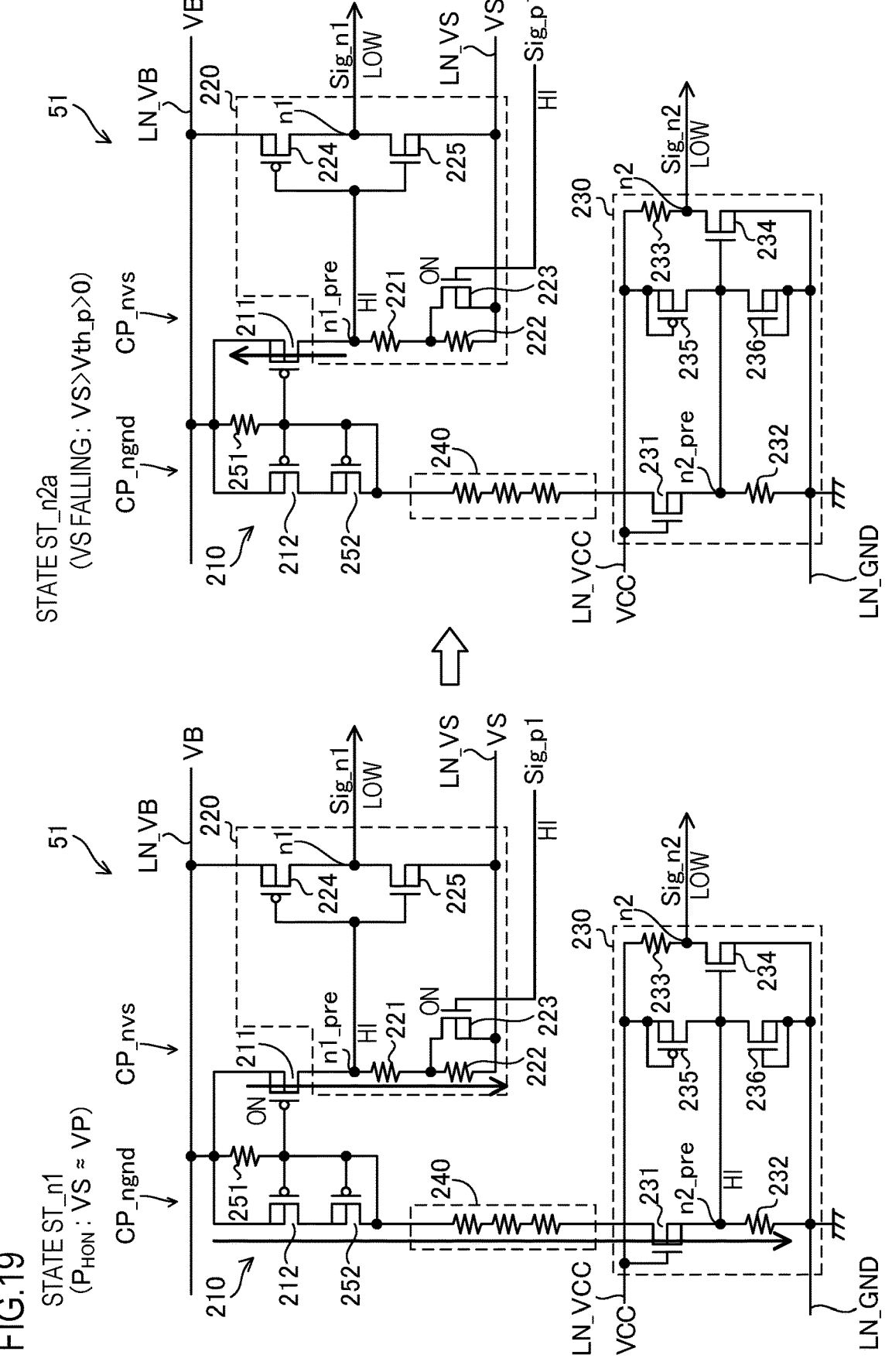
FIG. 19 is a diagram illustrating a state transition of the negative voltage detection circuit in connection with the second embodiment of the present disclosure.
Figure 20:
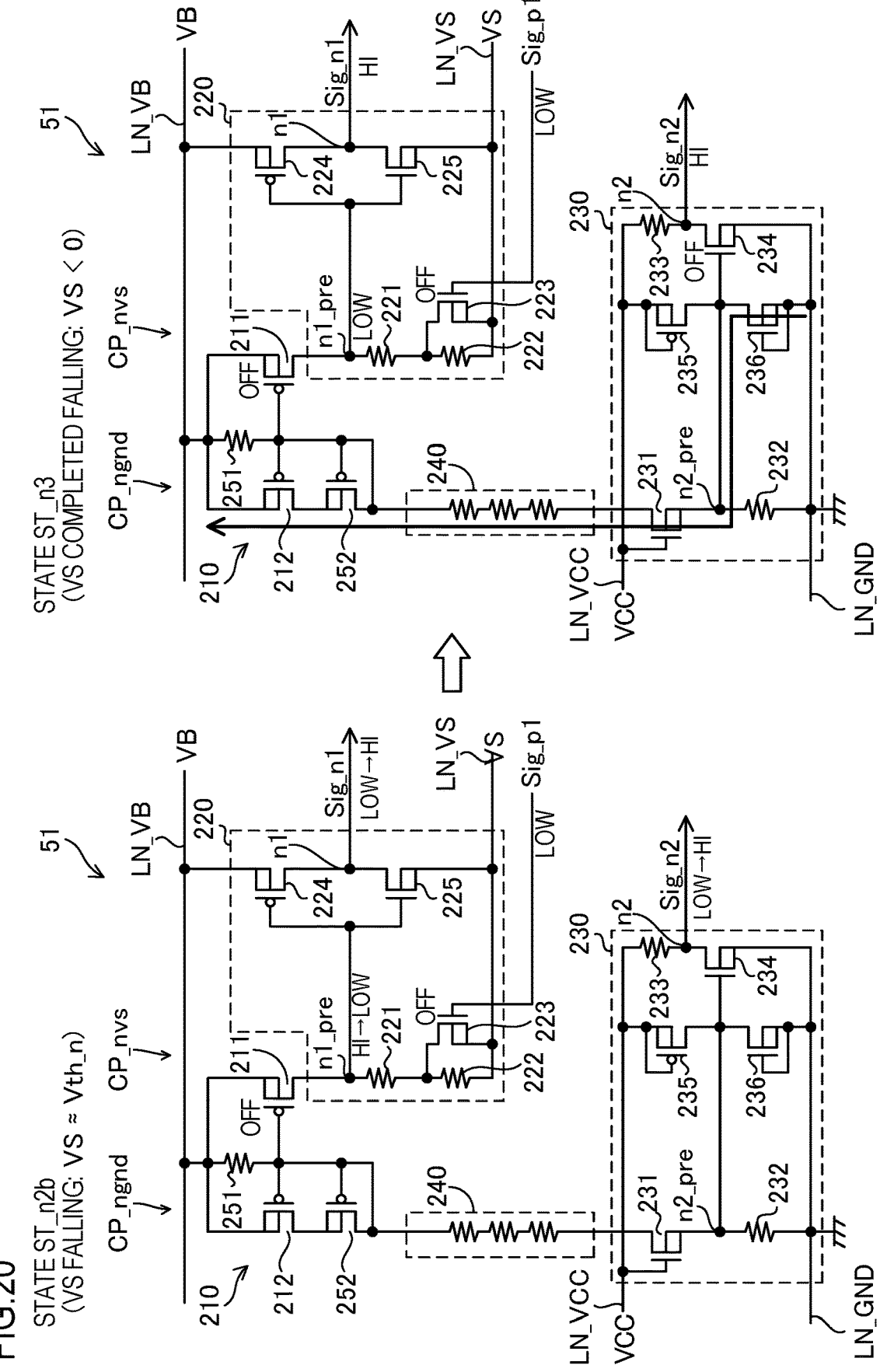
FIG. 20 is a diagram illustrating a state transition of the negative voltage detection circuit in connection with the second embodiment of the present disclosure.
Figure 21:
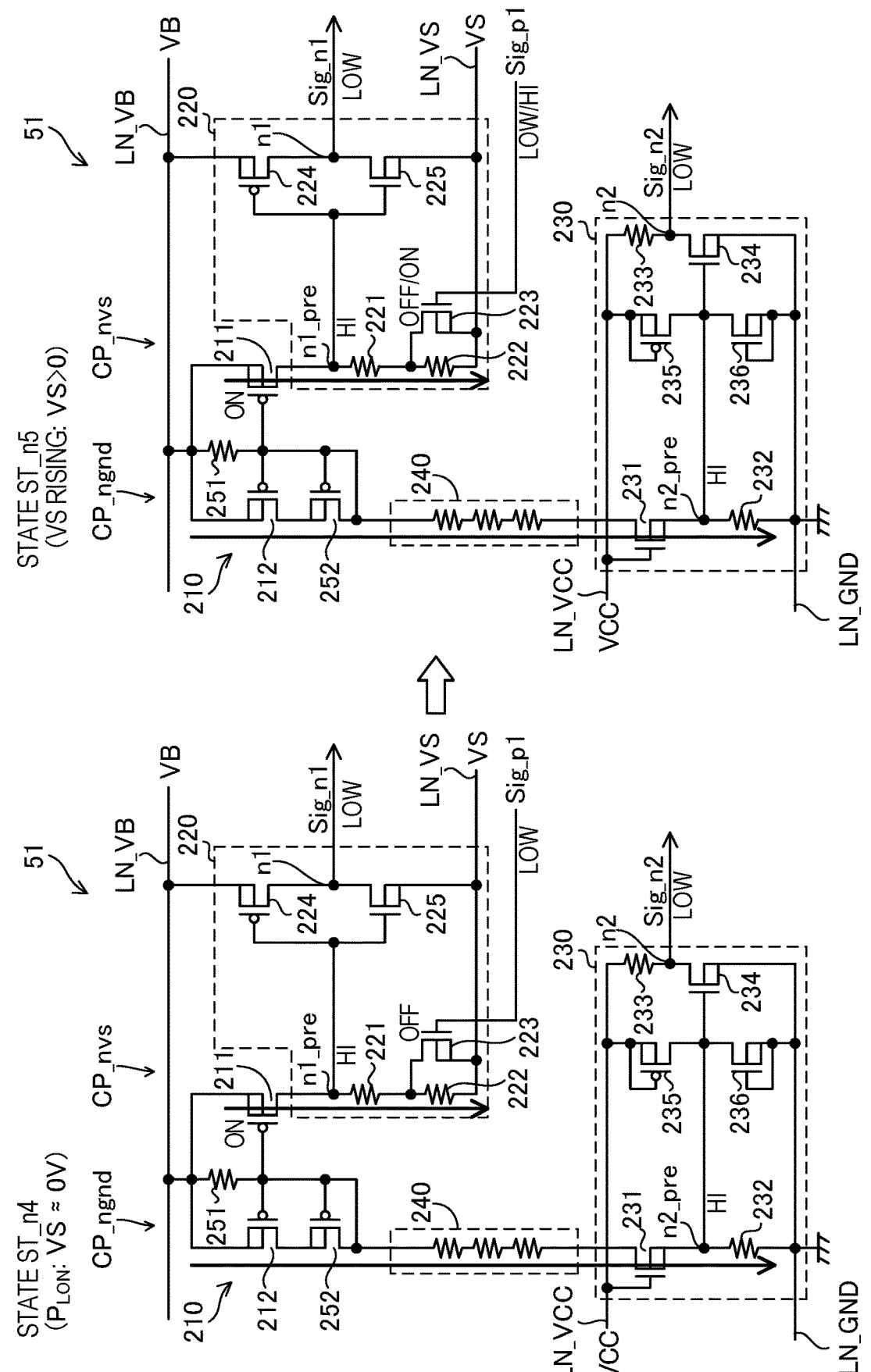
FIG. 21 is a diagram illustrating a state transition of the negative voltage detection circuit in connection with the second embodiment of the present disclosure.

Next, with reference to FIGS. 19 to 21, the dynamic operation of the negative voltage detection circuit 51 as observed as the output terminal voltage VS varies will be described in detail. FIGS. 19 to 21 show a total of six states ST_n1, ST_n2a, ST_n2b, ST_n3, ST_n4, and ST_n5. It is here assumed that these six states are all those observed with the differential voltage (VB–VS) stabilized around the threshold voltage Vth_dff. State ST_n1 shown at left in FIG. 19 is taken as the starting state; then the states occur in the order ST_n1, ST_n2a, ST_n2b, ST_n3, ST_n4, and ST_n5, then returning to state ST_n1 to repeat the sequence.

The period in which the negative voltage detection circuit 51 is in state ST_n1 can be understood as a first period, and the period in which the negative voltage detection circuit 51 is in state ST_n2a or ST_n2b can be understood as a second period. Likewise, the periods in which the negative voltage detection circuit 51 is in states ST_n3, ST_n4, and ST_n5 can be understood as a third, a fourth, and a fifth period respectively. With these periods understood in this way with focus on the negative voltage detection circuit 51, in the semiconductor device 1, a sequence of transitions from the first period through the second, third, and fourth periods to the fifth period and then back to the first period is repeated.

Note that, in the process of the output terminal voltage VS varying, the operation of the negative voltage detection circuit 51 exhibits a transient response. As a result of the transient response, there may occur, in the process of the output terminal voltage VS falling, a time lag between the timing of a switch from VS>Vth_n to VS<Vth_n and the timing of a switch of the levels of the negative voltage detection signals Sig_n1 and Sig_n2 from low level ("0") to high level ("1"). Likewise, there may occur, in the process of the output terminal voltage VS rising, a time lag between the timing of a switch from VS<Vth_n to VS>Vth_n and the timing of a switch of the levels of the negative voltage detection signals Sig_n1 and Sig_n2 from high level ("1") to low level ("0"). Now, the states shown in FIGS. 19 to 21 will be described one by one.

State ST_n1 (at left in FIG. 19) corresponds to a state where, in the high-side-on period $P_{HON}$, the output terminal voltage VS is sufficiently high and is substantially equal to the supply voltage VP. In state ST_n1, the transistor 212 is on and a current passes across the current path CP_ngnd. That is, a current passes from the boot voltage line LN_VB via the transistors 212 and 252, the current limiter 240, the transistor 231, and the resistor 232 toward the ground line LN_GND. Here, the voltage drop across the resistor 232 is higher than the gate threshold voltage of the transistor 234. Accordingly, in state ST_n1, the potential at the node n2_pre is high level, so that the transistor 234 is on and the detection signal Sig_n2 is at low level (i.e., it substantially has the ground potential).

Moreover, in state ST_n1, in coordination with the transistor 212 being on, the transistor 211 too is on, and a current passes across the current path CP_nvs. That is, a current passes from the boot voltage line LN_VB via the transistor 211 and the inverter gate signal generation circuit (221 to 223) toward the output terminal line LN_VS. In state ST_n1, the high voltage detection signal Sig_p1 is at high level, and this leaves the transistor 223 on. Accordingly, in state ST_n1, the potential at the node n1_pre is higher than the output terminal voltage VS by the voltage drop across the resistor 221 ascribable to the drain current through the transistor 211 (the on resistance of the transistor 223 is ignored as being sufficiently low). The potential at the node n1_pre here corresponds to high level. Thus, in state ST_n1, the detection signal Sig_n1 is at low level (i.e., it has a potential substantially equal to the output terminal voltage VS).

State ST_n2a (at right in FIG. 19) is a state where, as a result of the transition from the high-side-on period $P_{HON}$ to the both-off period $P_{DD1}$, the output terminal voltage VS is in the process of falling from the level of the supply voltage VP. Note that it is here assumed that, in state ST_n2a, the output terminal voltage VS is higher than the threshold voltage Vth_p (>0) for the high voltage detection circuit 52.

In state ST_n2a, as the boot voltage VB falls, the discharging of the stored electric charges in the capacitive components that accompany the current path CP_ngnd proceeds. Meanwhile, depending on the progress of the discharging, whether the transistor 212 is on or off is indefinite. If, for the sake of argument, the discharging of the stored electric charges proceeds from the boot voltage line LN_VB toward the ground line LN_GND, the transistor 212 is on; if it proceeds in the opposite direction, the transistor 212 is off. In either case, in state ST_n2a, as a result of a current passing from the node n2_pre toward the ground, or as a result of the stored electric charge in the gate capacitance of the transistor 234 not being fully discharged, the transistor 234 is held on continuously from state ST_n1, and thus the signal Sig_n2 is at low level.

In state ST_n2a, the discharging of the stored electric charges in the gate capacitances in the inverter circuit (224, 225) proceeds. The discharging can take place across two possible paths: one via the parasitic capacitance of the transistor 211 and another via the inverter gate signal generation circuit (221 to 223). In the negative voltage detection circuit 51 in state ST_n2a shown at right in FIG. 19, the passage of the current across the former path is indicated expressly. Here, owing to a comparatively high resistance value of the resistor 221, discharging across the former path is dominant, and the potential at the node n1_pre keeps the transistor 224 off and the transistor 225 on; thus, the signal Sig_n1 is at low level.

Like state ST_n2a, state ST_n2b (at left in FIG. 20) too is a state where, as a result of the transition from the high-side-on period $P_{HON}$ to the both-off period $P_{DD1}$, the output terminal voltage VS is in the process of falling from the level of the supply voltage VP. In state ST_n2b, however, the output terminal voltage VS lies around the threshold voltage Vth_n (<0) for the negative voltage detection circuit

51. State ST_n2*b* can be understood to correspond to a state where VS=Vth_n in the process of the output terminal voltage VS falling.

In the process of the output terminal voltage VS falling, at or around the timing that VS=Vth_n is fulfilled, a current from the ground line LN_GND toward the boot voltage line LN_VB starts to pass across the current path CP_ngnd, with the result that the transistor 234 turns off and an up edge occurs in the signal Sig_n2.

Moreover, in state ST_n2*b*, in coordination with the transistor 212 being off, the transistor 211 too is off. In state ST_n2*b*, the discharging of the stored electric charges in the gate capacitances in the inverter circuit (224, 225) takes place across a path via the inverter gate signal generation circuit (221 to 223). Moreover, in state ST_n2*b*, the high voltage detection signal Sig_p1 is at low level, and thus the transistor 223 is off. However, at one stage before state ST_n2*b* is reached, the discharging of the stored electric charges in the gate capacitances in the inverter circuit (224, 225) has proceeded until the potential at the node n1_pre is determined as low level. Accordingly, in state ST_n2*b*, as the potential at node n1_pre becomes sufficiently close to the output terminal voltage VS, an up edge occurs in the signal Sig_n1.

While the up edge in the signal Sig_n1 and the up edge in the signal Sig_n2 do not always occur at completely the same timing, those up edges do occur at substantially the same timing (the circuit constants and the characteristics of the circuit elements are determined so as to achieve that).

State ST_n3 (at right in FIG. 20) is a state where, through the transition from the high-side-on period P_{HON} to the both-off period P_{DD1}, the output terminal voltage VS has finished falling and, now in the both-off period P_{DD1}, the output terminal voltage VS has its lowest potential (e.g., −100 V).

In state ST_n3, the potential of the boot voltage VB is sufficiently lower than the ground potential, and a current passes across the current path CP_ngnd from the ground line LN_GND toward the boot voltage line LN_VB via the parasitic diode of the transistor 236 and the current limiter 240. Thus, in state ST_n3, the potential at the node n2_pre is lower than the ground potential, with the result that the transistor 234 is off and the signal Sig_n2 is at high level. Owing to the transistor 236, the voltage at the node n2_pre is prevented from falling excessively, and this protects the transistor 234.

Moreover, owing to the current limiter 240, the current across the current path CP_ngnd in state ST_n3 is kept low. That is, a current from the ground line LN_GND toward the boot voltage line LN_VB (which can be called a reverse current) is suppressed.

Moreover, in state ST_n3, in coordination with the transistor 212 being off, the transistor 211 too is off. Already in state ST_n2*b* (at left in FIG. 20), the gate capacitances in the inverter circuit (224, 225) have finished being discharged and the potential at the node n1_pre has turned to low level, and in state ST_n3 the potential at the node n1_pre is kept at low level. Thus, in state ST_n3, the signal Sig_n1 is at high level. Note that, in state ST_n3, the high voltage detection signal Sig_p1 is at low level and thus the transistor 223 is off.

State ST_n4 (at left in FIG. 21) corresponds to a state where, in the low-side-on period P_{LON}, the output terminal voltage VS is substantially equal to 0 V (particular voltage). In state ST_n4, the boot voltage VB is higher than the ground voltage by the differential voltage (VB−VS); thus, the transistor 212 is on and a current pass across the current path CP_ngnd. That is, a current passes from the boot voltage line LN_VB via the transistors 212 and 252, the current limiter 240, the transistor 231, and the resistor 232 toward the ground line LN_GND. Here, the voltage drop across the resistor 232 is higher than the gate threshold voltage of the transistor 234. Accordingly, in state ST_n4, the potential at the node n2_pre is high; thus, the transistor 234 is on and the detection signal Sig_n2 is at low level (i.e., it substantially has the ground potential).

Moreover, in state ST_n4, in coordination with the transistor 212 being on, the transistor 211 too is on, and a current passes across the current path CP_nvs. That is, a current passes from the boot voltage line LN_VB via the transistor 211 and the inverter gate signal generation circuit (221 to 223) toward the output terminal line LN_VS. As a result, the potential at the node n1_pre is high level and the detection signal Sig_n1 is at low level (i.e., it has a potential substantially equal to the output terminal voltage VS).

State ST_n4 (at left in FIG. 21) is similar to state ST_n1 (at left in FIG. 19). However, while in state ST_n1 the output terminal voltage VS is higher than the threshold voltage Vth_p, in state ST_n4 the output terminal voltage VS is lower than the threshold voltage Vth_p. In other words, the boot voltage VB in state ST_n4 (e.g., 18 V) is lower than the boot voltage VB in state ST_n1 (e.g., 18 V+600 V). Accordingly, the magnitude of the current that passes across the current path CP_ngnd is lower in state ST_n4 than in state ST_n1 and, in coordination with that, the current mirror circuit 210 functions such that the magnitude of the current that passes across the current path CP_nvs is lower in state ST_n4 than in state ST_n1.

The magnitude of the current that passes across the current path CP_ngnd with the transistor 212 on basically depends on the values of the control supply voltage VCC and the resistor 232. However, owing to the current limiter 240, the current that passes across the current path CP_ngnd is lower in the low-side-on period P_{LON} (i.e., in state ST_n4) than in the high-side-on period P_{HON} (i.e., in state ST_n1). More specifically, with a design such that, in the high-side-on period P_{HON}, a predetermined voltage drop (VCC−0.5V) =(18V−0.5V)=17.5V occurs across the resistor 232, in the low-side-on period P_{LON}, VB≈VCC=18V. Thus, in the low-side-on period P_{LON}, owing to the current limiter 240, no such current as produces the above-mentioned voltage drop (17.5 V) passes across the resistor 232, and the current that passes across the current path CP_ngnd is lower than in the high-side-on period P_{HON}.

However, also in the low-side-on period P_{LON} (i.e., in state ST_n4), as in the high-side-on period P_{HON} (i.e., as in state ST_n1), the potential at the node n1_pre needs to be raised such that the signal Sig_n1 is at low level.

With this taken into consideration, the transistor 223 is provided. In state ST_n4, the high voltage detection signal Sig_p1 is at low level, so the transistor 223 is off. Accordingly, the resistance value between the node n1_pre and the output terminal line LN_VS is higher in state ST_n4 than in state ST_n1. As a result, also in state ST_n4, the potential at the node n1_pre is raised such that the signal Sig_n1 is at low level.

The detection signal generation circuit 220 can be said to include an adjustment circuit (223) that adjusts the resistance value between the node n1_pre and the output terminal line LN_VS so as to vary the resistance value between the node n1_pre and the output terminal line LN_VS according to the high voltage detection signal Sig_p1 (i.e., according to whether the output terminal voltage VS is higher than a positive threshold voltage Vth_p).

State ST_n5 (at right in FIG. 21) is a state in which, as a result of the transition from the low-side-on period $P_{LON}$ to the both-off period $P_{DD2}$, the output terminal voltage VS is in the process of rising from the ground level.

In state ST_n5, as in state ST_n4, with the transistor 212 on, a current passes across the current path CP_ngnd and the potential at the node n2_pre is high level; thus, the transistor 234 is on. Accordingly, in state ST_n5, as in state ST_n4, the detection signal Sig_n2 is at low level (i.e., it substantially has the ground potential).

Moreover, in state ST_n5, in coordination with the transistor 212 being on, the transistor 211 too is on, and a current passes across the current path CP_nvs. That is, a current passes from the boot voltage line LN_VB via the transistor 211 and the inverter gate signal generation circuit (221 to 223) toward the output terminal line LN_VS. As a result, the potential at the node n1_pre is high level, and the detection signal Sig_n1 is at low level (i.e., it has a potential substantially equal to the output terminal voltage VS).

In the process of the output terminal voltage VS rising from the ground level, the high voltage detection signal Sig_p1 changes from low level to high level, and in response to this change, the transistor 223 turns from off to on. Here, at the stage that the transistor 223 turns off, as the boot voltage VB rises the drain current through the transistor 211 has risen sufficiently high, and thus the signal Sig_n1 is kept at low level continuously from state ST_n4 into state ST_n5.

If, for the sake of argument, the transistor 235 is not provided, in the process of the output terminal voltage VS rising from the ground level to the level of the supply voltage VP (e.g., 600 V), the potential at the node n2_pre may rise excessively (e.g., it may rise momentarily to about 200 V) under the influence of the drain-source capacitance of the transistor 231 and the like. Providing the transistor 235 suppresses such an excessive rise and protects the transistor 234.

Figure 22:
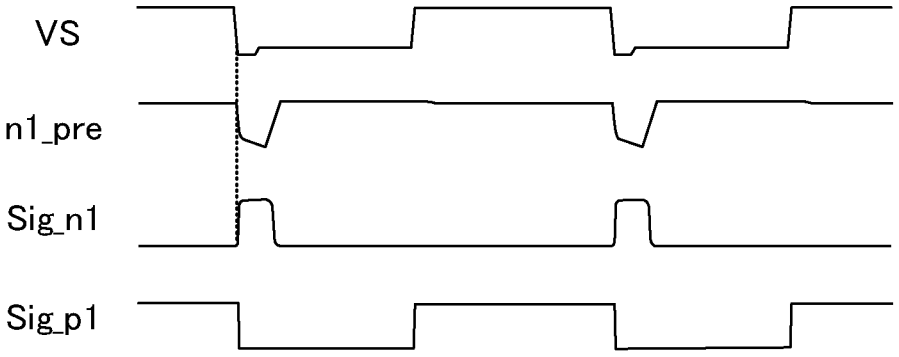
FIG. 22 is a diagram schematically showing an outline of the waveforms of some signals associated with the negative voltage detection circuit in connection with the second embodiment of the present disclosure.
Figure 23:
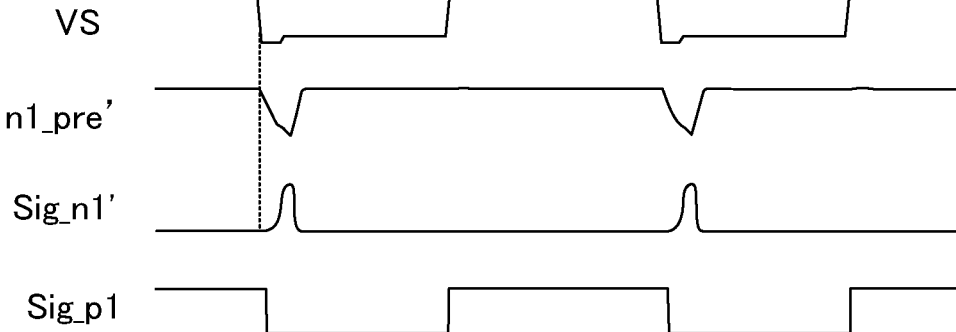
FIG. 23 is a diagram schematically showing an outline of the waveforms of some signals associated with an imaginary negative voltage detection circuit in connection with the second embodiment of the present disclosure.

With reference to FIGS. 22 and 23, a description will be given of the workings and effects of using the high voltage detection signal Sig_p1 in the negative voltage detection circuit 51. FIG. 22 schematically shows an outline of the waveforms of some signals associated with the negative voltage detection circuit 51. FIG. 23 schematically shows an outline of the waveforms of some signals associated with an imaginary negative voltage detection circuit. FIG. 22 assumes that the negative voltage detection circuit 51 includes the transistor 223 and that the transistor 223 is turned on and off based on the signal Sig_p1. The imaginary negative voltage detection circuit is configured like the negative voltage detection circuit 51 except that the transistor 223 is omitted. For convenience' sake, the node n1_pre in the imaginary negative voltage detection circuit will be identified by n1_pre' and the negative voltage detection signal Sig_n1 in the imaginary negative voltage detection circuit will be identified by Sig_n1'.

From the example of waveforms in FIG. 22, it is understood that, in the process of the output terminal voltage VS falling over the transition from the high-side-on period $P_{HON}$ to the both-off period $P_{DD1}$, the electric charge at the node n1_pre is discharged quickly and the signal Sig_n1 switches to high level quickly. By contrast, in the example of waveforms in FIG. 23 associated with the imaginary negative voltage detection circuit, the constantly high resistance value at the node n1_pre' results in a low discharge speed of the electric charge at the node n1_pre in the process of the output terminal voltage VS falling. It is understood that, as a result, an up edge occurs with a delay in the negative voltage detection signal (Sig_n1'). A delay in the occurrence of an up edge in the negative voltage detection signal results in a reduced charging time of the bootstrap capacitor CB based on the negative output terminal voltage VS (i.e., a delay in the charge start timing). Providing the transistor 223 helps suppress such a delay.

A second embodiment includes Practical Examples EX2_1 to EX2_3 as described below.

Practical Example EX2_1

Figure 24:
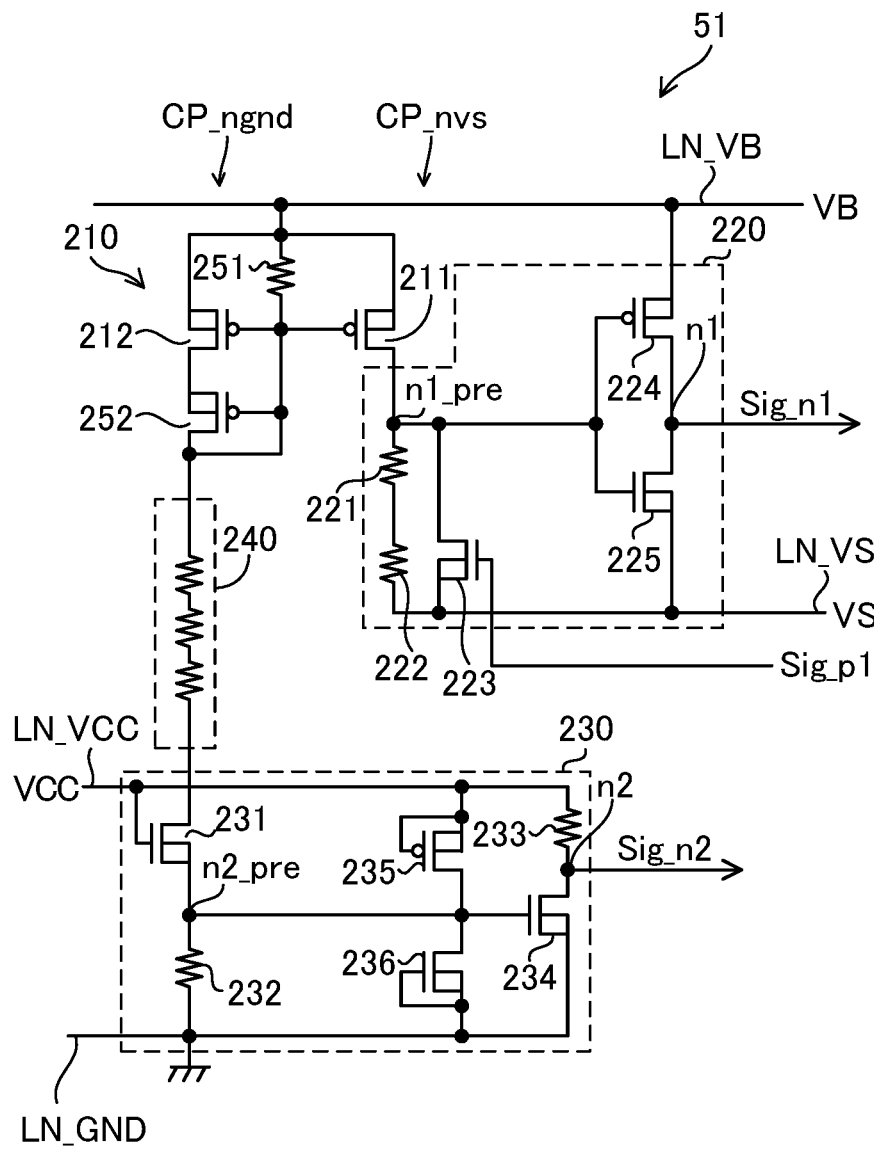
FIG. 24 is a diagram showing a modified configuration of the negative voltage detection circuit in connection with the second embodiment of the present disclosure.

In the process of the output terminal voltage VS falling from the supply voltage VP, if a faster fall in the potential at the node n1_pre is desired, the negative voltage detection circuit 51 shown in FIG. 15 can be modified as shown in FIG. 24, where the drain of the transistor 223 is connected directly to the node n1_pre.

Practical Example EX2_2

Figure 25:
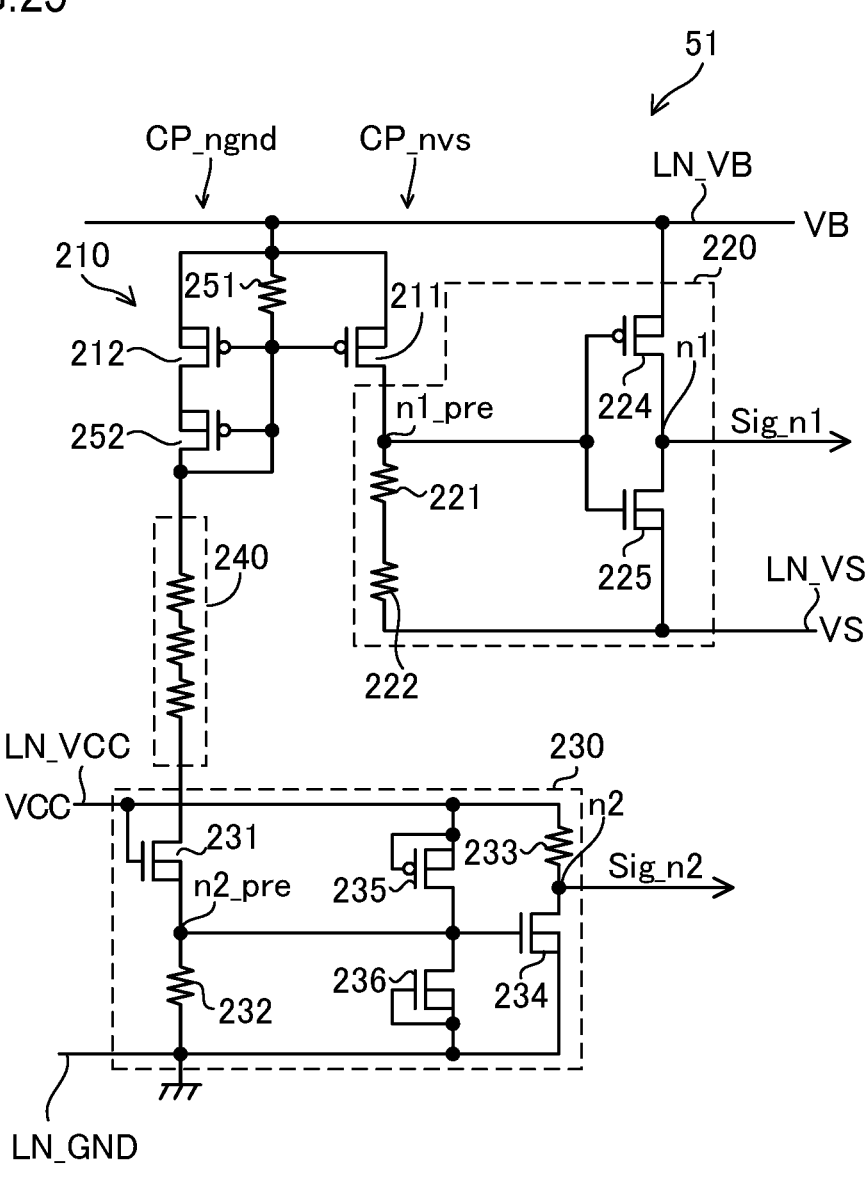
FIG. 25 is a diagram showing another modified configuration of the negative voltage detection circuit in connection with the second embodiment of the present disclosure.

Depending on the speed or width of variation of the output terminal voltage VS, the gate capacitances in the inverter circuit (224, 225), and like, even without the transistor 223, the negative voltage detection signal Sig_n1 may not exhibit so large a delay as to pose a problem. In such a case, the negative voltage detection circuit 51 may be modified as shown in FIG. 25, where the transistor 223 is omitted.

Practical Example EX2_3

The negative voltage detection circuit 51 described in connection with the second embodiment can be applied not only to the semiconductor device 1 configured as shown in FIG. 1 but to any device that requires a plurality of negative voltage detection signals relative to different potentials.

Third Embodiment

A third embodiment of the present disclosure will be described. The third embodiment deals with the high voltage detection circuit 52 (see FIG. 14) that can generate high voltage detection signals Sig_p1 and Sig_p2.

Figure 26:
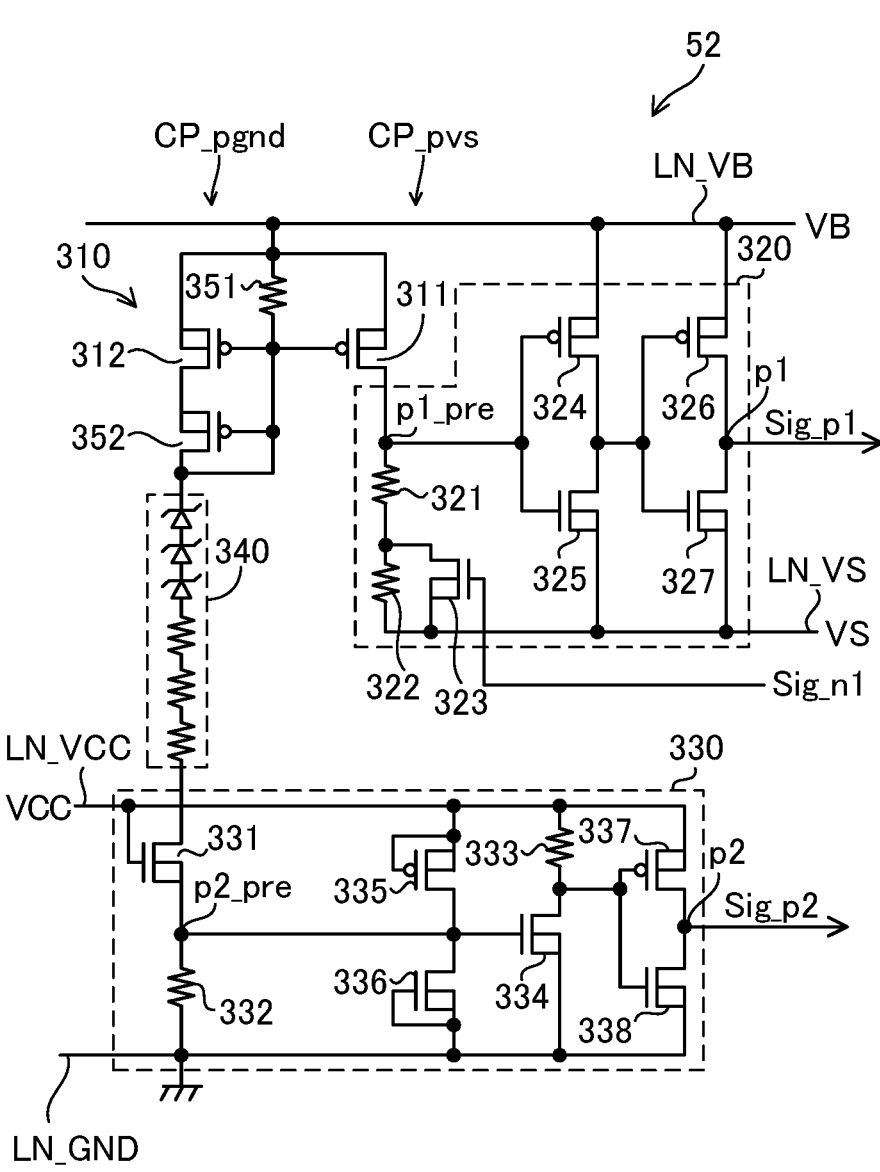
FIG. 26 is a circuit diagram of a high voltage detection circuit in connection with a third embodiment of the present disclosure.

FIG. 26 shows a circuit diagram of the high voltage detection circuit 52 according to the third embodiment. The high voltage detection circuit 52 in FIG. 26 includes transistors 311, 312, 323 to 327, 331, 334-338, and 352, resistors 321, 322, 332, 333, and 351, and a current limiter 340. The current limiter 340 is composed of a series circuit of a plurality of resistors and a plurality of Zener diodes. The number of resistors in the current limiter 340 may be one, and the number of Zener diodes in the current limiter 340 may be one. The transistors 311, 312, 324 326, 335, 337, and 352 are P-channel MOSFETs, and the transistors 323, 325, 327, 331, 334, 336, and 338 are N-channel MOSFETs.

Figure 27:
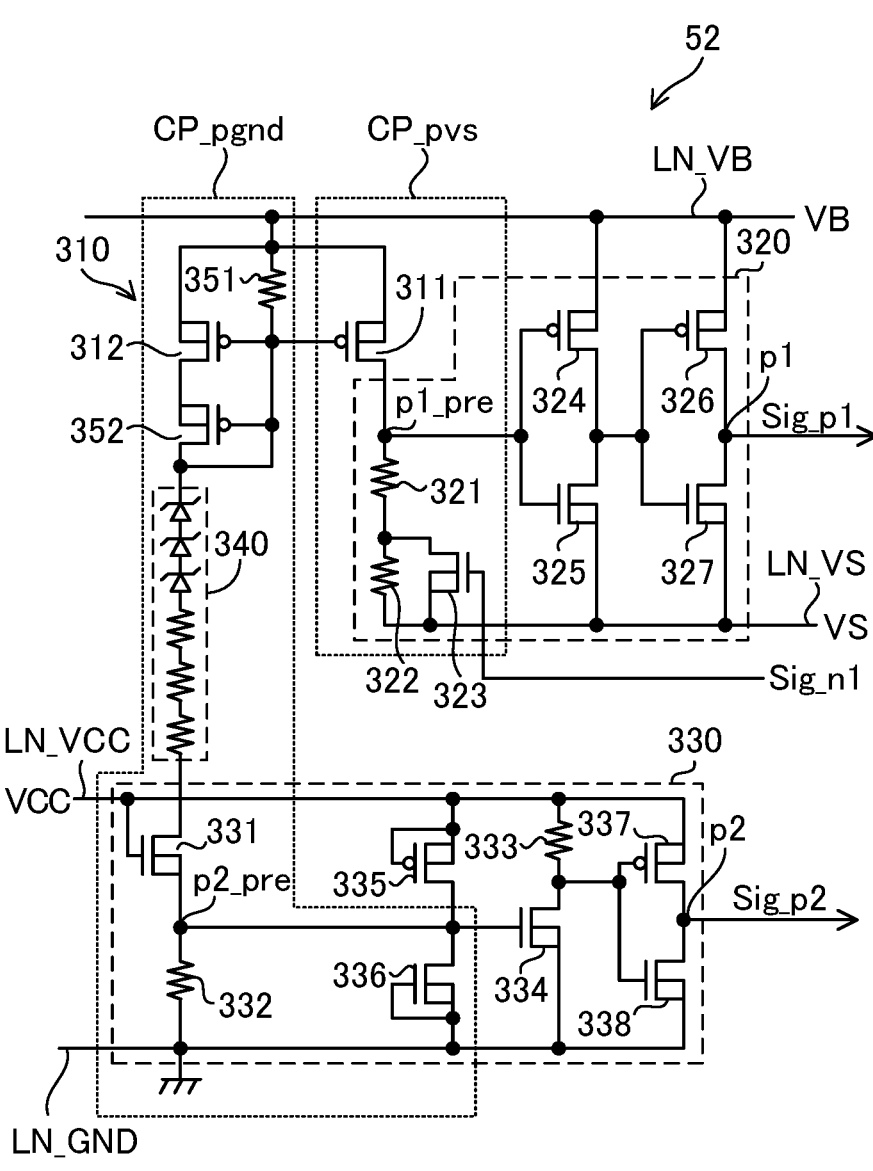
FIG. 27 is a diagram showing two current paths provided in the high voltage detection circuit in connection with the third embodiment of the present disclosure.

As shown in FIG. 27, the high voltage detection circuit 52 has a current path CP_pgnd provided between the boot voltage line LN_VB and the ground line LN_GND and a current path CP_pvs provided between the boot voltage line LN_VB and the output terminal line LN_VS. FIG. 27 is a diagram in which the current paths CP_pvs and CP_pgnd are emphasized in broken-line frames as compared with FIG. 26. The transistors 311 and 312 constitute a current mirror circuit 310. Of those transistors, the transistor 311 is a current mirror transistor inserted in the current path CP_pvs, and the transistor 312 is a current mirror transistor inserted in the current path CP_pgnd.

Along the current path CP_pgnd are arranged the transistor 312, the resistor 351, the transistor 352, the current limiter 340, the transistor 331, the resistor 332, and the transistor 336. Along the current path CP_pvs are arranged the transistor 311, the resistor 321, the resistor 322, and transistor 323.

The operation and functions of the high voltage detection circuit 52 in FIG. 26 will now be described in outline. An output terminal voltage VS (target voltage) that varies between positive and negative polarities relative to the ground is applied to the output terminal line LN_VS. Its variation is transmitted via the bootstrap capacitor CB to the boot voltage line LN_VB. It is here assumed that, in the steady state, the differential voltage (VB−VS) is 18 V and the output terminal voltage VS varies in the voltage range between −100 V and 600 V. At least in the both-off period $P_{DD1}$, the absolute value (100 V) of the negative output terminal voltage VS is higher than the differential voltage (VB−VS) in the steady state. Accordingly, like the output terminal voltage VS, the boot voltage VB varies between positive and negative polarities relative to the ground.

As a result, a current corresponding to the output terminal voltage VS may pass across the current path CP_pgnd in FIG. 27 and, if the transistor 312 is on, the current mirror circuit 310 so acts that a current corresponding to the current across the current path CP_pgnd passes across the current path CP_pvs. Whether a current passes across the current path CP_pgnd and, if so, the magnitude and direction of that current depend on the output terminal voltage VS.

A detection signal generation circuit 320 provided in the high voltage detection circuit 52 generates and outputs the high voltage detection signal Sig_p1 based on the current in the current path CP_pvs. Specifically, for example, the detection signal generation circuit 320 generates and outputs the high voltage detection signal Sig_p1 by converting the current in the current path CP_pvs into a voltage relative to the potential on the output terminal line LN_VS. Note that the current in the current path CP_pvs can pass via the channels of the MOSFETs along the current path CP_pvs or via the parasitic diodes of the MOSFETs along the current path CP_pvs.

A detection signal generation circuit 330 provided in the high voltage detection circuit 52 generates and outputs the high voltage detection signal Sig_p2 based on the current in the current path CP_pgnd. Specifically, for example, the detection signal generation circuit 330 generates and outputs the high voltage detection signal Sig_p2 by converting the current in the current path CP_pgnd into a voltage relative to the ground potential. Note that the current in the current path CP_pgnd can pass via the channels of the MOSFETs along the current path CP_pgnd or via the parasitic diodes of the MOSFETs along the current path CP_pgnd.

The detection signal generation circuit 320 can be understood to be constituted by the resistors 321 and 322 and the transistors 323 to 327. Of these components, the resistors 321 and 322 constitute a first resistor unit that is provided in series with the transistor 311 and that is inserted between a node p1_pre and the output terminal line LN_VS. The transistors 324 to 327 constitute a first binarizing circuit that generates the detection signal Sig_p1 by binarizing the voltage at the node p1_pre relative to the potential on the output terminal line LN_VS. The gate of the transistor 323 is fed with the negative voltage detection signal Sig_n1 fed from the negative voltage detection circuit 51. The transistor 323 functions as an adjustment circuit that adjusts the resistance value between the node p1_pre and the output terminal line LN_VS. The significance of this adjustment will be described later.

The detection signal generation circuit 330 can be understood to be constituted by the resistors 332 and 333 and the transistors 331 and 334 to 338. Of these components, the resistor 332 constitutes a second resistor unit that is provided in series with the transistor 312 and that is inserted between a node p2_pre and the ground line LN_GND. The resistor 333 and the transistors 334, 337, and 338 constitute a second binarizing circuit that generates the detection signal Sig_p2 by binarizing the voltage at the node p2_pre relative to the potential on the ground line LN_GND.

In accordance with the output terminal voltage VS, the detection signals Sig_p1 and Sig_p2 are generated simultaneously such that if the detection signal Sig_p1 is at low level ("0") the detection signal Sig_p2 too is at low level ("0") and that if the detection signal Sig_p1 is at high level ("1") the detection signal Sig_p2 too is at high level ("1") (there can be a very small time lag).

The transistor 335 is provided to prevent the voltage at the node p2_pre from rising excessively in the process of the output terminal voltage VS rising from about 0 V toward the supply voltage VP, and this suppresses an excessive rise in the gate potential of the transistor 334. The transistor 336 is provided to prevent the voltage at the node p2_pre from falling excessively when the output terminal voltage VS is negative (e.g., −100V), and this suppresses an excessive fall in the gate potential of the transistor 334.

The interconnections among the circuit elements shown in FIG. 26 will now be described. The sources of the transistors 311 and 312 are connected to the boot voltage line LN_VB. The gates of the transistors 311, 312, and 352 are connected together. The gates of the transistors 311, 312, and 352 are connected via the resistor 351 to the boot voltage line LN_VB. The drain of the transistor 312 is connected to the source of the transistor 352. In the transistor 352, the drain and the gate are short-circuited together. The drain of the transistor 352 is connected via the current limiter 340 to the drain of the transistor 331. In the example in FIG. 26, the current limiter 340 is configured with a series circuit of a plurality of Zener diodes and a plurality of resistors, with one terminal of the series circuit connected to the drain of the transistor 352 and the other terminal of the series circuit connected to the drain of the transistor 331. In each Zener diode in the current limiter 340, the direction pointing from the anode to cathode coincides with the direction pointing from the drain of the transistor 331 to the drain of the transistor 352.

The gate of the transistor 331 is connected to the control supply line LN_VCC. The source of the transistor 331 is connected to the node p2_pre. The node p2_pre is connected via the resistor 332 to the ground line LN_GND. The source and the gate of the transistor 335, one terminal of the resistor 333, and the source of the transistor 337 are connected to the control supply line LN_VCC. The other terminal of the resistor 333 is connected to the drain of the transistor 334 and to the gates of the transistors 337 and 338. The drains of the transistors 335 and 336 and the gate of the transistor 334 are connected to the node p2_pre. The gate and the source of the transistor 336 and the sources of the transistors 334 and 338 are connected to the ground line LN_GND. The drains of the transistors 337 and 338 are connected together at a node p2.

The drain of the transistor 311 is connected to the node p1_pre. One terminal of the resistor 321 is connected to the node p1_pre, and the other terminal of the resistor 321 is connected to one terminal of the resistor 322 and to the drain of the transistor 323. The other terminal of the resistor 322 and the source of the transistor 323 are connected to the output terminal line LN_VS. The sources of the transistors 324 and 326 are connected to the boot voltage line LN_VB. The gates of the transistors 324 and 325 are connected to the node p1_pre. The drains of the transistors 324 and 325 and the gates of the transistors 326 and 327 are connected together. The drains of the transistors 326 and 327 are connected together at a node p1. The sources of the transistors 325 and 327 are connected to the output terminal line LN_VS.

The signal that appears at the node p1 is the high voltage detection signal Sig_p1. The transistors 324 and 325 constitute a first inverter circuit, and the transistors 326 and 327 constitute a second inverter circuit. The output signal of the first inverter circuit (324, 325) is the input signal to the second inverter circuit (326, 327). The series circuit of the first and second inverter circuits (324 to 327) generates at the node p1 the high voltage detection signal Sig_p1 corresponding to the voltage at the node p1_pre. The resistors 321 and 322 and the transistor 323 constitute an inverter gate signal generation circuit that generates a gate signal to the first inverter circuit (324, 325).

The signal that appears at the node p2 is the high voltage detection signal Sig_p2. The circuit (second binarizing circuit) constituted by the resistor 333 and the transistors 334, 337, and 338 generates at the node p2 the high voltage detection signal Sig_p2 corresponding to the voltage at the node p2_pre.

With respect to the potentials (voltage levels) at the nodes p1_pre and p2_pre, high and low levels are defined as follows.

If the potential at the node p1_pre is high level, the transistor 324 is off and the transistor 325 is on, so that the output terminal voltage VS appears at the drains of the transistors 324 and 325; thus, the transistor 326 is on and the transistor 327 is off, so the signal Sig_p1 is at high level.

If the potential at the node p1_pre is low level, the transistor 324 is on and the transistor 325 is off, so that the boot voltage VB appears at the drains of the transistors 324 and 325; thus, the transistor 326 is off and the transistor 327 is on, so the signal Sig_p1 is at low level.

If the potential at the node p2_pre is high level, the transistor 334 is on, so that the transistor 337 is on and the transistor 338 is off; thus, the signal Sig_p2 is at high level.

If the potential at the node p2_pre is low level, the transistor 334 is off, so that the transistor 337 is off and the transistor 338 is on; thus, the signal Sig_p2 at low level.

Figure 28:
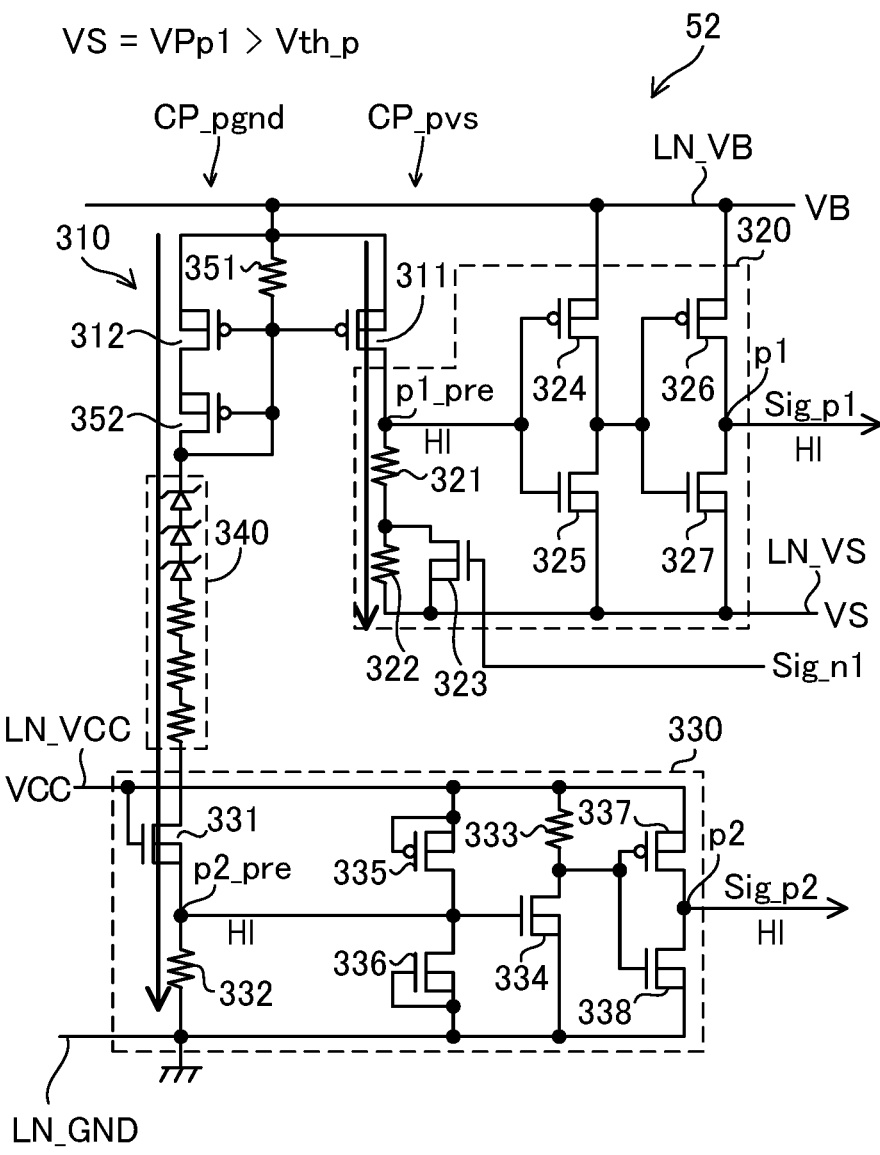
FIG. 28 is a diagram illustrating a static state of the high voltage detection circuit in connection with the third embodiment of the present disclosure.
Figure 29:
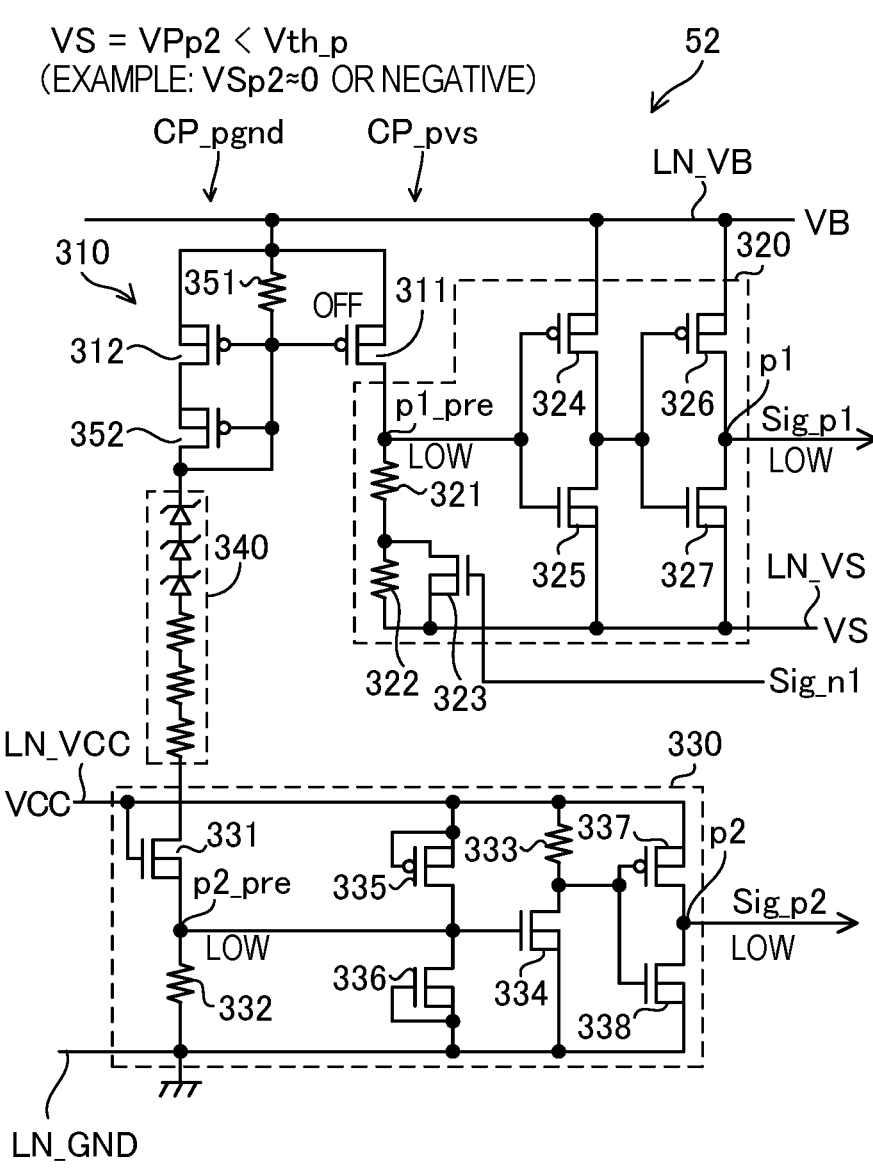
FIG. 29 is a diagram illustrating a static state of the high voltage detection circuit in connection with the third embodiment of the present disclosure.

With reference to FIGS. 28 and 29, the static operation of the high voltage detection circuit 52 will be described.

FIG. 28 shows the state of the high voltage detection circuit 52 as observed if the output terminal voltage VS is stably equal to a predetermined voltage VSp1 higher than the threshold voltage Vth_p. In the state in FIG. 28, the transistor 312 is on and a current passes from the boot voltage line LN_VB to the ground line LN_GND. Thus, the node p2_pre is at high level and the detection signal Sig_p2 is at high level. Moreover, in the state in FIG. 28, a drain current corresponding to the drain current through the transistor 312 passes through the transistor 311, and the node p1_pre is at high level; thus the detection signal Sig_p1 is at high level.

FIG. 29 shows the state of the high voltage detection circuit 52 as observed if the output terminal voltage VS is stably equal to a predetermined voltage VSp2 lower than the threshold voltage Vth_p. The voltage VSp2, for example, is 0 V or has a negative polarity. In the state in FIG. 29, a current corresponding to the value of the voltage VSp2 may or may not pass from the ground line LN_GND toward the boot voltage line LN_VB but no current passes at least from the boot voltage line LN_VB toward the ground line LN_GND. Accordingly, in the state in FIG. 29, the node p2_pre is at low level, and thus the detection signal Sig_p2 is at low level. In the state in FIG. 29, the transistor 312 is off and thus the transistor 311 too is off. Accordingly, in the state in FIG. 29, the node p2_pre is at low level, and thus the detection signal Sig_p1 is at low level.

The high voltage detection circuit 52 is a circuit that switches the high voltage detection signals (Sig_p1, Sig_p2) between high and low levels in accordance with the magnitude relationship between the output terminal voltage VS and the threshold voltage Vth_p. Here, the threshold voltage Vth_p can be understood to lie within a predetermined voltage width. Under this understanding, the voltage VSp1 is higher than the upper limit of the voltage width of the threshold voltage Vth_p, and the voltage VSp2 is lower than the lower limit of the voltage width of the threshold voltage Vth_p. If the output terminal voltage VS lies within the voltage width of the threshold voltage Vth_p, the high voltage detection signals (Sig_p1, Sig_p2) may have a medium potential that is not determined as either high or low level. This however does not pose a notable problem because, in the semiconductor device 1, the magnitude relationship between the output terminal voltage VS and the threshold voltage Vth_p switches quickly as the output terminal voltage VS varies.

Figure 30:
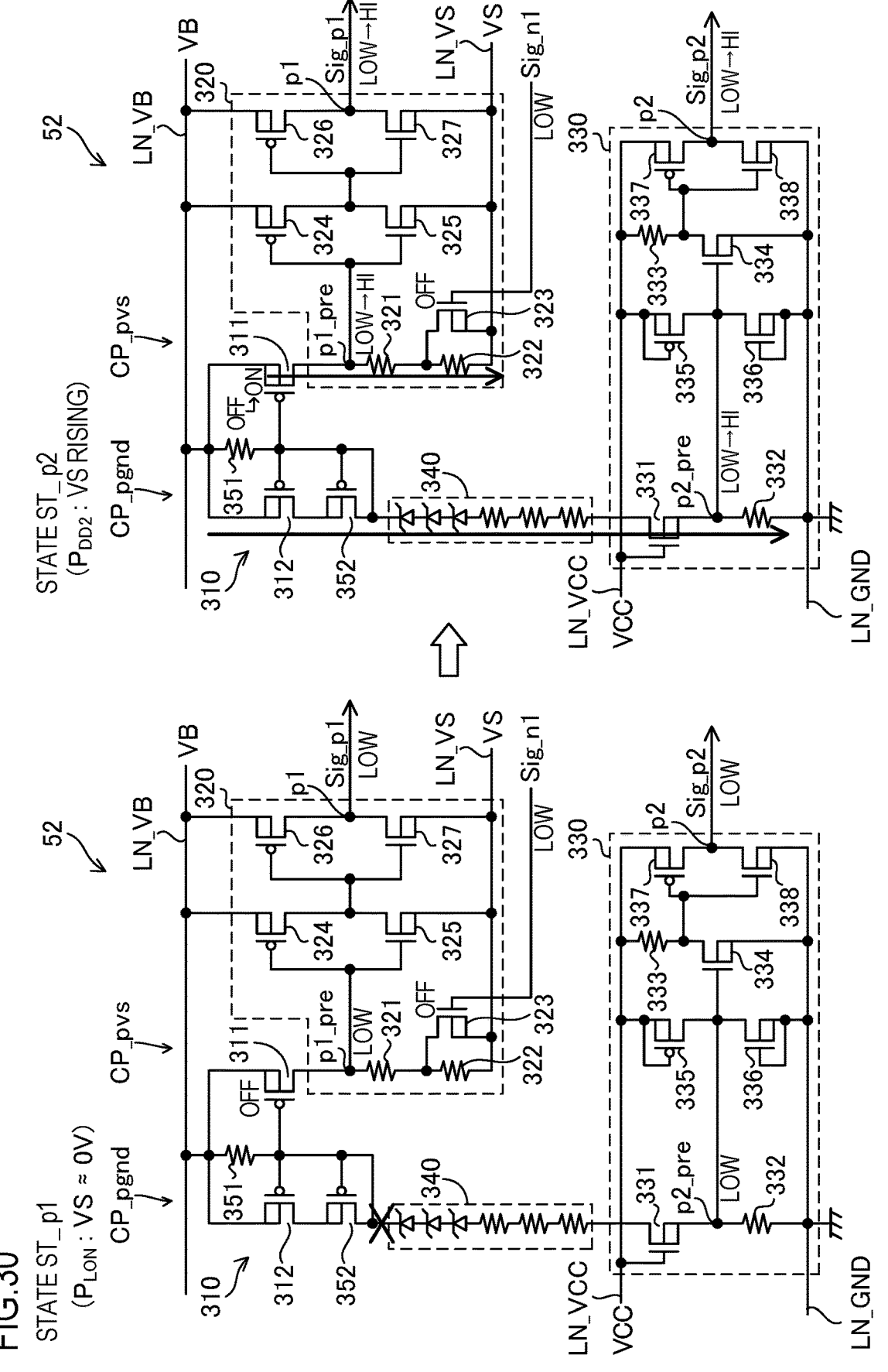
FIG. 30 is a diagram illustrating a state transition of the high voltage detection circuit in connection with the third embodiment of the present disclosure.
Figure 31:
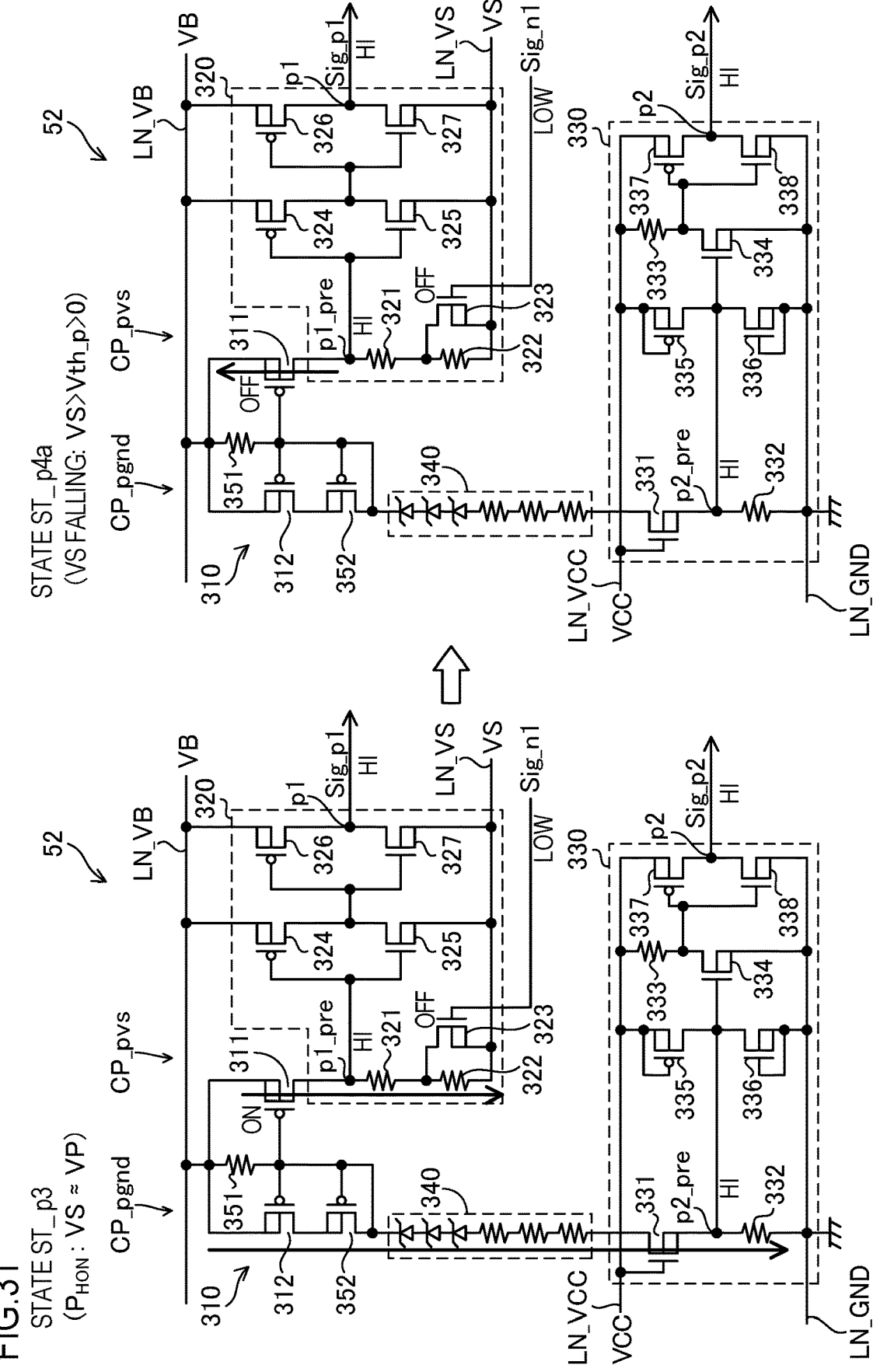
FIG. 31 is a diagram illustrating a state transition of the high voltage detection circuit in connection with the third embodiment of the present disclosure.
Figure 32:
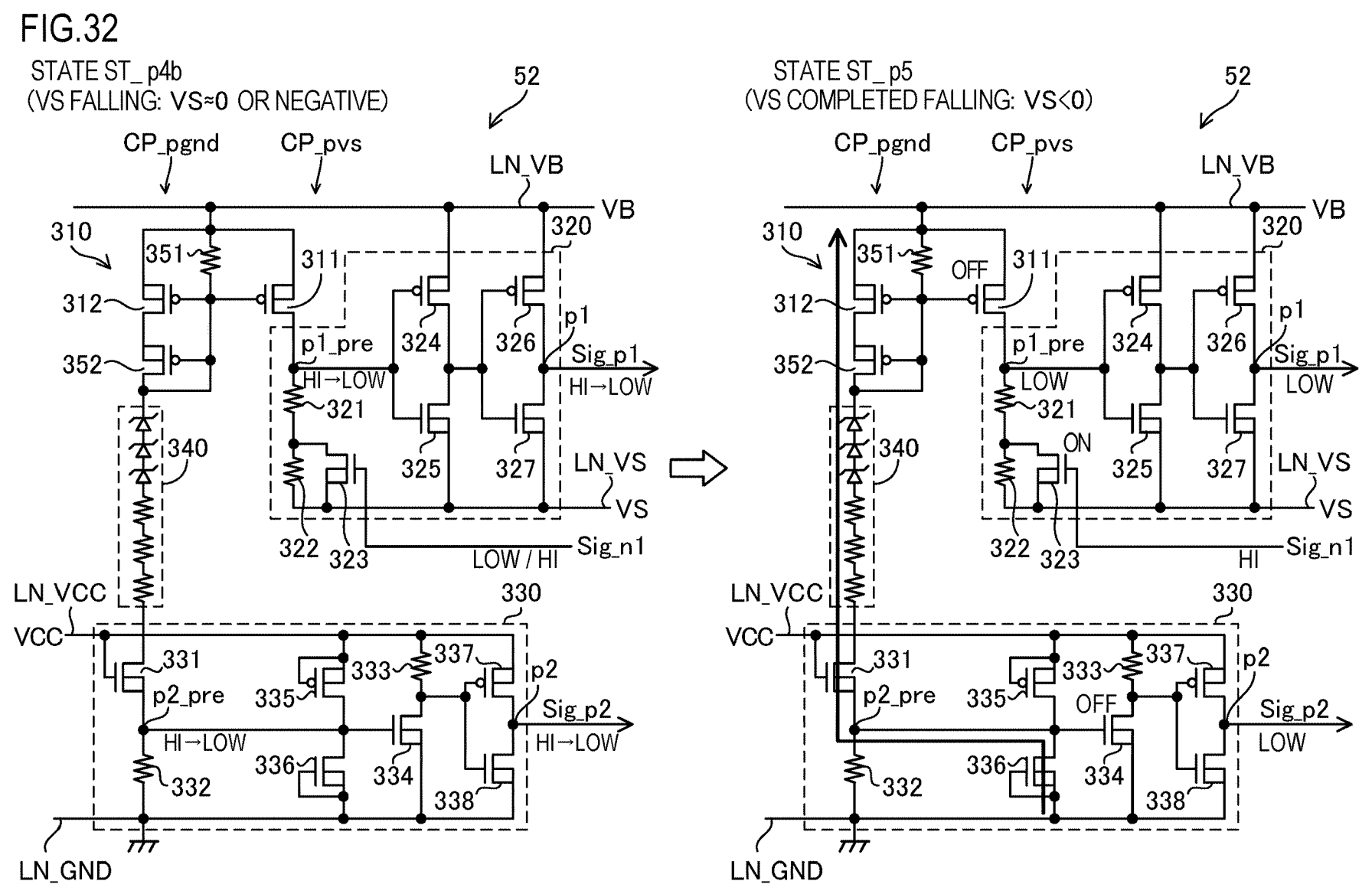

Next, with reference to FIGS. 30 to 32, the dynamic operation of the high voltage detection circuit 52 as observed as the output terminal voltage VS varies will be described in detail. FIGS. 30 to 32 show a total of six states ST_p1, ST_p2, ST_p3, ST_p4*a*, ST_p4*b*, and ST_p5. It is here assumed that these six states are all those observed with the differential voltage (VB–VS) stabilized around the threshold voltage Vth_dff. State ST_p1 shown at left in FIG. 30 is taken as the starting state; then the states occur in the order ST_p1, ST_p2, ST_p3, ST_p4*a*, ST_p4*b*, and ST_p5, then returning to state ST_p1 to repeat the sequence.

The period in which the high voltage detection circuit 52 is in state ST_p1 can be understood as a first period, and the period in which the high voltage detection circuit 52 is in state ST_p4*a* or ST_p4*b* can be understood as a fourth period. Likewise, the periods in which the high voltage detection circuit 52 is in states ST_p2, ST_p3, and ST_p5 can be understood as a second, a third, and a fifth period respectively. With these periods understood in this way with focus on the high voltage detection circuit 52, in the semiconductor device 1, a sequence of transitions from the first period through the second, third, and fourth periods to the fifth period and then back to the first period is repeated.

Note that, in the process of the output terminal voltage VS varying, the operation of the high voltage detection circuit 52 exhibits a transient response. As a result of the transient response, there may occur, in the process of the output terminal voltage VS rising, a time lag between the timing of a switch from VS<Vth_p to VS>Vth_p and the timing of a switch of the levels of the high voltage detection signals Sig_p1 and Sig_p2 from low level ("0") to high level ("1"). Likewise, there may occur, in the process of the output terminal voltage VS falling, a time lag between the timing of a switch from VS>Vth_p to VS<Vth_p and the timing of a switch of the levels of the high voltage detection signals Sig_p1 and Sig_p2 from high level ("1") to low level ("0"). Now, the states shown in FIG. 30 to 32 will be described one by one.

State ST_p1 (at left in FIG. 30) corresponds to a state where, in the low-side-on period $P_{LON}$, the output terminal voltage VS is substantially equal to 0 V (particular voltage). In state ST_p1, the boot voltage VB has a voltage value (e.g., 18 V) higher than the output terminal voltage VS by the voltage across the bootstrap capacitor CB, but owing to the Zener diodes in the current limiter 340 no current from the boot voltage line LN_VB toward the ground line LN_GND occurs in the current path CP_pgnd. That is, in state ST_p1, the current limiter 340 suppresses occurrence of a current in the current path CP_pgnd. As a result, the discharging of the bootstrap capacitor CB in state ST_p1 is suppressed.

In state ST_p1, since no current occurs in the current path CP_pgnd, the node p2_pre is at low level, and thus the detection signal Sig_p2 is at low level. Moreover, in state ST_p1, the transistor 311 is off, and thus the node p1_pre is at low level; hence the detection signal Sig_p1 too is at low level. Note that, in state ST_p1, the negative voltage detection signal Sig_n1 is at low level and thus the transistor 323 is off.

State ST_p2 (at right in FIG. 30) is a state where, as a result of the transition from the low-side-on period $P_{LON}$ to the both-off period $P_{DD2}$, the output terminal voltage VS is in the process of rising from the ground level In state ST_p2, as the output terminal voltage VS rises, a current from the boot voltage line LN_VB toward the ground line LN_GND starts to pass across the current path CP_pgnd. That is, a current starts to pass from the boot voltage line LN_VB via the transistors 312 and 352, the current limiter 340, the transistor 331, and the resistor 332 toward the ground line LN_GND. Based on this current, in state ST_p2, the potential at the node p2_pre switches from low level to high level, and thus the detection signal Sig_p2 too switches from low level to high level.

Moreover, in state ST_p2, the current in the current path CP_pgnd passes through the channel of the transistor 312. In state ST_p2, in coordination with a current passing through the transistor 312, the transistor 311 too is on, and a current passes across the current path CP_pvs. That is, a current passes from the boot voltage line LN_VB via the transistor 311 and the inverter gate signal generation circuit (321 to 323) toward the output terminal line LN_VS. Accordingly, in the process of the output terminal voltage VS rising in state ST_p2, the potential at the node p1_pre switches from low level to high level, and the detection signal Sig_p1 too switches from low level to high level. The negative voltage detection signal Sig_n1 fed to the gate of the transistor 323 continues to be at low level from state ST_p1 into state ST_p2, and thus, in state ST_p2, the transistor 323 is off.

While the up edge in the signal Sig_p1 and the up edge in the signal Sig_p2 do not always occur at completely the same timing, those up edges do occur at substantially the same timing (the circuit constants and the characteristics of the circuit elements are determined so as to achieve that).

If, for the sake of argument, the transistor 335 is not provided, in the process of the output terminal voltage VS rising from the ground level to the level of the supply voltage VP (e.g., 600 V), the potential at the node p2_pre may rise excessively (e.g., it may rise momentarily to about 200 V) under the influence of the drain-source capacitance of the transistor 331 and the like. Providing the transistor 335 suppresses such an excessive rise and protects transistor 334.

State ST_p3 (at left in FIG. 31) is a state in the high-side-on period $P_{HON}$ and corresponds to a state where the output terminal voltage VS is substantially equal to the supply voltage VP. After in state ST_p2 a current starts to pass across the current path CP_pgnd, in state ST_p3 the current continues to pass across the current path CP_pgnd. That is, in state ST_p3, a current passes from the boot voltage line LN_VB via the transistors 312 and 352, the current limiter 340, the transistor 331, and the resistor 332 toward the ground line LN_GND. The current that passes across the current path CP_pgnd keeps the potential at the node p2_pre at high level, and thus, in state ST_p3, the detection signal Sig_p2 is at high level. Providing the Zener diodes and the resistors in the current limiter 340 makes it possible to limit the current across the current path CP_pgnd in state ST_p3, and thus to determine the current value in the current path CP_pgnd in state ST_p3 through the setting of the number of Zener diodes connected in series and the like.

Moreover, in state ST_p3, in coordination with the transistor 312 being on, the transistor 311 too is on, and thus a current passes across the current path CP_pvs. That is, in state ST_p3, a current passes from the boot voltage line LN_VB via the transistor 311 and the inverter gate signal generation circuit (321 to 323) toward the output terminal line LN_VS. The current that passes across the current path CP_pvs keeps the potential at the node p1_pre at high level, and thus, in state ST_p3, the detection signal Sig_p1 too is at high level. The negative voltage detection signal Sig_n1 fed to the gate of the transistor 323 continues to be at low level from state ST_p2 into state ST_p3, and thus, in state ST_p3 the transistor 323 is off.

State ST_p4a (at right in FIG. 31) is a state where, as a result of the transition from the high-side-on period $P_{HON}$ to the both-off period $P_{DD1}$, the output terminal voltage VS is in the process of falling from the level of the supply voltage VP. It is here assumed that, in state ST_p4a, the output terminal voltage VS is higher than the threshold voltage Vth_p (>0) for the high voltage detection circuit 52.

In state ST_p4a, as the boot voltage VB falls, the discharging of the stored electric charges in the capacitive components that accompany the current path CP_pgnd proceeds. Meanwhile, depending on the progress of the discharging, whether the transistor 312 is on or off is indefinite. If, for the sake of argument, the discharging of the stored electric charges proceeds from the boot voltage line LN_VB toward the ground line LN_GND, the transistor 312 is on; if it proceeds in the opposite direction, the transistor 312 is off. In either case, in state ST_p4a, as a result of a current passing from the node p2_pre toward the ground, or as a result of the stored electric charge in the gate capacitance of the transistor 334 not being fully discharged, the transistor 334 is held on continuously from state ST_p3, and thus the signal Sig_p2 is at high level.

In state ST_p4a, the discharging of the stored electric charges in the gate capacitances in the first inverter circuit (324, 325) proceeds. The discharging can take place across two possible paths: one via the parasitic capacitance of the transistor 311 and another via the inverter gate signal generation circuit (321 to 323). In the high voltage detection circuit 52 in state ST_p4a shown at right in FIG. 31, the passage of the current across the former path is indicated expressly. Here, owing to a comparatively high resistance values of the resistors 321 and 322, discharging across the former path is dominant; hence the potential at the node p1_pre is high level, and thus the signal Sig_p1 is at high level. The negative voltage detection signal Sig_n1 fed to the gate of the transistor 323 continues to be at low level from state ST_p3 into state ST_p4a, and thus, in state ST_p4a, the transistor 323 is off.

Like state ST_p4a, state ST_p4b (at left in FIG. 32) too is a state where, as a result of the transition from the high-side-on period $P_{HON}$ to the both-off period $P_{DD1}$, the output terminal voltage VS is in the process of falling from the level of the supply voltage VP toward a negative voltage. In state ST_p4b, however, the output terminal voltage VS falls further than in state ST_p4a, and thus the output terminal voltage VS is supposed to be around 0 V or a negative voltage close to 0 V.

When the output terminal voltage VS is around 0 V, the boot voltage has a voltage value around the control supply voltage VCC (e.g., 18 V). However, in state ST_p4b, owing to the Zener diodes in the current limiter 340, no current from the boot voltage line LN_VB toward the ground line LN_GND occurs in the current path CP_pgnd. Moreover, as a result of the discharging of the stored electric charge in the gate capacitance of the transistor 334 that occurs continuously from state ST_p4a, in state ST_p4b the potential at the node p2_pre switches from high level to low level, and in coordination with that, the detection signal Sig_p2 too switches from high level to low level.

In state ST_p4b, the transistor 311 is off continuously from state ST_p4a. However, as a result of the discharging of the stored electric charge in the gate capacitance in the first inverter circuit (324, 325) that occurs continuously from state ST_p4a, in state ST_p4b the potential at the node p1_pre switches from high level to low level, and in coordination with that, the high voltage detection signal Sig_p1 too switches from high level to low level. In the process of the output terminal voltage VS falling, when the negative voltage detection signal Sig_n1 switches from low level to high level, the transistor 323 turns on.

While the down edge in the signal Sig_p1 and the down edge in the signal Sig_p2 do not always occur at completely the same timing, those up edges do occur at substantially the same timing (the circuit constants and the characteristics of the circuit elements are determined so as to achieve that).

State ST_p5 (at right in FIG. 32) is a state where, through the transition from the high-side-on period $P_{HON}$ to the both-off period $P_{DD1}$, the output terminal voltage VS has finished falling and, now in the both-off period $P_{DD1}$, the output terminal voltage VS has its lowest potential. The lowest potential of the output terminal voltage VS has a negative polarity, and in state ST_p5 the output terminal voltage VS is, for example, –100 V.

In state ST_p5, the potential of the boot voltage VB is sufficiently lower than the ground potential, and a current passes across the current path CP_pgnd from the ground line LN_GND toward the boot voltage line LN_VB via the parasitic diode of the transistor 336 and the current limiter 340. Thus, in state ST_p5, the potential at the node p2_pre is lower than the ground potential, with the result that the transistor 334 is off and the signal Sig_p2 is at low level. Owing to the transistor 336, the voltage at the node p2_pre is prevented from falling excessively, and this protects the transistor 334.

Moreover, owing to the resistors provided the current limiter 340, the current across the current path CP_pgnd in state ST_p5 is kept low. That is, the current from the ground line LN_GND toward the boot voltage line LN_VB (which can be called a reverse current) is suppressed.

When the output terminal voltage VS has a negative polarity, the transistor 312 is off and, if the transistor 312 is off, the transistor 311 too is off. Thus, in state ST_p5, the transistor 311 is off. Already in state ST_p4b (at right in FIG. 32), the discharging of the gate capacitances in the first inverter circuit (324, 325) has been complete and the potential at the node p1_pre has turned to low level, and also in state ST_p5, the potential at the node p1_pre is kept to be low level. Accordingly, in state ST_p5, the signal Sig_p1 is at low level. Note that, in state ST_p5, the negative voltage detection signal Sig_n1 is at high level and thus the transistor 323 is on.

After state ST_p5, a transition to state ST_p1 corresponding to the low-side-on period $P_{LON}$ takes place, and after the transition to state ST_p1, the transistor 323 is off. Turning off the transistor 323 results in a higher resistance value between the node p1_pre and the output terminal line LN_VS. However, already in state ST_p5, the discharging of the gate capacitances in the first inverter circuit (324, 325) has been sufficiently complete and the potential at the node p1_pre is low level, and thus also in state ST_p1 after state ST_p5, the potential at the node p1_pre is kept to be low level.

In a period in which the detection signal Sig_p1 should be at high level, the resistance value between the node p1_pre and the output terminal line LN_VS has to be raised to a certain degree so that the drain current through the transistor 311 keeps the potential at the node p1_pre at high level. On the other hand, in the process of the output terminal voltage VS falling from the level of the supply voltage VP to a negative level, the stored electric charges in the gate capacitances in the first inverter circuit (324, 325) has to be discharged quickly to produce a down edge in the detection signal Sig_p L.

With this taken into consideration, the transistor 323 is provided. In the process of the output terminal voltage VS falling from the level of the supply voltage VP toward a negative level (in the period corresponding to states ST_p4a and ST_p4b), turning on the transistor 323 results in quick discharging of the stored electric charges in the gate capacitances in the first inverter circuit (324, 325), and this permits a proper down edge to be produced in the high voltage detection signal Sig_p1.

The detection signal generation circuit 320 can be said to include an adjustment circuit (323) that adjusts the resistance value between the node p1_pre and the output terminal line LN_VS so as to vary the resistance value between the node p1_pre and the output terminal line LN_VS according to whether the output terminal voltage VS has a negative polarity (more specifically, whether it is lower than the negative threshold voltage Vth_n). The detection signal generation circuit 320 has the function of reducing the resistance value between the node p1_pre and the output terminal line LN_VS if the output terminal voltage VS has a negative polarity as compared with if the output terminal voltage VS has a positive polarity.

Figure 33:
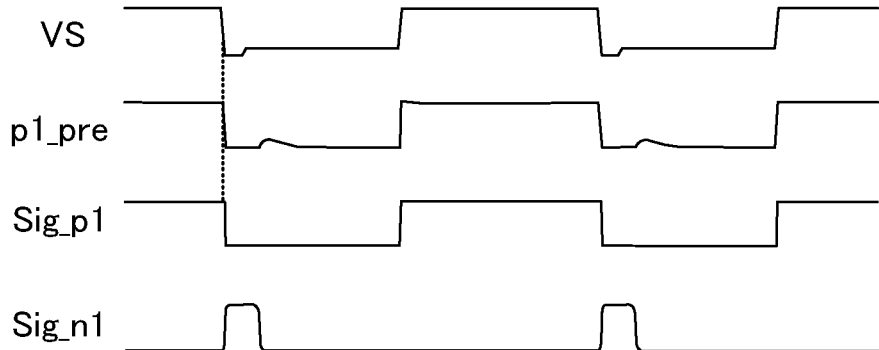
FIG. 33 is a diagram schematically showing an outline of the waveforms of some signals associated with the high voltage detection circuit in connection with the third embodiment of the present disclosure.
Figure 34:
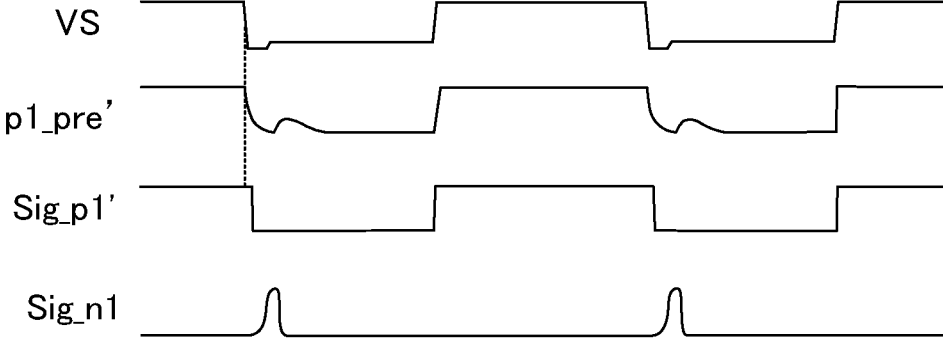
FIG. 34 is a diagram schematically showing an outline of the waveforms of some signals associated with an imaginary high voltage detection circuit in connection with the third embodiment of the present disclosure.

With reference to FIGS. 33 and 34, a description will be given of the workings and effects of using the negative voltage detection signal Sig_n1 in the high voltage detection circuit 52. FIG. 33 schematically shows an outline of the waveforms of some signals associated with the high voltage detection circuit 52. FIG. 34 schematically shows an outline of the waveforms of some signals associated with an imaginary high voltage detection circuit. FIG. 33 assumes that the high voltage detection circuit 52 includes the transistor 323 and that the transistor 323 is turned on and off based on the signal Sig_n1. The imaginary high voltage detection circuit is configured like the high voltage detection circuit 52 except that transistor 323 is omitted. For convenience' sake, the node p1_pre in the imaginary high voltage detection circuit will be identified by p1_pre' and the high voltage detection signal Sig_p1 in the imaginary high voltage detection circuit will be identified by Sig_p1'. The example of waveforms in FIG. 34 assumes that the imaginary high voltage detection circuit is used in combination with the imaginary negative voltage detection circuit described in connection with the second embodiment.

From the example of waveforms in FIG. 33, it is understood that, in the process of the output terminal voltage VS falling over the transition from the high-side-on period $P_{HON}$ to the both-off period $P_{DD1}$, as a result of the transistor 323 turning on, the electric charge at the node p1_pre is discharged quickly and the signal Sig_p1 switches to low level quickly. By contrast, in the example of waveforms in FIG. 34 associated with the imaginary high voltage detection circuit, the constantly high resistance value at the node p1_pre' results in low discharge speed of the electric charge at the node p1_pre' in the process of the output terminal voltage VS falling. It is understood that, as a result, the transition of the high voltage detection signal (Sig_p1') to low level is delayed.

When as a result of the transition from the high-side-on period $P_{HON}$ to the both-off period $P_{DD1}$ the output terminal voltage VS has a negative polarity, turning on the transistor M1 makes it possible to charge the bootstrap capacitor CB with a high charge current IB (see FIG. 12). The delay in the transition of the high voltage detection signal to low level resulting from the transition from the high-side-on period $P_{HON}$ to the both-off period $P_{DD1}$ results in a reduction in the charging time of the bootstrap capacitor CB based on the negative output terminal voltage VS (a delay in the charge start timing). Providing the transistor 323 helps suppress such a delay.

A third embodiment includes Practical Examples EX3_1 to EX3_3 as described below.

Practical Example EX3_1

Figure 35:
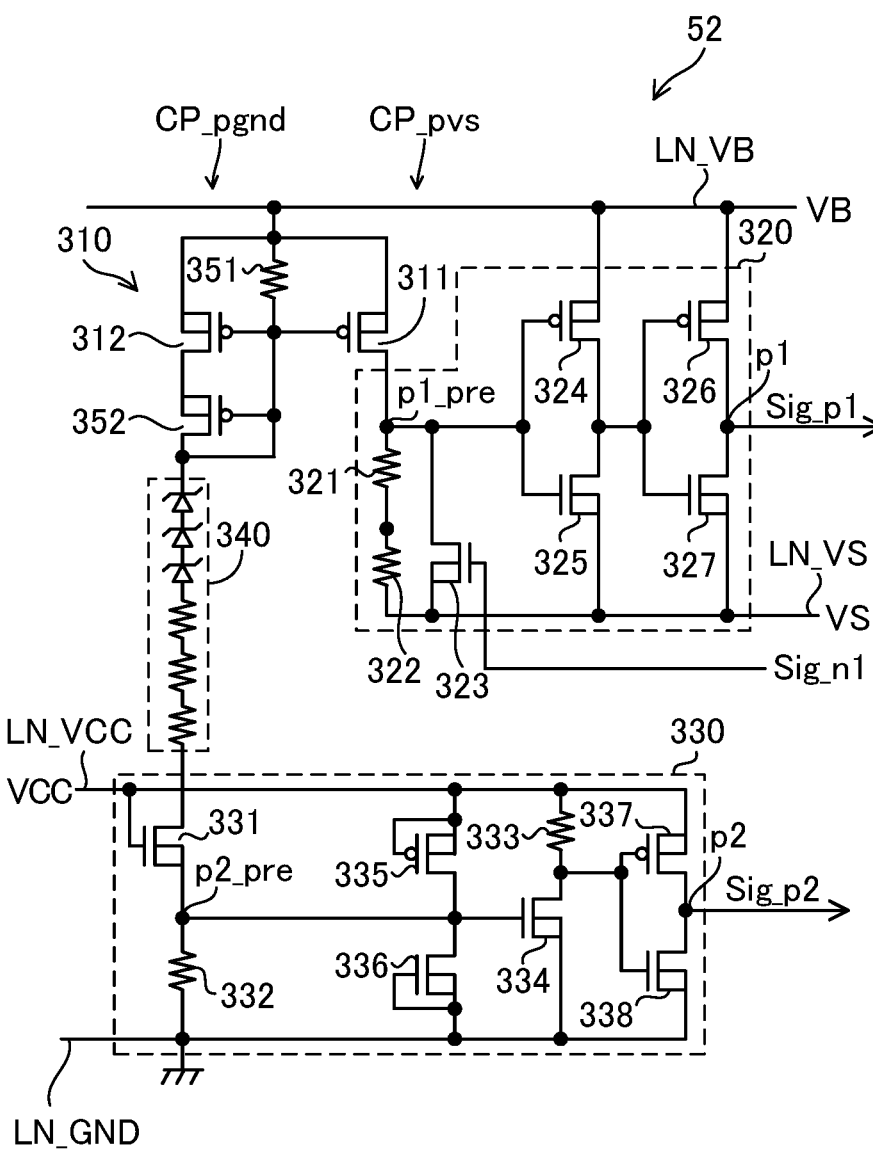
FIG. 35 is a diagram showing a modified configuration of the high voltage detection circuit in connection with the third embodiment of the present disclosure.

In the process of the output terminal voltage VS falling from the supply voltage VP, if a faster fall in the potential at the node p1_pre is desired, the high voltage detection circuit 52 shown in FIG. 26 can be modified as shown in FIG. 35, where the drain of the transistor 323 is connected directly to the node p1_pre.

Practical Example EX3_2

Figure 36:
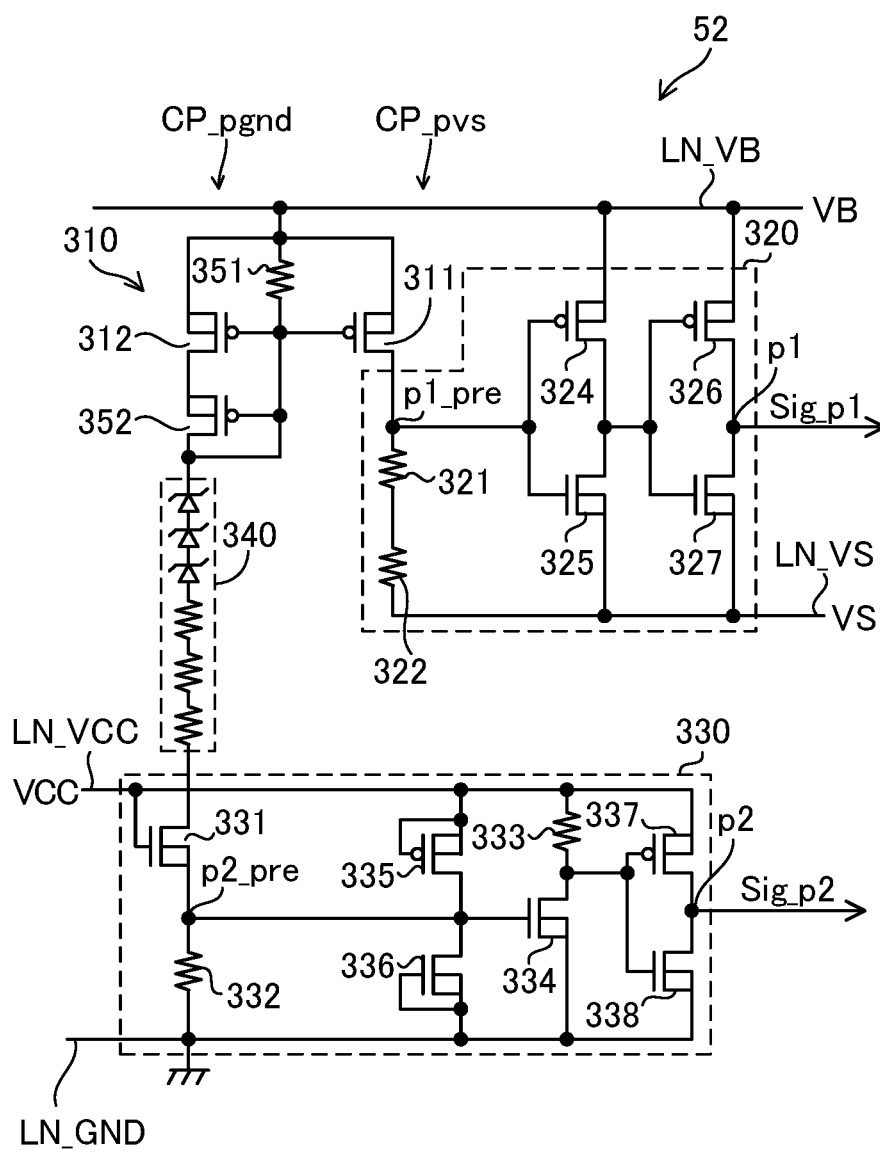
FIG. 36 is a diagram showing another modified configuration of the high voltage detection circuit in connection with the third embodiment of the present disclosure.

Depending on the speed or width of variation of the output terminal voltage VS, the gate capacitances in the inverter circuit (324, 325), or like, even without the transistor 323, the high voltage detection signal Sig_p1 may not exhibit so large a delay as to pose a problem. In such a case, the high voltage detection circuit 52 may be modified as shown in FIG. 36, where the transistor 323 is omitted.

Practical Example EX3_3

The high voltage detection circuit 52 described in connection with the third embodiment can be applied not only to the semiconductor device 1 configured as shown in FIG. 1 but to any device that requires a plurality of high voltage detection signals relative to different potentials.

Fourth Embodiment

A fourth embodiment of the present disclosure will be described. The fourth embodiment deals with an example of the configuration of the charge pump circuits 41 and 42 in FIG. 6. In the following description, a charge pump circuit is occasionally referred to as a CP circuit.

Figure 37:
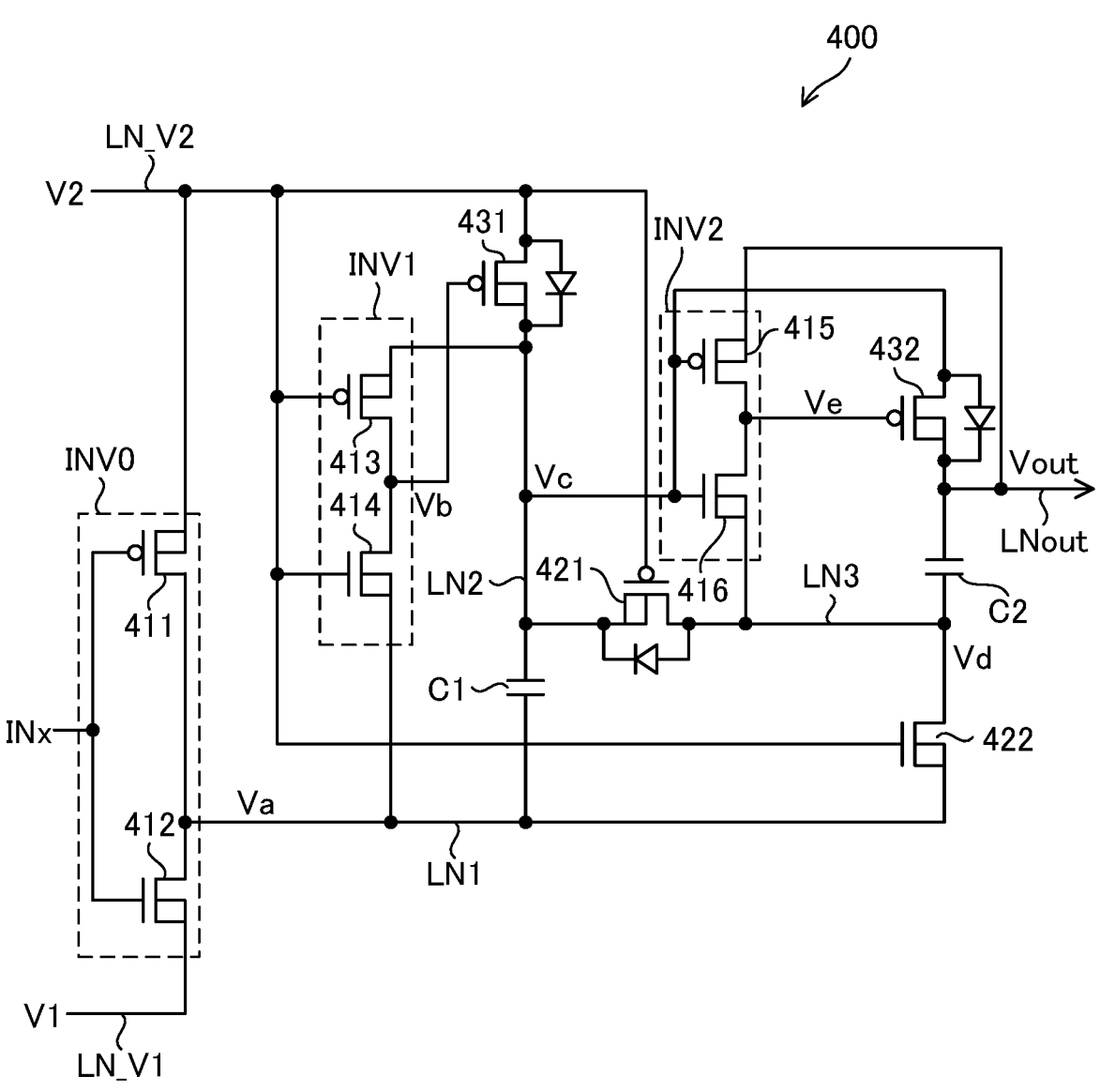
FIG. 37 is a circuit diagram of a charge pump circuit in connection with a fourth embodiment of the present disclosure.

FIG. 37 shows a circuit diagram of a CP circuit 400 according to the fourth embodiment. The CP circuit 400 receives voltages V1 and V2 and a control signal INx and can perform charge pump operation according to the control signal INx. The voltage V2 is higher than the voltage V1. In the charge pump operation, the CP circuit 400 produces, on an output line LNout, a boosted voltage higher than the voltage V2 based on the voltage V2 relative to the voltage V1. The voltage applied to the output line LNout will be referred to as the output voltage Vout.

Figure 38:
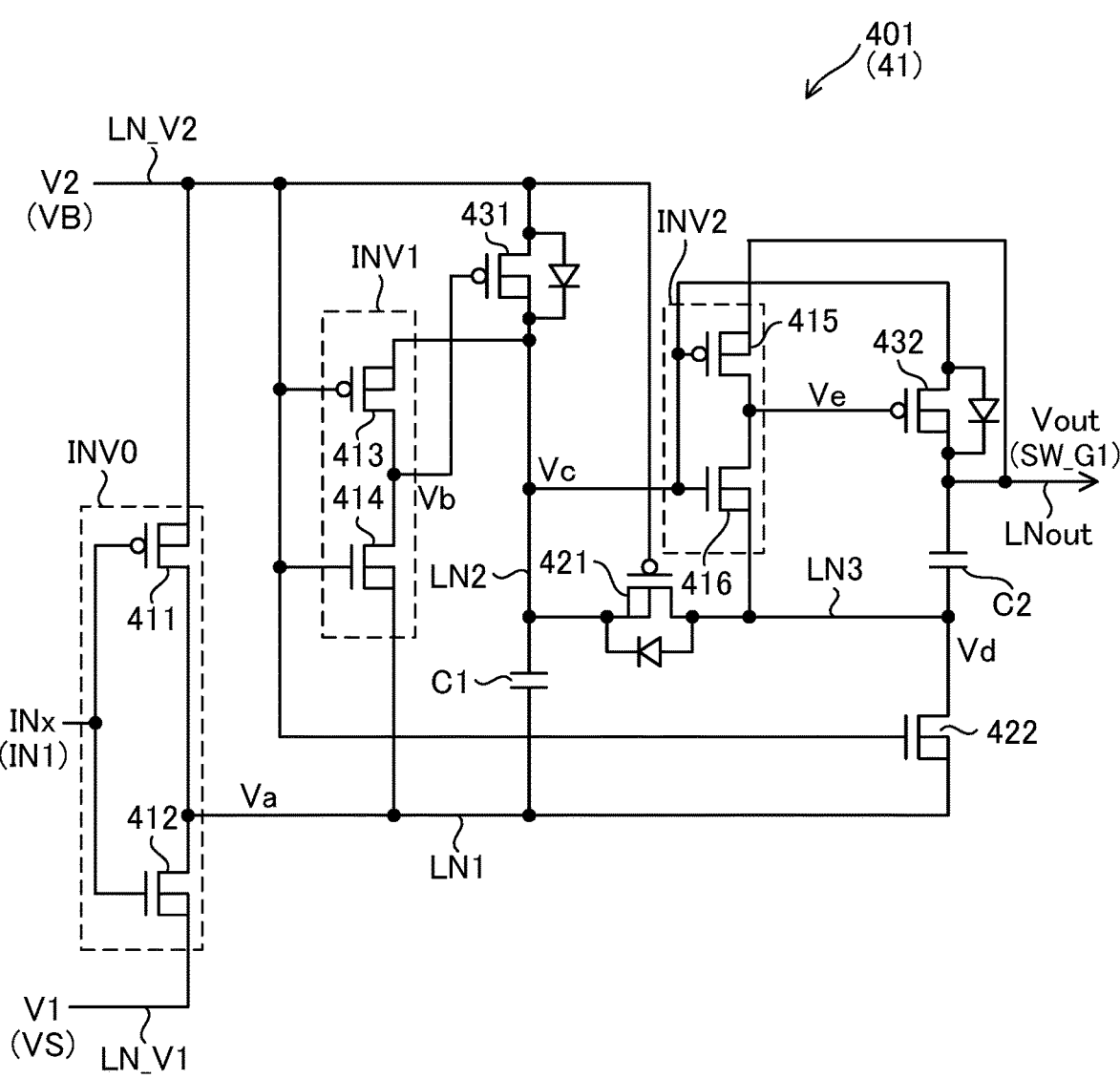
FIG. 38 is a circuit diagram of a charge pump circuit operating relative to an output terminal voltage in connection with the fourth embodiment of the present disclosure.

The CP circuit 400 can be used as the CP circuit 41 in FIG. 6. The CP circuit 400 used as the CP circuit 41 in FIG. 6 will be referred to specifically as the CP circuit 401. As shown in FIG. 38, in the CP circuit 401, the voltage V1 is the output terminal voltage VS, the voltage V2 is the boot voltage VB, and the control signal INx is the control signal IN1. The output line LNout in the CP circuit 401 is connected to the output node OUT1 in FIG. 6, and the output voltage Vout in the CP circuit 401 is fed as the gate signal SW_G1 to the gate of the transistor M1. The charge pump operation performed in the CP circuit 401 is the first charge pump operation described in connection with the first embodiment.

Figure 39:
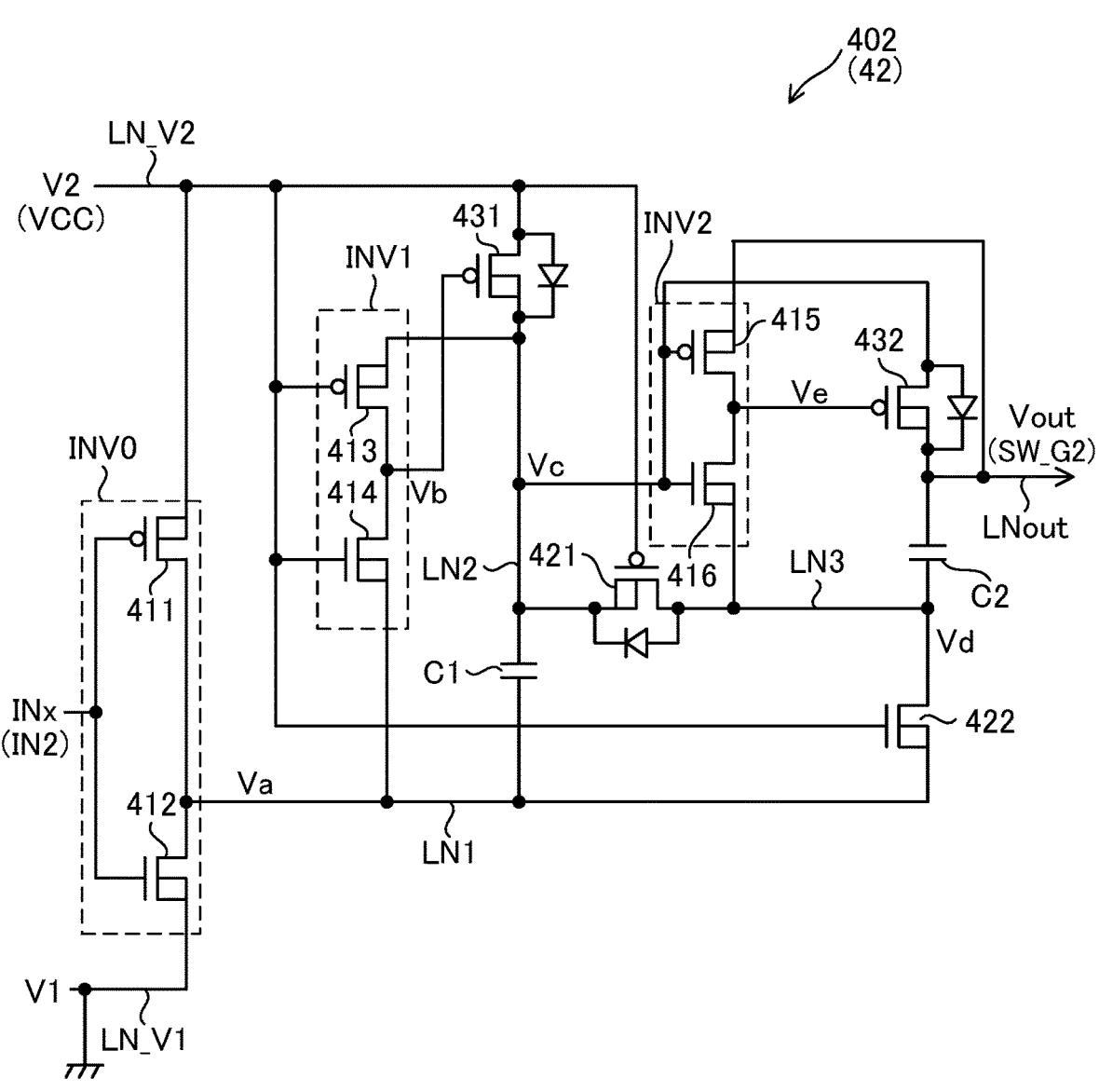
FIG. 39 is a circuit diagram of a charge pump circuit operating relative to a ground in connection with the fourth embodiment of the present disclosure.

The CP circuit 400 can be used as the CP circuit 42 in FIG. 6. The CP circuit 400 used as the CP circuit 42 in FIG. 6 will be referred to specifically as the CP circuit 402. As shown in FIG. 39, in the CP circuit 402, the voltage V1 is the ground voltage (i.e., 0 V), the voltage V2 is the control supply voltage VCC, and the control signal INx is the control signal IN2. The output line LNout in the CP circuit 402 is connected to the output node OUT2 in FIG. 6, and the output voltage Vout in the CP circuit 402 is fed as the gate signal SW_G2 to the gate of the transistor M2. The charge pump operation performed in the CP circuit 402 is the second charge pump operation described in connection with the first embodiment.

Except for the voltage they handle, the CP circuits 41 and 42 shown in FIG. 6 are configured similarly and operate similarly. Accordingly, the fourth embodiment focuses on the configuration and the operation of the CP circuit 400 in FIG. 37.

The CP circuit 400 includes transistors 411 to 416, 421, 422, 431, and 432, and capacitors C1 and C2. Also included among the components of the CP circuit 400 are the wirings, including lines LN_V1, LN_V2, LN1 to LN3, and LNout, to which these circuit elements are connected.

The transistors 411, 413, 415, 421, 431, and 432 are configured as P-channel MOSFETs, and the transistors 412, 414, 416, and 422 are configured as N-channel MOSFETs. The transistors 411 and 412 constitute an inverter circuit INV0, the transistors 413 and 414 constitute an inverter circuit INV1, and the transistors 415 and 416 constitute an inverter circuit INV2.

The line LN_V1 is fed with the voltage V1, and the line LN_V2 is fed with the voltage V2. The voltage V2 can be said to function as the supply voltage for the CP circuit 400, and accordingly in the following description the line LN_V2 is occasionally referred to as the supply line LN_V2. The source of the transistor 412 is connected to the line LN_V1 to receive the voltage V1. The source of the transistor 411, the gates of the transistors 413, 414, 421, and 422, and the drain of the transistor 431 are connected to the supply line LN_V2 to receive the voltage V2.

The gates of the transistors 411 and 412 are fed with the control signal INx. The drains of the transistors 411 and 412 are connected to the line LN1. The voltage applied to the line LN1 will be referred to as the voltage Va. The voltage Va corresponds to the output voltage of the inverter circuit INV0. The drains of the transistors 413 and 414 are connected to the gate of the transistor 431. The voltage applied to the gate of the transistor 431 will be referred to as the voltage Vb. The voltage Vb corresponds to the output voltage of the inverter circuit INV1. The source of the transistor 414 is connected to the line LN1.

To the line LN2 are connected the sources of the transistors 413, 421, and 431, the gates of the transistors 415 and 416, and the drain of the transistor 432. The capacitor C1 is provided between the lines LN1 and LN2. That is, one terminal of the capacitor C1 is connected to the line LN1, and the other terminal of the capacitor C1 is connected to the line LN2. The voltage applied to the line LN2 will be referred to as the voltage Vc.

To the line LN3 are connected the drains of the transistors 421 and 422 and the source of the transistor 416. The voltage applied to the line LN3 will be referred to as the voltage Vd. The capacitor C2 is provided between the line LN3 and the line LNout. That is, one terminal of the capacitor C2 is connected to the line LN3, and the other terminal of the capacitor C2 is connected to the output line LNout. The drains of the transistors 415 and 416 are connected the gate of the transistor 432. The voltage applied to the gate of the transistor 432 will be referred to as the voltage Ve. The voltage Ve corresponds to the output voltage of the inverter circuit INV2. The sources of the transistors 415 and 432 are connected to the output line LNout. The source of the transistor 422 is connected to the line LN1.

While the MOSFETs in the CP circuit 400 are each accompanied by a parasitic diode, of those parasitic diodes, only the parasitic diodes that accompany the transistors 421, 431, and 432 are expressly shown in FIG. 37 (the same is true with FIGS. 38 and 39, as well as FIGS. 40 to 42 referred to later).

The parasitic diode of the transistor 421 has its forward direction in the direction pointing from the drain to the source of the transistor 421. Thus, the transistor 421 includes a parasitic diode that has an anode connected to the line LN3 and a cathode connected to the line LN2. A diode that has an anode connected to the line LN3 and a cathode connected to the line LN2 may be connected, separately from the parasitic diode, in parallel with the transistor 421.

The parasitic diode of the transistor 431 has its forward direction in the direction pointing from the drain to the source of the transistor 431. Thus, the transistor 431 includes a parasitic diode that has an anode connected to the supply line LN_V2 and a cathode connected to the line LN2. A diode that has an anode connected to the supply line LN_V2 and a cathode connected to the line LN2 may be connected, separately from the parasitic diode, in parallel with the transistor 431.

The parasitic diode of the transistor 432 has its forward direction in the direction pointing from the drain to the source of the transistor 432. Thus, the transistor 432 includes a parasitic diode that has anode connected to the line LN2 and a cathode connected to the output line LNout. A diode that has an anode connected to the line LN2 and a cathode connected to the output line LNout may be connected, separately from the parasitic diode, in parallel with the transistor 432.

The control signal INx takes as its signal level high or low level. A high-level control signal INx has the potential of voltage V2. A low-level control signal INx has the potential of voltage V1. The magnitude of the gate threshold voltage of each MOSFET included in the CP circuit 400 is sufficiently lower than the differential voltage (V2−V1). Accordingly, when the control signal INx is at high level, the transistor 411 is off and the transistor 412 is on, so that the voltage V1 is applied to the line LN1 (i.e., Va=V1). When the control signal INx is at low level, the transistor 411 is on and the transistor 412 is off, so that the voltage V2 is applied to the line LN1 (i.e., Va=V2).

A high-level control signal INx corresponds to a control signal INx with the value "0", and a low-level control signal INx corresponds to a control signal INx with the value "1". As will be described in detail later, a switch of the control signal INx from high level to low level triggers the CP circuit 400 to perform charge pump operation to produce on the line LNout a voltage higher than the voltage V2.

With reference to the FIGS. 40 to 42, the operation of the CP circuit 400 will be described in detail starting with a state where the control signal INx is at high level.

Figure 40:
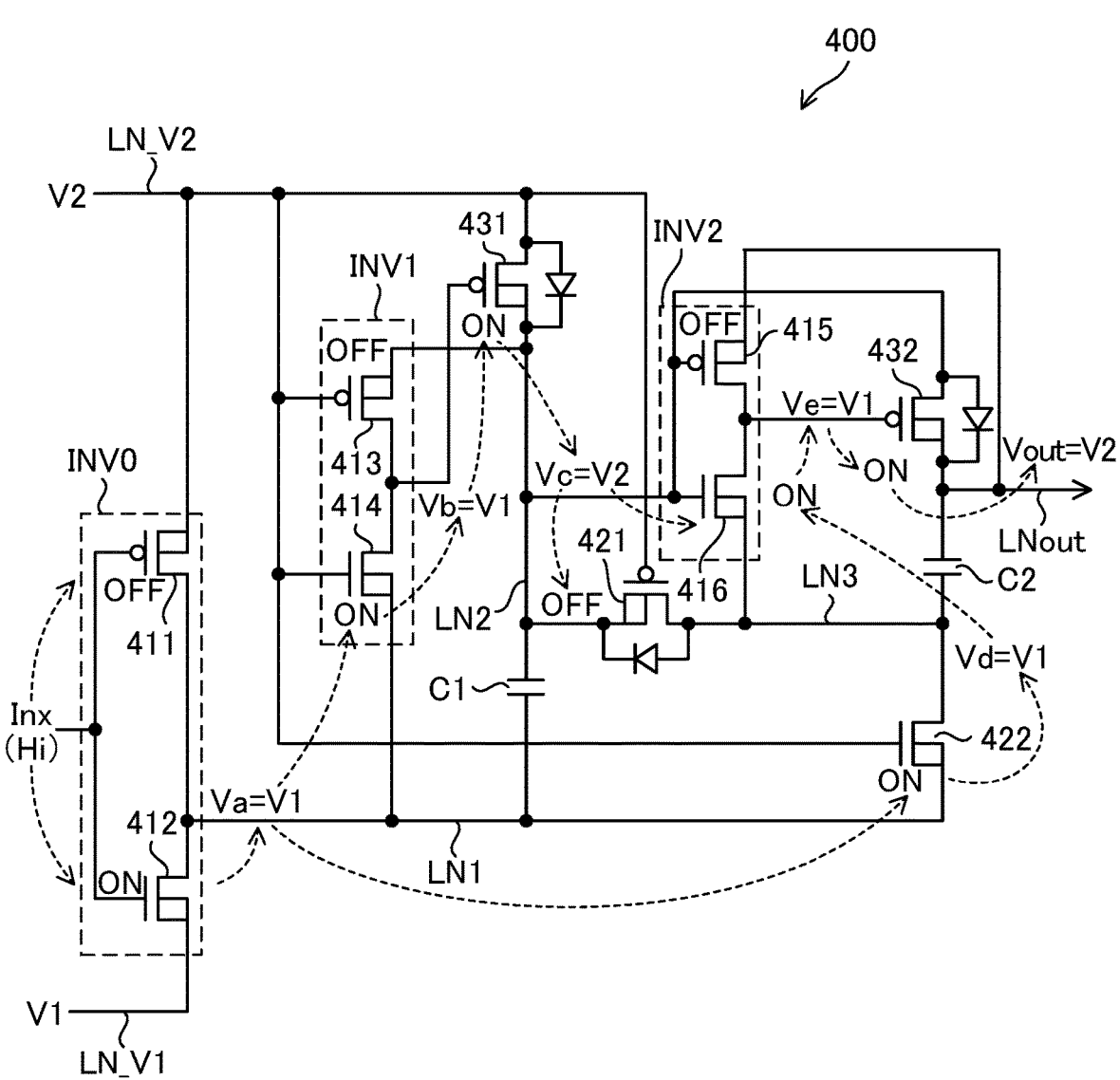
FIG. 40 is a diagram illustrating the operation of a charge pump circuit in connection with the fourth embodiment of the present disclosure.

FIG. 40 is a diagram illustrating the state of the CP circuit 400 as observed in the high-level period of the control signal INx. In FIG. 40, for convenience' sake, broken-line arrows are used to illustrate the states of relevant circuit elements.

As shown in FIG. 40, in the high-level period of the control signal INx, the transistor 411 is off and the transistor 412 is on, so that voltage V1 is applied to the line LN1. That is, the output voltage Va of the inverter circuit INV0 is equal to the voltage V1. When Va=V1, the transistor 414 is on, and thus the voltage V1 is fed to the gate of the transistor 431, that is, Vb=V1.

On the other hand, in the high-level period of the control signal INx, if the transistor 431 is off, a current passes via the parasitic diode of the transistor 431 from the supply line LN_V2 toward the line LN2, so that the voltage Vc rises. When the voltage Vc rises to above the voltage Vb plus the gate threshold voltage of the transistor 431, the transistor 431 turns on. In the high-level period of the control signal INx, Vb=V1, and thus the transistor 431 turns on quickly. After the transistor 431 turns on, through the channel of the transistor 431, electric charge is supplied from the supply line LN_V2 to the line LN2. FIG. 40 shows the state of the CP circuit 400 as observed when the control signal INx is at high level and the transistor 431 is on. In this state, Vc=V2. Note that, with Vc=V2, the gate-source voltage of the transistor 413 is lower than the gate threshold voltage and thus the transistor 413 is off. Moreover, with Vc=V2, the gate-source voltage of the transistor 421 is 0 V and thus the transistor 421 is off.

On the other hand, with Va=V1, a voltage exceeding the gate threshold voltage is applied between the gate and the source of the transistor 422, and thus the transistor 422 is on. Thus, a path conducts between the lines LN1 and LN3 via the transistor 422, so that Vd=V1. Then, with Vd=V1 and Vc=V2, the transistor 416 is on, and the voltage on the line LN3 is applied to the gate of the transistor 432. Thus, Ve=V1.

In the high-level period of the control signal INx, if the transistor 432 is off, via the parasitic diode of the transistor 432 a current passes from the line LN2 toward the output line LNout, so that the output voltage Vout rises. When the output voltage Vout rises to above the voltage Ve plus the gate threshold voltage of the transistor 432, the transistor 432 turns on. In the high-level period of the control signal INx, Ve=V1, and thus the transistor 432 turns on quickly. After the transistor 432 turns on, via the channel of the transistor 432, electric charge is supplied from the line LN2 to the output line LNout. FIG. 40 shows the state of the CP circuit 400 as observed when the control signal INx is at high level and the transistor 432 is on. In this state, Vout=V2. Note that, with Vout=V2 and Vc=V2, the gate-source voltage of the transistor 415 is lower than the gate threshold voltage, and thus the transistor 415 is off.

As described above, in the high-level period of the control signal INx, the CP circuit 400 operates such that Va=V1, Vc=V2, Vd=V1, and Vout=V2. That is, in the high-level period of the control signal INx, an electric charge corresponding to the differential voltage (V2−V1) is stored in each of the capacitors C1 and C2.

Figure 41:
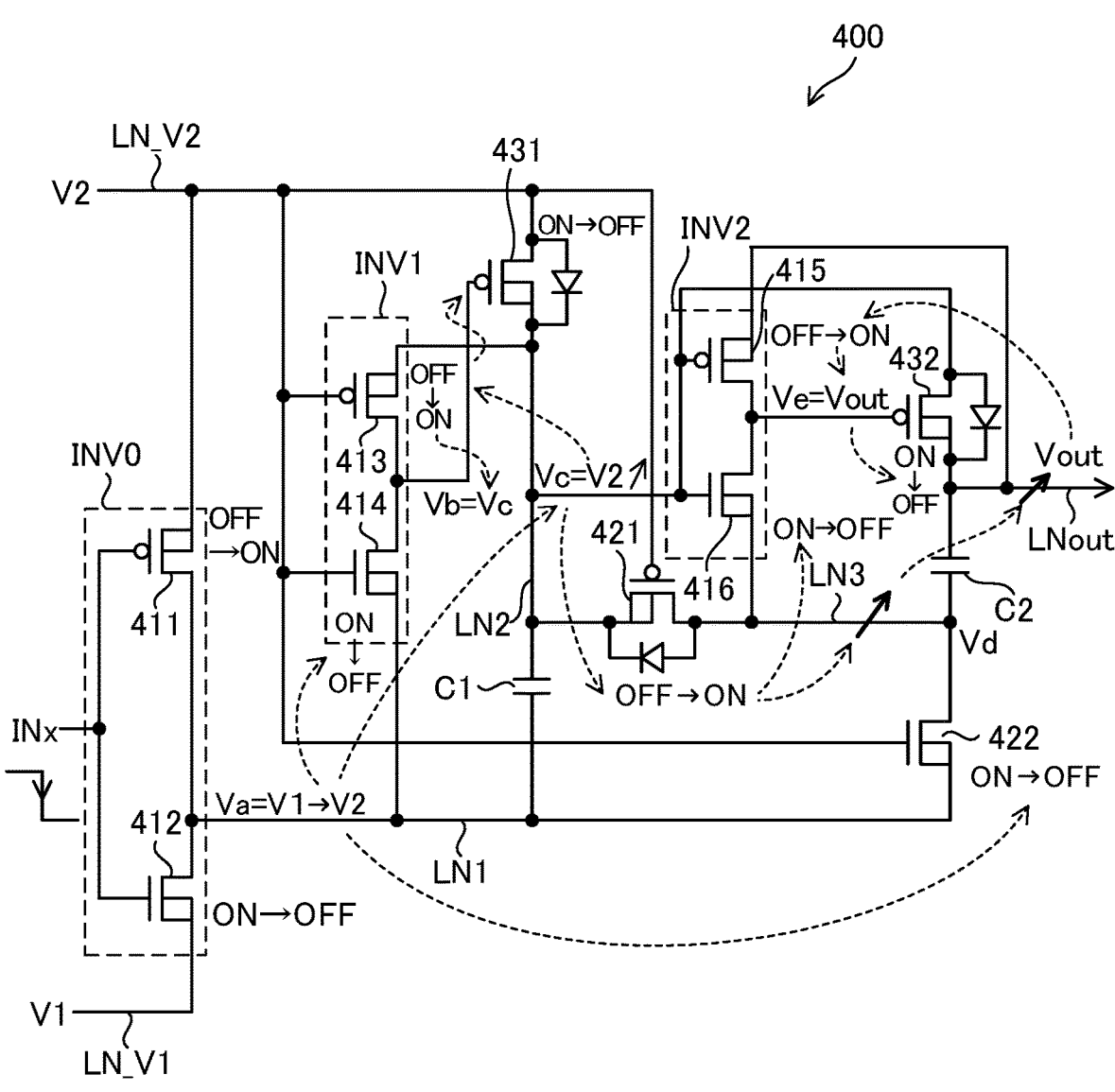
FIG. 41 is a diagram illustrating the operation of a charge pump circuit in connection with the fourth embodiment of the present disclosure.

FIG. 41 is a diagram illustrating the state of the CP circuit 400 as observed when the level of the control signal INx has switched from high level to low level. In FIG. 41, for convenience' sake, broken-line arrows are used to illustrate the states of relevant circuit elements.

The control signal INx switching from high level to low level causes the transistor 411 to switch from off to on and the transistor 412 to switch from on to off. In response to the switch, the voltage Va rises from the voltage V1 toward the voltage V2.

As the voltage Va rises from the voltage V1 toward the voltage V2, via the capacitor C1 also the voltage Vc on the line LN2 rises. Immediately before the control signal INx switches from high level to low level, Vc=V2; thus the voltage Vc on the line LN2 rises starting at the voltage V2 to higher than the voltage V2. When the voltage Vc becomes equal to or higher than the voltage V2 plus the gate threshold voltage of the transistor 421, the transistor 421 turns on.

In the process of the voltage Vc rising from the voltage V2, the source potential of the transistor 413 rises to above the voltage V2 (the gate potential of the transistor 413) plus the gate threshold voltage and the transistor 413 turns on. On the other hand, in the process of the voltage Va rising from the voltage V1 toward the voltage V2, the transistor 414 turns off. Then the output voltage Vb of the inverter circuit INV1 becomes equal to the voltage Vc, and thus, with the gate potential and the source potential of the transistor 431 equal, the transistor 431 turn off.

Moreover, in the process of the voltage Va on the line LN1 rising from the voltage V1 toward the voltage V2, the transistor 422 turns off, and conduction across the path between the lines LN1 and LN3 is cut off. After the transistor 421 turns on and the transistor 422 turns off, in coordination with the voltage Vc on the line LN2 rising, the voltage Vd on the line LN3 too rises.

The transistor 421 turning on causes the gate-source voltage of the transistor 416 to fall toward 0 V, and thus the transistor 416 turns off. On the other hand, as the voltage Vd rises and hence the output voltage Vout rises, the transistor 415 turns on, and thus the voltage Ve, which is the output voltage of the inverter circuit INV2, becomes equal to the output voltage Vout. Then, with the gate potential and the source potential of the transistor 432 equal, the transistor 432 turns off.

Figure 42:
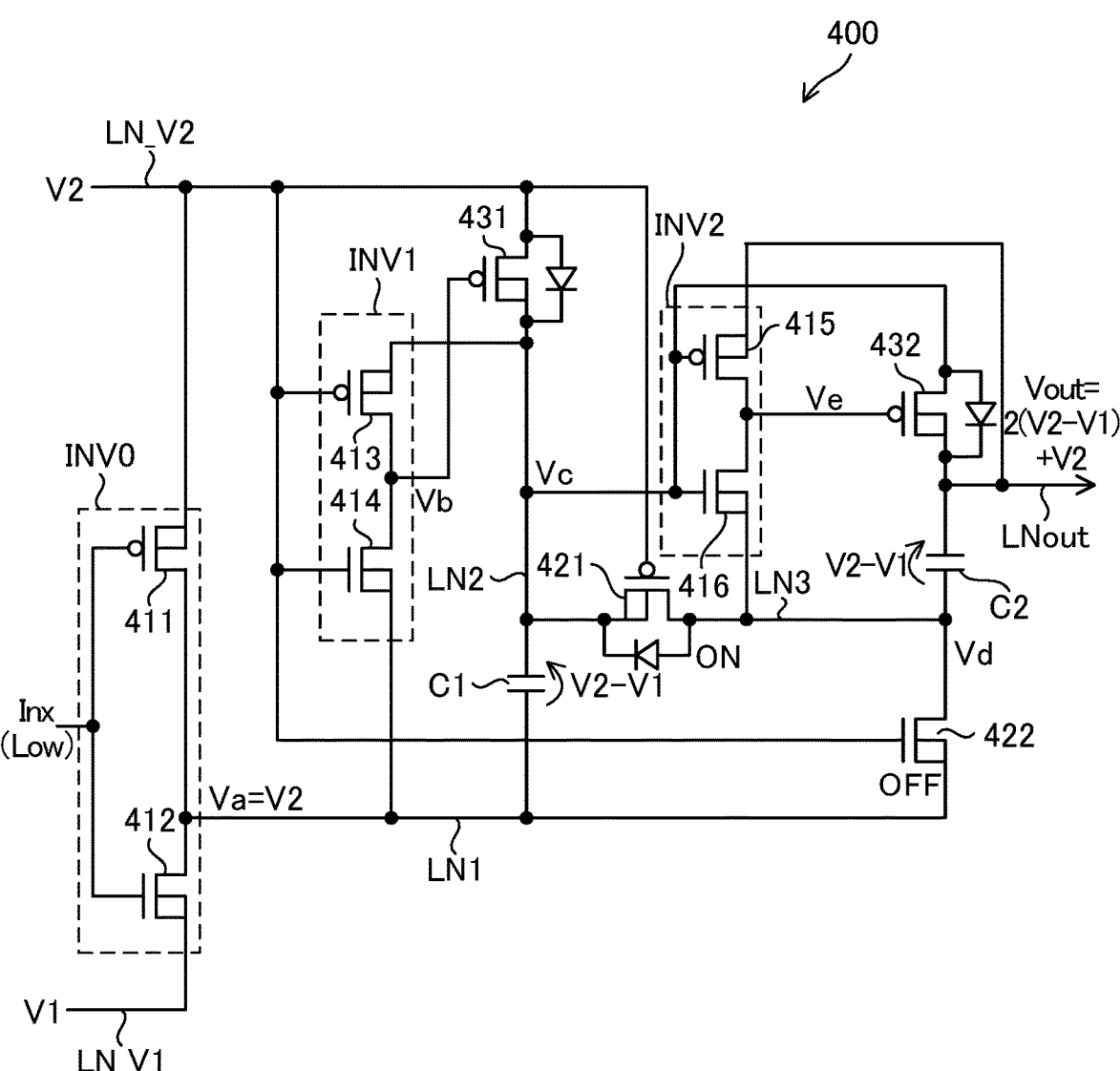
FIG. 42 is a diagram illustrating the operation of a charge pump circuit in connection with the fourth embodiment of the present disclosure.

FIG. 42 shows the state of the CP circuit 400 as observed in the low-level period of the control signal INx, after the output voltage Vout is stabilized (assuming no discharging of electric charge in the output line LNout). In the state in FIG. 42, Va=V2. Moreover, as described with reference to FIG. 40, in the high-level period of the control signal INx, an electric charge corresponding to the differential voltage (V2−V1) is stored in the capacitor C1 with the line LN1 on the low-potential side and an electric charge corresponding to the differential voltage (V2−V1) is stored in the capacitor C2 with the line LN3 on the low-potential side. These stored electric charges are retained in the low-level period of the control signal INx. Thus, in the state in FIG. 42, Vout=2 (V2−V1)+V2. That is, in the state in FIG. 42, the output voltage Vout is higher than the voltage V2 by twice the differential voltage (V2−V1). Note however that Vout=2 (V2−V1)+V2 expresses an ideal state and, due to various factors, the actual maximum voltage of the output voltage Vout is expected to be somewhat lower than Vout=2(V2−V1)+V2.

Figure 43:
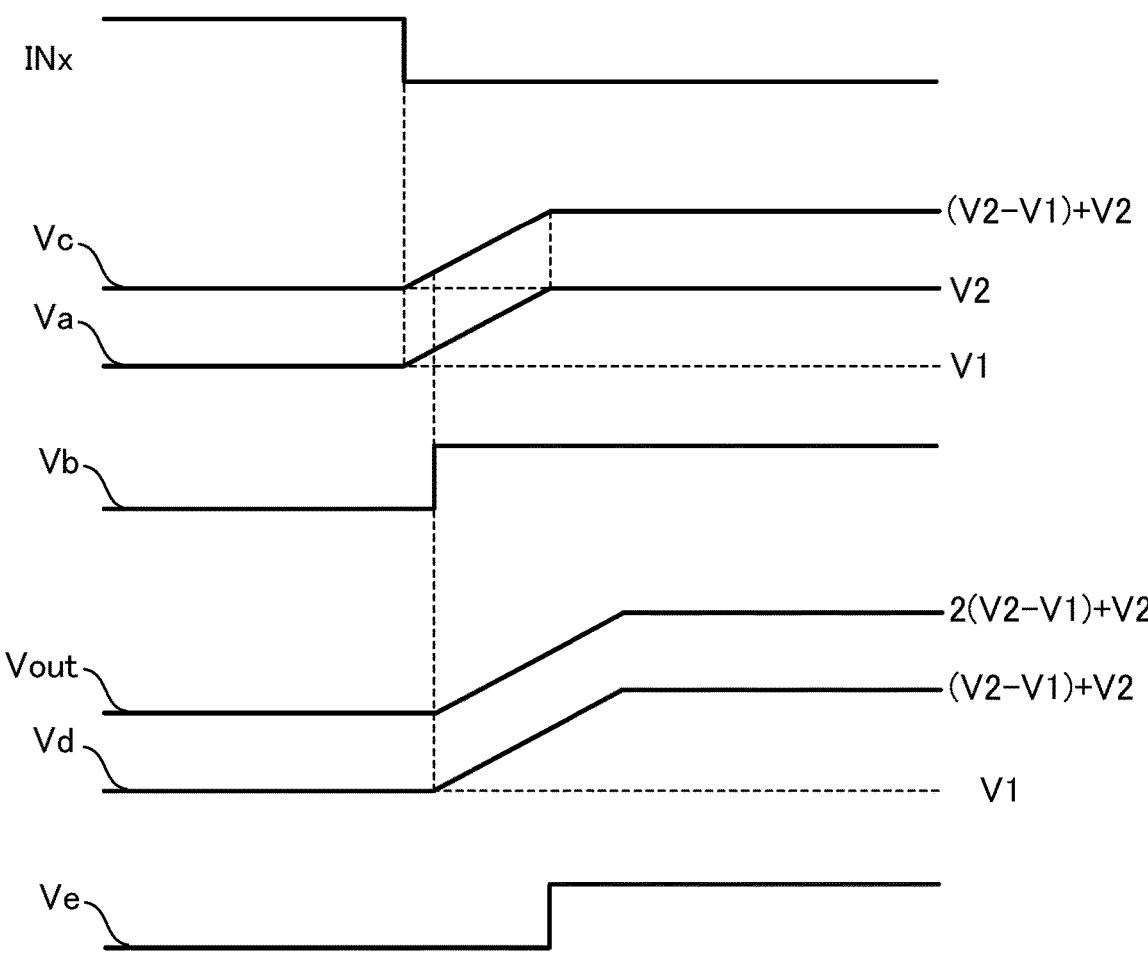
FIG. 43 is a diagram showing the waveforms of signals and voltages associated with the charge pump circuit in connection with the fourth embodiment of the present disclosure.

FIG. 43 is a timing chart depicting in outline the operation of the CP circuit 400. FIG. 43 shows the waveforms of, from top down, the control signal INx, the voltage Vc, the voltage Va, the voltage Vb, the output voltage Vout, the voltage Vd, and the voltage Ve. Note that, in FIG. 43, the waveforms of the voltages Vb and Ve are shown as digital waveforms. If the output voltage Vb of the inverter circuit INV1 is at low level, the potential of the voltage Vb is equal to the potential of the voltage Va and, if the output voltage Vb of the inverter circuit INV1 is at high level, the potential of the voltage Vb is equal to the potential of the voltage Vc. If the output voltage Ve of the inverter circuit INV2 is at low level, the potential of the voltage Ve is equal to the potential of the voltage Vd and, if the output voltage Ve of the inverter circuit INV2 is at high level, the potential of the voltage Ve is equal to the potential of the output voltage Vout.

Triggered by a down edge occurring in the control signal INx, the voltage Va starts to rise starting at the voltage V1 and the voltage Vc starts to rise starting at the voltage V2. As the voltage Vc rises, when the output voltage Vb of the inverter circuit INV1 switches from low level to high level, the transistor 431 turns off; at substantially the same timing that the transistor 431 turns off, the transistor 421 turns on. When the transistor 421 turns on, electric charge is supplied from the line LN2 toward the line LN3 via the resistive component of the channel of the transistor 421 so that, with a time constant that depends on the resistive component, the voltage Vd and the output voltage Vout rises gradually.

Around the timing that the voltages Va and Vc end rising, the output voltage Ve of the inverter circuit INV2 switches from low level to high level. Even after that, the voltages Vd and Vout continue to rise for a while until the potential difference between the lines LN2 and LN3 becomes equal.

A supplementary description will now be given of the features unique to the CP circuit 400 according to this embodiment.

In the CP circuit 400, the transistor 421 functions as a first switching element provided between the lines LN2 and LN3. The transistor 421 is a switching element that turns on and off based on the differential voltage between the voltage Vc on the line LN2 and the voltage V2, and it turns on in response to the voltage Va on the line LN1 rising from the voltage V1 to the voltage V2 (see FIG. 41).

With the configuration of the CP circuit 400 according to this embodiment, the state of the CP circuit 400 is switched without the need for a gate signal dedicated to the transistor 421, and thus it is possible to obtain a desired boosted voltage with a simple configuration (e.g., with a small number of elements).

The transistor 421 assumes the function of raising the output voltage Vout by supplying electric charge from the line LN2 to the line LN3 when, with the control signal INx at low level, charge pump operation is performed. When in the high-level period of the control signal INx the capacitors C1 and C2 are charged, the passage of a current from the line LN2 to the line LN3 has to be shut off, and this is achieved by the transistor 421.

In the CP circuit 400, the transistor 422 functions as a second switching element connected to the line LN3. In the CP circuit 400, the transistor 422 has a drain (first electrode) connected to the line LN3 and a source (second electrode) connected to the line LN1. In the CP circuit 400, when the control signal INx is at high level and the voltage V1 is fed to the line LN1, the transistor 422 is on (i.e., it conducts between its drain and source) and feeds the voltage V1 received at its source (second electrode) to the line LN3. In the CP circuit 400, when the control signal INx is at low level and the voltage V2 is fed to the line LN1, the transistor 422 is off (i.e., it is cut off between its drain and source).

Of the transistors provided in the CP circuit 400, none except the transistor 422 are fed with a voltage higher than the differential voltage (V2−V1). Also the transistor 422, with its source connected to the line LN1, is not fed with a voltage higher than the differential voltage (V2−V1). Thus, the CP circuit 400 can be built using only transistors with a withstand voltage corresponding to the differential voltage (V2−V1). It is thus possible, by using only transistors with a low withstand voltage around the differential voltage (V2−V1), to generate an output voltage Vout higher than the withstand voltage. If, for the sake of argument, a voltage corresponding to 2(V2−V1) is applied between the source and the drain of the transistor 422, it is necessary to use a transistor that withstands that voltage, and this may lead to increasing the cost or size of the CP circuit 400 or compli- cating its manufacturing process.

In the CP circuit 400, the transistor 431 functions as a first rectifying element provided between the supply line LN_V2 and the line LN2. The inverter circuit INV1 functions as an inverter circuit for driving the first rectifying element (431) (i.e., an inverter circuit for the first rectifying element). The inverter circuit INV1 uses the voltage Vc on the line LN2 as the positive-side supply voltage and the voltage Va on the line LN1 as the negative-side supply voltage. According to the magnitude relationship between, at one end, the voltage V2 on the supply line LN_V2 and, at the other end, the voltage Vc on the line LN2 and the voltage Va on the line LN1 (i.e., according to the magnitude relationship between the voltages V2 and Vc and the magnitude relationship between the voltages V2 and Va), the inverter circuit INV1 outputs the voltage Va on the line LN1 as the voltage Vb (see FIG. 40) or outputs the voltage Vc on the line LN2 as the voltage Vb (see FIG. 41). Whereas the input voltage to the inverter circuit INV1 is fixed at the voltage V2, the supply voltages to the inverter circuit INV1 varies. Note however that, in a case where the voltage V2 is the boot voltage VB, the specific value of the voltage V2 varies as the output terminal voltage VS varies.

With this configuration, in the high-level period of the control signal INx, the voltage Vc on the line LN2 can be raised up to the level of the voltage V2. That is, an electric charge corresponding to the differential voltage (V2−V1) can be stored in the capacitor C1. If the first rectifying element is a simple diode, in the high-level period of the control signal INx, the voltage Vc on the line LN2 only rises up to the differential voltage (V2−Vf), and the output voltage Vout obtained during charge pump operation is lower than with the configuration in FIG. 37. The symbol Vf represents the forward voltage of the diode.

In the CP circuit 400, the transistor 432 functions as a second rectifying element provided between the line LN2 and the output line LNout. The inverter circuit INV2 func- tions as an inverter circuit for driving the second rectifying element (432) (i.e., an inverter circuit for the second recti- fying element). The inverter circuit INV2 uses the voltage on the output line LNout as the positive-side supply voltage and the voltage on the line LN3 as the negative-side supply voltage. According to the magnitude relationship between, at one end, the voltage Vc on the line LN2 and, at the other end, the voltage Vout on the output line LNout and the voltage Vd on the line LN3 (i.e., according to the magnitude relation- ship between the voltages Vc and Vout and the magnitude relationship between the voltages Vc and Vd), the inverter circuit INV2 outputs the voltage Vd on the line LN3 as the voltage Ve (see FIG. 40) or outputs the voltage Vout on the output line LNout as the voltage Ve (see FIG. 41). The input voltage (Vc) to the inverter circuit INV2 varies, and also the supply voltages to the inverter circuit INV2 varies.

With this configuration, in the high-level period of the control signal INx, the voltage Vout on the output line LNout can be raised up to the level of the voltage V2. That is, an electric charge corresponding to the differential voltage (V2−V1) can be stored in the capacitor C2. If the second rectifying element is a simple diode, in the high-level period of the control signal INx, the voltage Vout on the output line LNout only rises up to the differential voltage (V2−Vf), and the output voltage Vout obtained during charge pump opera- tion is lower than with the configuration in FIG. 37.

Figure 44:
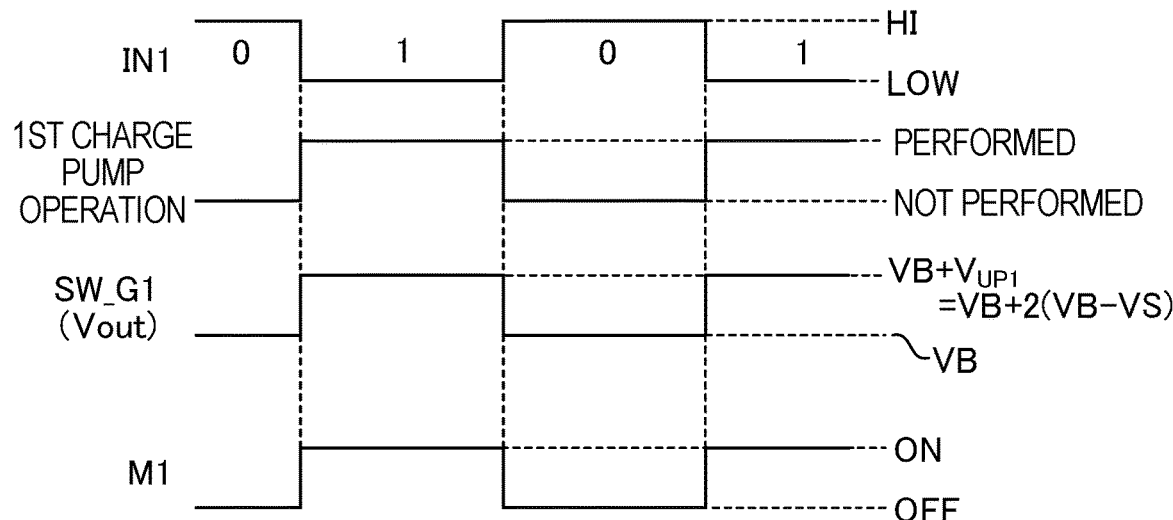
FIG. 44 is a diagram showing the relationship among a control signal, a gate signal, and the like in connection with the fourth embodiment of the present disclosure.

With reference to FIG. 44, a supplementary description will be given of the relationship between the CP circuit 401 in FIG. 38 and the CP circuit 41 in FIG. 6. As mentioned above, the CP circuit 401 shown in FIG. 38 corresponds to the CP circuit 400 used as the CP circuit 41 in the FIG. 6. The control signal INx that is fed to the CP circuit 401 from the switching control circuit 50 (see FIG. 6) is the control signal IN1. A high-level control signal IN1 has the value "0" and a low-level control signal IN1 has the value "1". The CP circuit 401 can perform the first charge pump operation described in connection with the first embodiment.

In the CP circuit 401, in the high-level period of the control signal IN1, the first charge pump operation is not performed; in the high-level period of the control signal IN1, the capacitors C1 and C2 in the CP circuit 401 are charged, so that the boot voltage VB is applied to the high-potential side of the capacitors C1 and C2. In the CP circuit 401, when a down edge occurs in the control signal IN1, the first charge pump operation is performed, and a first boosted voltage higher than the boot voltage VB appears on the line LNout. The first boosted voltage corresponds to the voltage (VB+ $V_{UP1}$) described above with reference to FIG. 7 and ideally $V_{UP1}=2(VB-VS)$.

The output line LNout in the CP circuit 401 is connected to the output node OUT1 in FIG. 6, and the output voltage Vout in the CP circuit 401 is fed as the gate signal SW_G1 to the gate of the transistor M1. Thus, in the high-level period of the control signal IN1, the potential difference between the gate and the source of the transistor M1 is zero, and the transistor M1 is off. In the low-level period of the control signal IN1, a voltage $V_{UP1}$ is applied between the gate and the source of the transistor M1, and the transistor M1 is on.

Figure 45:
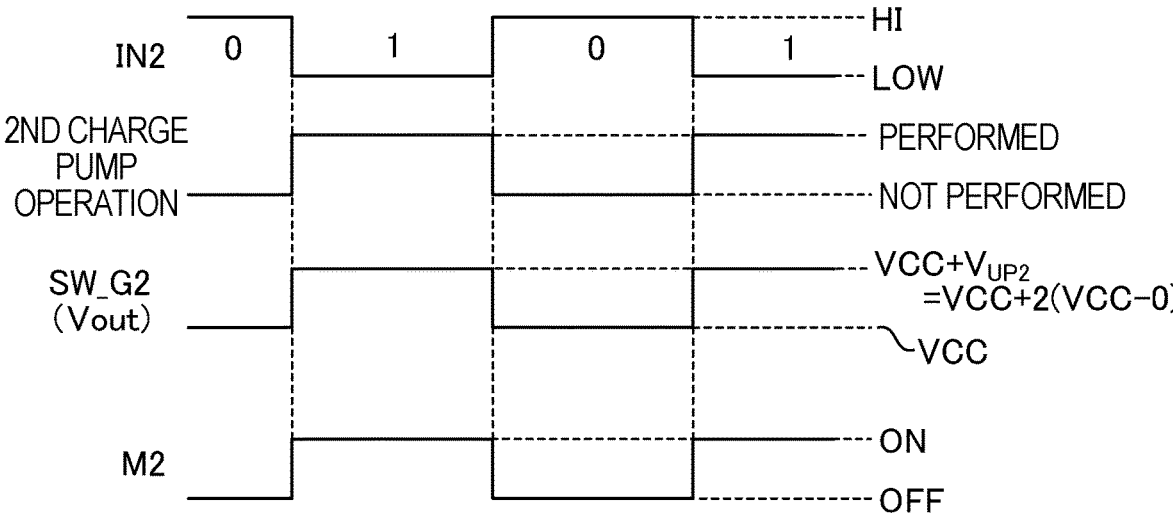
FIG. 45 is a diagram showing the relationship among a control signal, a gate signal, and the like in connection with the fourth embodiment of the present disclosure.

With reference to FIG. 45, a supplementary description will be given of the relationship between the CP circuit 402 in FIG. 39 and the CP circuit 42 in FIG. 6. As mentioned above, the CP circuit 402 shown in FIG. 39 corresponds to the CP circuit 400 used as the CP circuit 42 in the FIG. 6. The control signal INx that is fed to the CP circuit 402 from the switching control circuit 50 (see FIG. 6) is the control signal IN2. A high-level control signal IN2 has the value "0" and a low-level control signal IN2 has the value "1". The CP circuit 402 can perform the second charge pump operation described in connection with the first embodiment.

In the CP circuit 402, in the high-level period of the control signal IN2, the second charge pump operation is not performed; in the high-level period of the control signal IN2, the capacitors C1 and C2 in the CP circuit 402 are charged, so that the control supply voltage VCC is applied to the high-potential side of the capacitors C1 and C2. In the CP circuit 402, when a down edge occurs in the control signal IN2, the second charge pump operation is performed, and a second boosted voltage higher than the control supply voltage VCC appears on the output line LNout. The second boosted voltage corresponds to the voltage $(VCC+V_{UP2})$ described above with reference to FIG. 8 and ideally $V_{UP2}=2VCC$.

The output line LNout in the CP circuit 402 is connected to the output node OUT2 in FIG. 6, and the output voltage Vout in the CP circuit 402 is fed as the gate signal SW_G2 to the gate of the transistor M2. Thus, in the high-level period of the control signal IN2, the potential difference between the gate and the source of the transistor M2 is zero, and the transistor M2 is off. In the low-level period of the control signal IN2, a voltage $V_{UP2}$ is applied between the gate and the source of the transistor M2, and the transistor M2 is on.

A fourth embodiment includes Practical Examples EX4_1 to EX4_3 described below.

Practical Example EX4_1

Practical Example EX4_1 will be described. The CP circuit 400 can be modified into a CP circuit 400' in FIG. 46. The CP circuit 400' is a CP circuit according to Practical Example EX4_1. The CP circuit 400' can be used as the CP circuit 41 in FIG. 6, and can be used as the CP circuit 42 in FIG. 6. In such cases, the reference sign 400 of the CP circuit described previously in connection with the fourth embodiment can be read as 400'.

Figure 46:
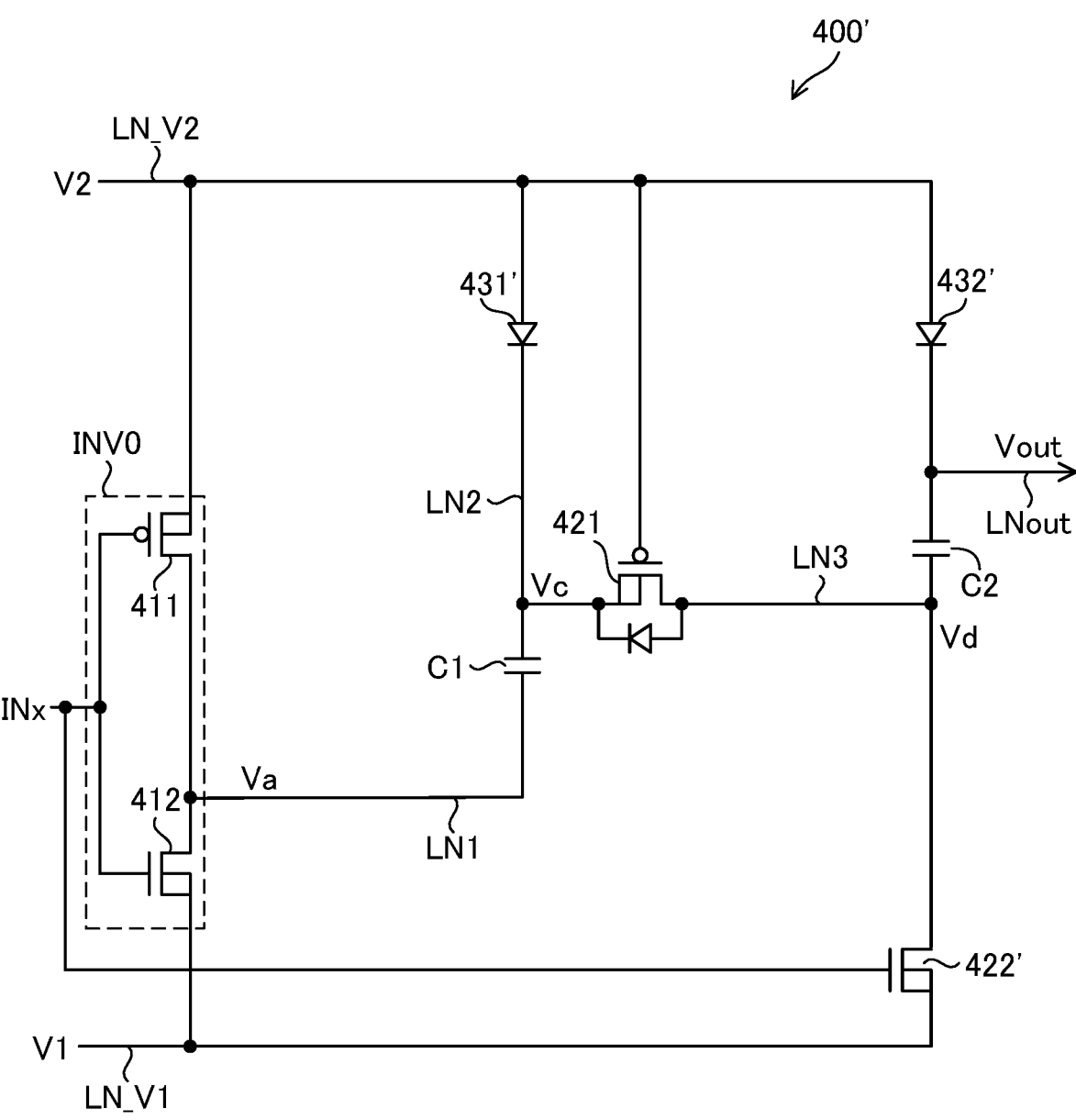
FIG. 46 is a modified circuit diagram of the charge pump circuit in connection with the fourth embodiment of the present disclosure.

The CP circuit 400 in FIG. 37 can be subjected to a first to a third modification as described below to obtain the CP circuit 400' in FIG. 46.

The first modification comprises replacing the transistor 422 in the CP circuit 400 in FIG. 37 with a transistor 422'. The transistor 422' is an N-channel MOSFET. In the CP circuit 400', the drain of the transistor 422' is connected to the line LN3, and the source of the transistor 422' is connected to the line LN_V1, and the gate of the transistor 422' is fed with the control signal INx.

The second modification comprises replacing the transistor 431 in the CP circuit 400 in FIG. 37 with a diode 431'. This replacement leads to the inverter circuit INV1 in the CP circuit 400 in FIG. 37 being omitted from the CP circuit 400'. In the CP circuit 400', the anode of the diode 431' is connected to the supply line LN_V2, and the cathode of the diode 431' is connected to the line LN2.

The third modification comprises replacing the transistor 432 in the CP circuit 400 in FIG. 37 with a diode 432'. This replacement leads to the inverter circuit INV2 in the CP circuit 400 in FIG. 37 being omitted from the CP circuit 400'. In the CP circuit 400', the anode of the diode 432' is connected to the supply line LN_V2, and the cathode of the diode 432' is connected to the output line LNout.

In the CP circuit 400', the transistor 422' is on in the high-level period of the control signal INx (i.e., in the period in which the control signal INx has the potential of the voltage V2), and is off in the low-level period of the control signal INx (i.e., the period in which the control signal INx has the potential of the voltage V1).

The transistor 422', in that it is on in the high-level period of the control signal INx and is off in the low-level period of the control signal INx, is similar to the transistor 422 in FIG. 37 (see also FIGS. 40 and 42). In the CP circuit 400', the transistor 422' has a drain (first electrode) connected to the line LN3 and a source (second electrode) connected to the line LN_V1 and received the voltage V1.

In the CP circuit 400', the transistor 422' functions as the second switching element described above. Like the transistor 422 in the CP circuit 400, the transistor 422' in the CP circuit 400' operates as follows: when the control signal INx is at high level and the voltage V1 is fed to the line LN1, it is on (i.e. it conducts between its drain and source) and feeds the voltage V1 received at its source (second electrode) to the line LN3. Like the transistor 422 in the CP circuit 400, the transistor 422' in the CP circuit 400' operates as follows: when the control signal INx is at low level and the voltage V2 is fed to the line LN1, it is off (i.e., it is cut off between its drain and source).

As described above, the transistor 422' operates similarly to the transistor 422 in FIG. 37, and thus also with the first modification made it is possible to achieve the desired charge pump operation. However, seeing that, in the low-level period of the control signal INx, the voltage Vd rises up to the voltage $((V2-V1)+V2)$ (see FIG. 42), the transistor 422' needs to have a withstand voltage corresponding to the voltage $(((V2-V1)+V2)-V1)$, that is, twice the differential voltage $(V2-V1)$. For example, in a case where the differential voltage $(V2-V1)$ is 18 V (volts), while the transistor 422 in FIG. 37 only has to have a withstand voltage of about 20 V, the transistor 422' in FIG. 46 has to have a withstand voltage of about 40 V. For this reason, the CP circuit 400 is preferable to the CP circuit 400'.

In the CP circuit 400', the diode 431' functions as a first rectifying element provided between the supply line LN_V2 and the line LN2. As in a case where as the first rectifying element the transistor 431 (FIG. 37) is used, also in a case where as the first rectifying element the diode 431' is used, in the high-level period of the control signal INx the capacitor C1 can be charged. However, in a case where the diode 431' is used, in the high-level period of the control signal INx, the voltage Vc on the line LN2 only rises up to the voltage $(V2-Vf)$, and the output voltage Vout obtained during charge pump operation is lower than in the configuration in FIG. 37. For this reason, the CP circuit 400 is preferable to the CP circuit 400'.

In the CP circuit 400', the diode 432' functions as a second rectifying element provided between the supply line LN_V2 and the output line LNout. As in a case where as the second rectifying element the transistor 432 (FIG. 37) is used, also in a case where as the second rectifying element the diode 432' is used, in the high-level period of the control signal INx the capacitor C2 can be charged. However, in a case where the diode 432' is used, in the high-level period of the control signal INx, the voltage Vout on the output line LNout only rises up to the voltage $(V2-Vf)$, and the output voltage Vout obtained during charge pump operation is lower than in the configuration in FIG. 37. For this reason, the CP circuit 400 is preferable to the CP circuit 400'.

Practical Example EX4_2

Practical Example EX4_2 will be described. While Practical Example EX4_1 deals with a CP circuit 400' to which the first to third modifications described above are all applied, the CP circuit 400 in FIG. 37 may be subjected to only any one, or only any two, of the first to third modifications.

Practical Example EX4_3

The CP circuit (400, 400') described in connection with the fourth embodiment can be applied not only to the semiconductor device 1 configured as shown in FIG. 1 but to any device that requires a boosted voltage.

Fifth Embodiment

A fifth embodiment of the present disclosure will be described. The fifth embodiment deals with the control of the differential voltage (VB−VS) by the switching control circuit 50.

Figure 47:
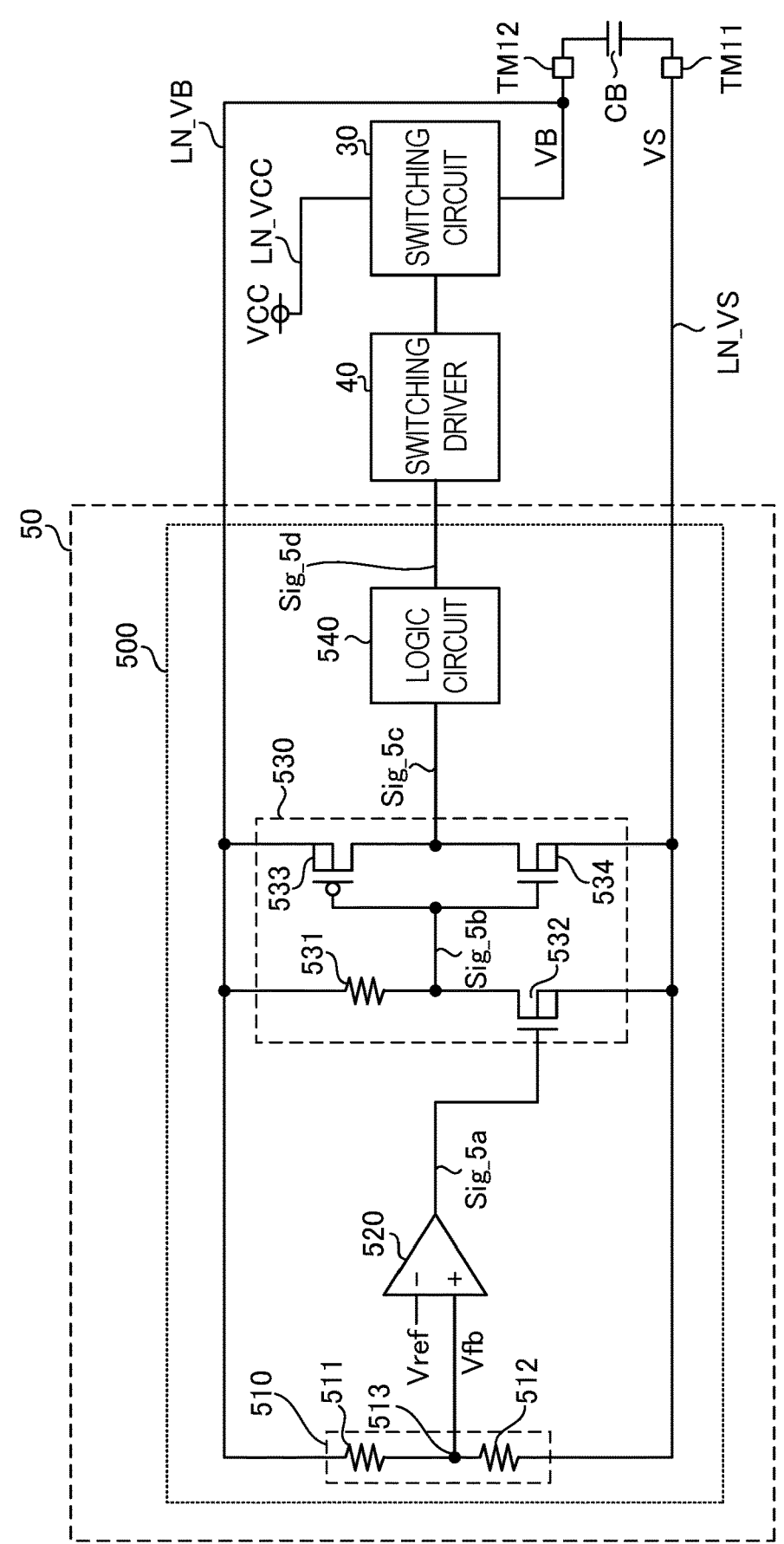
FIG. 47 is a circuit diagram of part of a switching control circuit along with circuits peripheral to it in connection with a fifth embodiment of the present disclosure.

FIG. 47 shows part of the switching control circuit 50 according to the fifth embodiment along with some circuits peripheral to it. The switching control circuit 50 includes, as a circuit for monitoring and controlling the differential voltage (VB−VS), a feedback control circuit 500. The feedback control circuit 500 includes a feedback voltage generation circuit 510, a comparator 520, a gain adjustment circuit 530, and a logic circuit 540.

The feedback voltage generation circuit 510 includes feedback resistors 511 and 512. The feedback voltage generation circuit 510 is composed of a series circuit of the feedback resistors 511 and 512 provided between the boot voltage line LN_VB and the output terminal line LN_VS, and generates a feedback voltage Vfb corresponding to the differential voltage (VB−VS). More specifically, one terminal of the feedback resistor 511 is connected to the boot voltage line LN_VB, the other terminal of the feedback resistor 511 is connected, at a node 513, to one terminal of the feedback resistor 512, and the other terminal of the feedback resistor 512 is connected to the output terminal line LN_VS. At the node 513 at which the feedback resistors 511 and 512 are connected together, the feedback voltage Vfb appears. If the resistance values of the feedback resistors 511 and 512 are represented by the symbols "R511" and "R512" respectively, then the feedback voltage Vfb is given by Vfb=(VB−VS)×R512/(R511+R512)+VS.

The comparator 520 has a non-inverting input terminal, an inverting input terminal, and an output terminal. The non-inverting input terminal of the comparator 520 is connected to the node 513 to receive the feedback voltage Vfb. The inverting input terminal of the comparator 520 is fed with a predetermined reference voltage Vref. The comparator 520 compares the feedback voltage Vfb with the reference voltage Vref to generate and output, from its output terminal, a signal Sig_5a that indicates the result of the comparison of the feedback voltage Vfb with the reference voltage Vref. The comparator 520 operates by using the boot voltage VB as the positive-side supply voltage and the output terminal voltage VS as the negative-side supply voltage and, by using the boot voltage VB and the output terminal voltage VS, generates the signal Sig_5a. Thus, the potential of the signal Sig_5a is equal to or lower than the potential of the boot voltage VB but equal to or higher than the potential of the output terminal voltage VS.

The reference voltage Vref is a voltage based on the threshold voltage Vth_dff (see FIG. 11) mentioned above. More specifically, the reference voltage Vref is a voltage higher than the output terminal voltage VS by a predetermined voltage $V_{JJ}$. That is, Vref=VS+$V_{JJ}$. The resistance value ratio between the feedback resistors 511 and 512 is set such that, when the differential voltage (VB−VS) is equal to the threshold voltage Vth_dff, the feedback voltage Vfb is equal to the reference voltage Vref. Accordingly, $V_{JJ}$=Vth_dff×R512/(R511+R512). As mentioned above, the threshold voltage Vth_dff may have a voltage value (here, 18 V) equal to or close to that of the control supply voltage VCC.

The comparator 520 may be a comparator with hysteresis.

The gain adjustment circuit 530 includes a resistor 531 and transistors 532 to 534. The transistors 532 and 534 are N-channel MOSFETs, and the transistor 533 is a P-channel MOSFET. One terminal of the resistor 531 is connected to the boot voltage line LN_VB. The other terminal of the resistor 531 is connected to the drain of the transistor 532 and to the gates of the transistors 533 and 534. The source of the transistor 532 is connected to the output terminal line LN_VS. The gate of the transistor 532 is connected to the output terminal of the comparator 520. Thus, the gate of the transistor 532 is fed with the signal Sig_5a.

The source of the transistor 533 is connected to the boot voltage line LN_VB. The source of the transistor 534 is connected to the output terminal line LN_VS. The drains of the transistors 533 and 534 are connected together. The signal that appears at the drain of the transistor 532 will be referred to as the signal Sig_5b. The signal that appears at the drains of the transistors 533 and 534 will be referred to as the signal Sig_5c. The transistors 533 and 534 constitute an inverter circuit. The transistors 533 and 534 have the function of outputting the inversion signal of the signal Sig_5b as the signal Sig_5c.

The logic circuit 540 receives the signal Sig_5c. Based on the signal Sig_5c, the logic circuit 540 generates a control signal Sig_5d for controlling the state of the switching circuit 30, and feeds the generated control signal Sig_5d to the switching driver 40. The logic circuit 540 operates by using the boot voltage VB as the positive-side supply voltage and the output terminal voltage VS as the negative-side supply voltage and, using the boot voltage VB and the output terminal voltage VS, generates the control signal Sig_5d. Thus the potential of the control signal Sig_5d is equal to or lower than the potential of the boot voltage VB but equal to or higher than the potential of the output terminal voltage VS.

The switching circuit 30 is provided between the control supply line LN_VCC and the boot voltage line LN_VB (in other words, between the control supply terminal TM14 and the boot terminal TM12). The switching circuit 30 can be any circuit that permits or inhibits the passage of a current between the control supply line LN_VCC and the boot voltage line LN_VB (in other words, any circuit that permits or inhibits the passage of a current between the control supply terminal TM14 and the boot terminal TM12).

While the first embodiment (see FIG. 6 etc.) deals with an example where the switching circuit 30 is configured with N-channel MOSFETs, the switching circuit 30 may be configured with P-channel MOSFETs. The switching circuit 30 may be configured with switching elements of any type that is not classified as a MOSFET.

The current that passes from the control supply line LN_VCC via the switching circuit 30 toward the boot voltage line LN_VB corresponds to the charge current of the bootstrap capacitor CB. The charge current of the bootstrap capacitor CB increases the differential voltage (VB−VS).

The current that passes from the boot voltage line LN_VB via the switching circuit 30 toward the control supply line LN_VCC corresponds to the discharge current of the bootstrap capacitor CB. Also a current that passes from the boot voltage line LN_VB toward any other line (e.g., the output terminal line LN_VS or the ground line LN_GND) without passing through the switching circuit 30 corresponds to the discharge current of the bootstrap capacitor CB (see FIG. 18 etc.). The discharge current of the bootstrap capacitor CB decreases the differential voltage (VB−VS).

The feedback voltage generation circuit 510, the comparator 520, the gain adjustment circuit 530, the logic circuit 540, the switching driver 40, and the switching circuit 30 constitute a feedback loop with respect to the boot voltage VB. Using this feedback loop, the feedback control circuit 500 controls the state of the switching circuit 30 via the switching driver 40 so as to stabilize the differential voltage (VB–VS). Meanwhile, through the control of the switching circuit 30, the feedback control circuit 500 controls the charging of the bootstrap capacitor CB via the switching circuit 30 and thereby stabilizes the differential voltage (VB–VS).

Stabilizing the differential voltage (VB–VS) means keeping the differential voltage (VB–VS) equal to or lower than the threshold voltage Vth_dff mentioned above, around the threshold voltage Vth_dff (see FIG. 11). This corresponds to stabilizing the differential voltage (VB–VS) at the threshold voltage Vth_dff. Note that a transient response may leave the differential voltage (VB–VS) to exceed the threshold voltage Vth_dff for a very short period.

To stabilize the differential voltage (VB–VS) at the threshold voltage Vth_dff, the comparator 520 operates as follows. If the feedback voltage Vfb is higher than the reference voltage Vref, the comparator 520 supplies electric charge (positive electric charge) toward the gate of the transistor 532 to raise the potential of the signal Sig_5a. By contrast, if the feedback voltage Vfb is lower than the reference voltage Vref, the comparator 520 draws electric charge (positive electric charge) from the gate of the transistor 532 to lower the potential of the signal Sig_5a. As the absolute value |Vfb–Vref| increases, the current that passes between the output terminal of the comparator 520 and the gate of the transistor 532 increases. Note however that the upper limit of the potential of the signal Sig_5a is the potential of the boot voltage VB and the lower limit of the potential of the signal Sig_5a is the potential of the output terminal voltage vs.

A rise in the potential of the signal Sig_5a brings a fall in the potential of the signal Sig_5b, and a fall in the potential of the signal Sig_5b brings a rise in the potential of the signal Sig_5c. By contrast, a fall in the potential of the signal Sig_5a brings a rise in the potential of the signal Sig_5b, and a rise in the potential of the signal Sig_5b brings a fall in the potential of the signal Sig_5c.

The logic circuit 540 controls the state of the switching circuit 30 via the switching driver 40 such that, as the potential of the signal Sig_5c increases, the charge current of the bootstrap capacitor CB decreases and that, as the potential of the signal Sig_5c decreases, the charge current of the bootstrap capacitor CB increases (it generates and outputs the control signal Sig_5d so as to achieve such control). In this way, the differential voltage (VB–VS) can be stabilized at the threshold voltage Vth_dff.

That is, the charge voltage of the capacitor CB is made adequate, and this makes it possible to drive the output transistor MH safely and properly.

More specifically, the feedback control circuit 500 controls the state of the switching circuit 30 with consideration given also to the high voltage detection signal Sig_p1 and the negative voltage detection signal Sig_n1.

Specifically, if Sig_p1=1, that is, if the value of the high voltage detection signal Sig_p1 is "1", regardless of the feedback voltage Vfb (hence regardless of the signals Sig_5a, Sig_5b, and Sig_5c), the feedback control circuit 500 (logic circuit 540) controls the switching circuit 30 such that the path between the lines LN_VCC and LN_VB is shut off. That is, if Sig_p1=1, regardless of the feedback voltage Vfb (hence regardless of the signals Sig_5a, Sig_5b, and Sig_5c), the feedback control circuit 500 (logic circuit 540)

controls the switching circuit 30 so as to shut off a current from the boot voltage line LN_VB toward the control supply line LN_VCC (i.e., the charge current of the capacitor CB).

If (Sig_n1, Sig_p1)=(0, 0), that is, if the values of the detection signals Sig_n1 and Sig_p1 are both "0", regardless of the feedback voltage Vfb (hence regardless of the signals Sig_5a, Sig_5b, and Sig_5c), the feedback control circuit 500 (logic circuit 540) can control the switching circuit 30 such that the path between the lines LN_VCC and LN_VB conducts. That is, if (Sig_n1, Sig_p1)=(0, 0), regardless of the feedback voltage Vfb (hence regardless of the signals Sig_5a, Sig_5b, and Sig_5c), the feedback control circuit 500 (logic circuit 540) can control the switching circuit 30 so as to permit a current to pass between the lines LN_VCC and LN_VB.

If Sig_n1=1, that is, if the value of the negative voltage detection signal Sig_n1 is "1", the feedback control circuit 500 (logic circuit 540) controls the state of the switching circuit 30 according to the feedback voltage Vfb. If Sig_n1=1, the feedback control circuit 500 (logic circuit 540) controls, via the switching driver 40, the state of the switching circuit 30 such that, as the potential of the signal Sig_5c increases, the charge current of the bootstrap capacitor CB decreases and that, as the potential of the signal Sig_5c decreases, the charge current of the bootstrap capacitor CB increases (it generates and outputs the control signal Sig_5d so as to achieve such control).

More specifically, for example, in the period in which Sig_n1=1, if as a result of Vfb<Vref the potential of the signal Sig_5c is substantially equal to the output terminal voltage VS, the logic circuit 540 controls the switching circuit 30 such that the path between the lines LN_VCC and LN_VB conducts. Thus, the charge current of the bootstrap capacitor CB passes from the control supply line LN_VCC toward the boot voltage line LN_VB.

Put reversely, in the period in which Sig_n1=1, if as a result of Vfb>Vref the potential of the signal Sig_5c is substantially equal to the boot voltage VB, the logic circuit 540 controls the switching circuit 30 such that the path between the lines LN_VCC and LN_VB is shut off. This shuts off a current from the control supply line LN_VCC toward the boot voltage line LN_VB (i.e., the charge current of the bootstrap capacitor CB).

The gain adjustment circuit 530 can adjust the gain of the feedback loop described above. Specifically, adjusting the resistance value of the resistor 531 permits adjustment of the gain of the feedback loop. Increasing the resistance value of the resistor 531 increases the gain of the feedback loop and decreasing the resistance value of the resistor 531 decreases the gain of the feedback loop. By adjusting the gain of the feedback loop, it is possible to obtain the desired response characteristics with respect to the feedback control of the differential voltage (VB–VS), which corresponds to the charge voltage of the bootstrap capacitor CB.

A fifth embodiment includes Practical Example EX5_1 as described below.

Practical Example EX5_1

Figure 48:
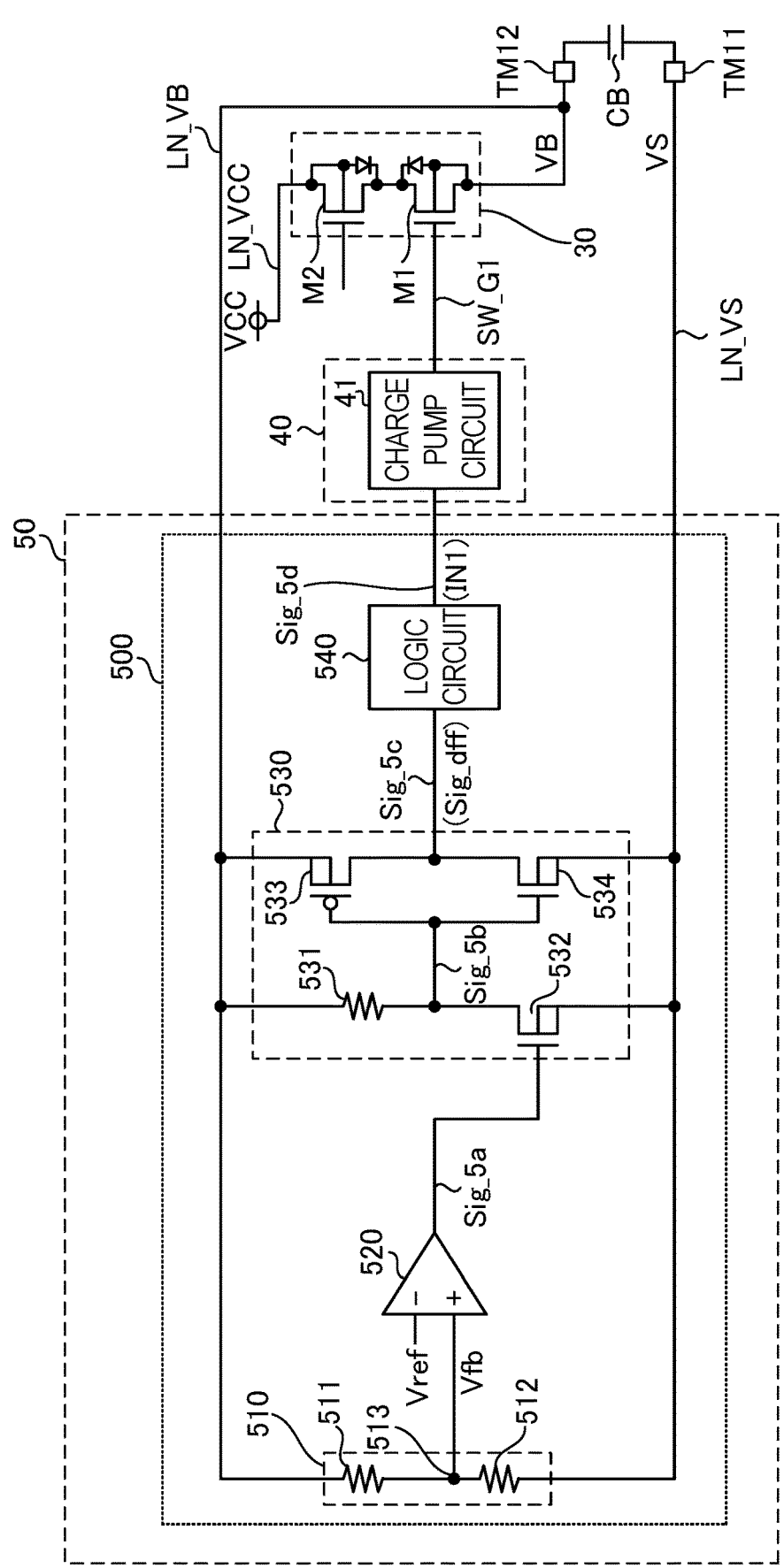
FIG. 48 is a circuit diagram of part of a switching control circuit along with circuits peripheral to it in connection with the fifth embodiment of the present disclosure.

Practical Example EX5_1 will be described. FIG. 48 is a circuit diagram of, in connection with Practical Example EX5_1, part of the switching control circuit 50 along with some circuits peripheral to it. The feedback control circuit 500 shown in FIG. 48 is the same as the one shown in FIG. 47.

In Practical Example EX5_1, it is assumed that, as described in connection with first embodiment, the switching circuit 30 is configured as a series circuit of switching elements M1 and M2 and correspondingly that the switching driver 40 includes the charge pump circuit 41 (see FIG. 6). In Practical Example EX5_1, the control signal Sig_5d output from the logic circuit 540 corresponds to the control signal IN1, and a gate signal SW_G1 corresponding to the control signal IN1 is fed from the charge pump circuit 41 to the gate of the transistor M1. The transistor M2 is controlled in a similar manner as described previously in connection with first embodiment etc. The following description focuses on the control of the transistor M1.

Figure 49:
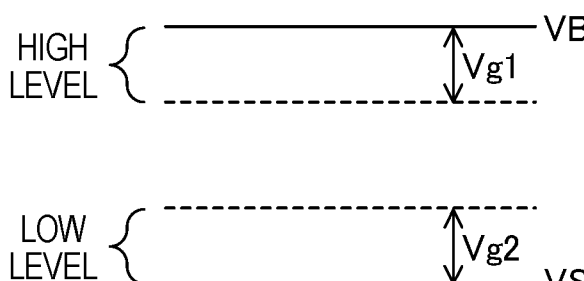
FIG. 49 is a diagram illustrating the high and low levels of a signal in connection with the fifth embodiment of the present disclosure.

The feedback voltage generation circuit 510, the comparator 520, and the gain adjustment circuit 530 in FIG. 48 are understood to constitute the differential voltage detection circuit 53 in FIG. 6. In this case, the signal Sig_5c corresponds to the differential voltage detection signal Sig_dff. Here (see FIG. 49), if the potential of the signal Sig_5c is higher than the potential of the voltage (VB−Vg1), the signal Sig_5c is classified as high level and has the value "1" and, if the potential of the signal Sig_5c is lower than the potential of the voltage (VS+Vg2), the signal Sig_5c is classified as low level and has the value "0". Here, Vg1>0, Vg2>0, and Vg1+Vg2<Vth_dff.

If Sig_p1=1, that is, if the value of the high voltage detection signal Sig_p1 is "1", regardless of the feedback voltage Vfb (hence regardless of the signals Sig_5a, Sig_5b, and Sig_5c), the switching control circuit 50 (logic circuit 540) keeps the control signal Sig_5d (IN1) at high level to suspend the first charge pump operation by the CP circuit 41 and thereby keeps the transistor M1 off. In addition, if Sig_p2=1, the switching control circuit 50 keeps the control signal IN2 (not shown in FIG. 48) at high level to suspend the second charge pump operation by the CP circuit 42 (not shown in FIG. 48) and thereby keeps the transistor M2 off (see FIGS. 12 and 14). Thus, if Sig_p1=1 (i.e., if the output terminal voltage VS is higher than the positive threshold voltage Vth_p), a current from the boot voltage line LN_VB toward the control supply line LN_VCC (i.e., the discharge current of the bootstrap capacitor CB) is suppressed and shut off.

If (Sig_n1, Sig_p1)=(0, 0), that is, if the values of the detection signals Sig_n1 and Sig_p1 are both "0", the switching control circuit 50 (logic circuit 540) keeps the control signal Sig_5d (IN1) at low level to make the CP circuit 41 perform the first charge pump operation and thereby keeps the transistor M1 on. In the low-side-on period $P_{LON}$, (Sig_n1, Sig_p1)=(0, 0) (except immediately after the transition from the both-off period $P_{DD1}$ to the low-side-on period $P_{LON}$). In addition, if (Sig_n1, Sig_p1)=(0, 0), the switching control circuit 50 keeps the control signal IN2 (not shown in FIG. 48) at low level to make the CP circuit 42 (not shown in FIG. 48) perform the second charge pump operation and thereby keeps the transistor M2 on (see FIGS. 12 and 14). Thus, if (Sig_n1, Sig_p1)=(0, 0), the passage of a current between lines LN_VCC and LN_VB is permitted and a low current is expected to pass from the control supply line LN_VCC to the boot voltage line LN_VB.

If Sig_n1=1, that is, if the value of the negative voltage detection signal Sig_n1 is "1", the switching control circuit 50 (logic circuit 540) switches the transistor M1 between on and off according to the differential voltage (VB−VS) and thereby stabilizes the differential voltage (VB−VS).

Specifically, in the period in which Sig_n1=1, if as a result of Vfb<Vref the signal Sig_5c is at low level, the logic circuit 540 keeps the control signal Sig_5d (IN1) at low level to make the CP circuit 41 perform the first charge pump operation and thereby keeps the transistor M1 on. This permits the charge current of the capacitor CB to pass from the control supply line LN_VCC toward the boot voltage line LN_VB.

In the period in which Sig_n1=1, if as a result of Vfb>Vref the signal Sig_5c is at high level, the logic circuit 540 keeps the control signal Sig_5d (IN1) at high level to suspend the first charge pump operation by the CP circuit 41 and thereby keeps the transistor M1 off. This suppresses overcharging of the capacitor CB.

In the period in which Sig_n1=1, it is expected that Sig_n2=1. How the transistor M2 is controlled, including how it is controlled in the period in which Sig_n2=1, is as described previously in connection with the other embodiments.

Raising the gain of the feedback loop described above, that is, increasing the resistance value of the resistor 531, results in increasing the variation of the signal Sig_5c with respect to the unit variation of the feedback voltage Vfb, and eventually results in raising the sensitivity of the feedback control with respect to the variation of the feedback voltage Vfb. By contrast, lowering the gain of the feedback loop described above, that is, decreasing the resistance value of the resistor 531, results in lowering the variation of the signal Sig_5c with respect to the unit variation of the feedback voltage Vfb, and eventually results in lowering the sensitivity of the feedback control with respect to the variation of the feedback voltage Vfb.

Figure 50:
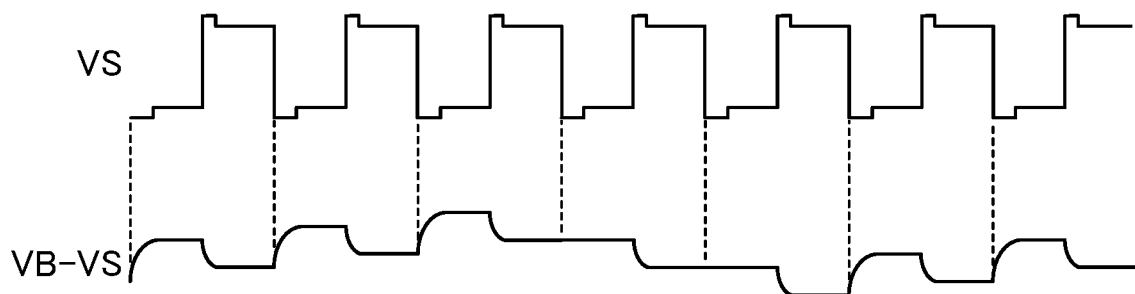
FIG. 50 is a diagram showing an example of the relationship among an output terminal voltage and a differential voltage between the output terminal voltage and a boot voltage in connection with the fifth embodiment of the present disclosure.
Figure 51:
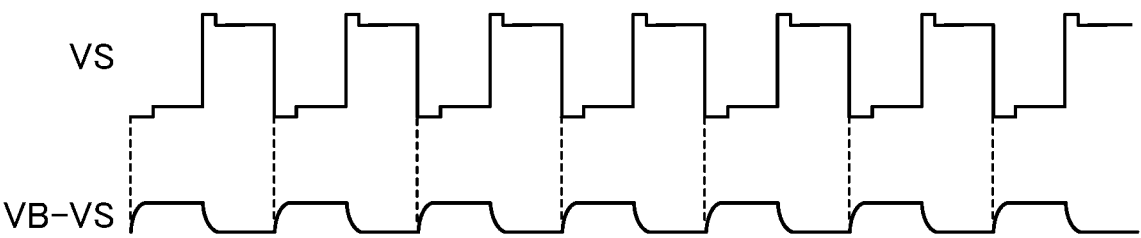
FIG. 51 is a diagram showing an example of the relationship among an output terminal voltage and a differential voltage between the output terminal voltage and a boot voltage in connection with the fifth embodiment of the present disclosure.

FIG. 50 shows an example of the relationship between the output terminal voltage VS and the differential voltage (VB−VS) as observed when the gain of the feedback loop equals a gain G1, and FIG. 51 shows an example of the relationship between the output terminal voltage VS and the differential voltage (VB−VS) as observed when the gain of the feedback loop equals a gain G2. Here, G1>G2.

Raising the gain of the feedback loop gives the signal Sig_5c a sufficiently low potential when (VB−VS)<Vth_dff, and the sufficiently low potential of the signal Sig_5c gives the control signal IN1 a sufficiently low potential. This gives the gate signal SW_G1 a sufficiently high potential, permitting the transistor M1 to be on with a low on resistance.

While it depends on the response speed of the feedback loop and the hysteresis characteristics of the comparator 520, it is also possible to obtain operation characteristics as follows: when the gain of the feedback loop equals the gain G1, as shown in FIG. 50, after the differential voltage (VB−VS) has sufficiently exceeded the threshold voltage Vth_dff, for one cycle of variation of the output terminal voltage VS or longer, the capacitor CB is left uncharged in the period in which Sig_n1=1; after that, the capacitor CB restarts to be charged in the period in which Sig_n1=1. This type of operation characteristics is suitable, for example, in a case where priority is given to sufficiently raising the differential voltage (VB−VS) to drive the output transistor MH with as low an on resistance as possible.

Lowering the gain of the feedback loop from the gain G1 to the gain G2 results in smaller variation of the signals Sig_5b and Sig_5c with respect to the variation of the feedback voltage Vfb. As a result, when the gain of the feedback loop equals the gain G2, as the feedback voltage Vfb rises and falls across the reference voltage Vref, the signal Sig_5c can be kept at a medium potential. The medium potential refers to a potential between high and low levels that is not classified as either high or low level.

In the period in which Sig_n1=1, if the signal Sig_5c has the medium potential, the control signal IN1, not falling down to low level, too has a medium potential (e.g., the average potential of the boot voltage VB and the output terminal voltage VS); thus, the transistor M1 is on with a comparatively high on resistance. Consequently, in the period in which Sig_n1=1, the charge current of the capacitor CB is accordingly low, and this provides operation characteristics (corresponding to FIG. 51) such that the bootstrap capacitor CB is charged little by little in each cycle of variation of the output terminal voltage VS. This type of operation characteristics is suitable, for example, in a case where priority is given to minimizing the width of variation of the differential voltage (VB−VS) (only a small margin is tolerated in the withstand voltage of the output transistor MH).

<<Modifications Etc.>>

To follow is a description of application examples, modified examples, and the like that are applicable to the embodiments described above.

While the above description deals with a configuration (see FIG. 1) where, in the semiconductor device 1, the driving control signals HIN and LIN are received from the MPU 2, the driving control signals HIN and LIN may be signals that are generated within the semiconductor device 1.

The control supply voltage VCC may be a voltage that is generated within the semiconductor device 1 based on a supply voltage fed to the semiconductor device 1 from outside (i.e., a supply voltage other than the control supply voltage VCC, e.g., the supply voltage VP or any other unillustrated supply voltage). In that case, the control supply terminal TM14 shown in FIG. 1 can be, instead of an external terminal, an internal terminal provided within the semiconductor device 1

The semiconductor device 1 can be used to drive a three-phases motor. In that case, the three-phase coils in the three-phase motor can be connected, as a three-phase load LD, to the semiconductor device 1, and the semiconductor device 1 can be provided with circuits corresponding to three phases for driving the three-phase load LD.

For any signal or voltage, the relationship of its high and low levels may be reversed unless inconsistent with what is disclosed herein.

The channel type of any of the FETs (field-effect transistors) presented in the embodiments is merely illustrative: the channel type of any FET may be changed between a P-channel type and an N-channel types unless inconsistent with what is disclosed herein.

Unless incompatible, any transistor mentioned above can be a transistor of any type. For example, unless incompatible, any transistor mentioned above as a MOSFET can be replaced with a junction FET, IGBT (insulated-gate bipolar transistor), or bipolar transistor. Any transistor has a first electrode, a second electrode, and a control electrode. In an FET, of the first and second electrodes one is the drain and the other is the source, and the control electrode is the gate. In an IGBT, of the first and second electrodes one is the collector and the other is the emitter, and the control electrode is the gate. In a bipolar transistor that is not classified as an IGBT, of the first and second electrodes one is the collector and the other is the emitter, and the control electrode is the base.

Embodiments of the present disclosure allow for any modifications as necessary within the scope of technical ideas recited in the appended claims. The embodiments described above are merely examples of implementing the present disclosure, and what is meant by any of the terms used to describe what is disclosed herein and the components of it is not limited to that mentioned in connection with the embodiments. The specific values mentioned in the above description are merely illustrative and needless to say can be modified to different values.

To follow are notes on the present disclosure of which specific examples of implementation have been described above by way of embodiments.

<<Notes 1>>

According to a first aspect of the present disclosure, a semiconductor device (the first embodiment; see FIGS. 1 and 6) includes: a first output transistor (MH); a second output transistor (ML) connected, at the low-potential side of the first output transistor, in series with the first output transistor; a first terminal (TM11) connected to the connection node between the first and second output transistors; a second terminal (TM12) configured to be connected via a bootstrap capacitor (CB) to the first terminal; a first driver (10) configured to drive the first output transistor based on the voltage between the first and second terminals; a second driver (20) configured to drive the second output transistor; a first switching element (M1) configured with an N-channel MOSFET having a source connected to the second terminal; a second switching element (M2) configured with an N-channel MOSFET having a source fed with a predetermined control supply voltage (VCC) and a drain connected to the drain of the first switching element; and a switching control circuit (50) configured to turn the first and second switching elements on or off according to the voltage (VS) at the first terminal. (Hereinafter referred to as Configuration $W_{A1}$.)

It is thus possible to properly control the charge voltage of the bootstrap capacitor. Specifically, for example, if the bootstrap capacitor is overcharged, the withstand voltage of the first output transistor may be exceeded; the above configuration suppresses overcharging of the bootstrap capacitor, and this permits the first output transistor to be driven safely and properly.

In the semiconductor device of Configuration $W_{A1}$ described above (see FIGS. 11 and 12), when the voltage (VS) at the first terminal has a negative polarity, the switching control circuit may switch the first switching element between on and off according to the differential voltage (VB−VS) between the first and second terminals relative to the potential at the first terminal. (Hereinafter referred to as Configuration $W_{A2}$.)

When the voltage (VS) at the first terminal has a negative polarity, a high charge current can be supplied to the bootstrap capacitor. However, if in the period in which the voltage (VS) at the first terminal has a negative polarity the charge current is constantly supplied to the bootstrap capacitor, the bootstrap capacitor may be overcharged. By switching the first switching element between on and off according to the differential voltage mentioned above, it is possible to suppress overcharging of the bootstrap capacitor.

In the semiconductor device of Configuration $W_{A2}$ described above (see FIGS. 11 and 12), when the voltage (VS) at the first terminal has a negative polarity, the switching control circuit may keep the first switching element on if the differential voltage is lower than a predetermined voltage (Vth_dff) and keep the first switching element off if the differential voltage is higher than the predetermined voltage. (Hereinafter referred to as Configuration $W_{A3}$.)

It is thus possible to suppress charging of the bootstrap capacitor over the predetermined voltage. That is, it is possible to suppress overcharging of the bootstrap capacitor.

In the semiconductor device of any of Configurations $W_{A1}$ to $W_{A3}$ described above (see FIG. 12), the switching control circuit may keep the second switching element off if the voltage (VS) at the first terminal is higher than a positive threshold voltage. (Hereinafter referred to as Configuration $W_{A4}$.)

It is thus possible to suppress discharging of the bootstrap capacitor via the first and second switching elements.

In the semiconductor device of any of Configurations $W_{A1}$ to $W_{A4}$ described above (see FIG. 12), the switching control circuit may keep the first and second switching elements on if the first output transistor is off and the second output transistor is on. (Hereinafter referred to as Configuration $W_{A5}$.)

It is then possible, in the period in which the first output transistor is off and the second output transistor is on, to supply the necessary current to the bootstrap capacitor. In the period in which the first output transistor is off and the second output transistor is on, the current that passes through the bootstrap capacitor is comparatively low. Thus, there is no risk of the bootstrap capacitor being overcharged with the current in this period.

The semiconductor device of any of Configurations $W_{A1}$ to $W_{A5}$ described above (see FIG. 6) may further include: a first charge pump circuit (41) that has a first output node (OUT1) and that is capable of generating at the first output node a first boosted voltage higher than the voltage at the second terminal by performing first charge pump operation based on the voltage at the second terminal relative to the potential at the first terminal; and a second charge pump circuit (42) that has a second output node (OUT2) and that is capable of generating at the second output node a second boosted voltage higher than the control supply voltage by performing second charge pump operation based on the control supply voltage relative to a ground potential. The first output node may be connected to the gate of the first switching element. The second output node may be connected to a gate of the second switching element. The switching control circuit may turn the first switching element on by making the first charge pump circuit perform the first charge pump operation and turn the second switching element on by making the second charge pump circuit perform the second charge pump operation. (Hereinafter referred to as Configuration $W_{A6}$.)

It is thus possible to properly drive the first and second switching elements.

In the semiconductor device of any of Configurations $W_{A1}$ to $W_{A6}$ described above, the second output transistor may be provided between the first terminal and a reference conductor at a ground potential. (Hereinafter referred to as Configuration $W_{A2}$.)

<<Notes 2>>

According to a second aspect of the present disclosure, a semiconductor device (the second embodiment; see FIGS. 14 to 18) includes: a first line (LN_VS) configured to be fed with a target voltage (VS) of which the polarity changes; a second line (LN_VB) configured to be connected via a capacitor (CB; see FIG. 1) to the first line; a ground line (LN_GND) configured to be fed with a ground potential; a control supply line (LN_VCC) configured to be fed with a positive control supply voltage (VCC); and a negative voltage detection circuit (51) that is connected to the first line, the second line, the ground line, and the control supply line and that is configured to detect whether the polarity of the target voltage is negative. The negative voltage detection circuit includes a current path (CP_ngnd) between the second line and the ground line, and a current in the direction corresponding the polarity of the target voltage passes across the current path. The negative voltage detection circuit is configured to, based on the direction of the current in the current path, output, as signals indicating the result of the detection a first detection signal (Sig_n1) relative to the potential on the first line and a second detection signal (Sig_n2) relative to the ground potential. (Hereinafter referred to as Configuration $W_{B1}$.)

In a semiconductor device, it is often necessary to detect whether a given target voltage has a negative polarity and it is occasionally necessary to use a plurality of detection signals relative to a plurality of potentials. Such a situation can be coped with by first generating a first detection signal relative to one potential and then generating, using a level shifter fed with the first detection signal, a second detection signal relative to another potential. However, in a case where the target voltage varies in may ways, it is difficult to build a level shifter that generates the second detection signal from the first detection signal. With the semiconductor device of Configuration $W_{B1}$, it is possible to meet the requirements mentioned above.

In the semiconductor device of Configuration $W_{B1}$ described above, the negative voltage detection circuit may be configured to output the first and second detection signals simultaneously. (Hereinafter referred to as Configuration $W_{B2}$.)

While a configuration is possible where one state requires only the first detection signal and another state requires only the second detection signal, a configuration is also possible that requires simultaneous output of the first and second detection signals. With the semiconductor device of Configuration $W_{B2}$, it is possible to meet the requirement for simultaneous output of the first and second detection signals.

In the semiconductor device of Configuration $W_{B1}$ or $W_{B2}$ described above (see FIG. 16), the negative voltage detection circuit may include: a reference current path (CP_ngnd) as the current path; another current path (CP_nvs) provided between the second line and the first line; a current mirror circuit (210) composed of a first current mirror transistor (211) inserted in the other current path and a second current mirror transistor (212) inserted in the reference current path; a first detection signal generation circuit (220) configured to generate the first detection signal (Sig_n1) based on the current in the other current path; and a second detection signal generation circuit (230) configured to generate the second detection signal (Sig_n2) based on the current in the reference current path. (Hereinafter referred to as Configuration $W_{B3}$.)

It is thus possible to properly generate the first and second detection signals.

In the semiconductor device of Configuration $W_{B3}$ described above, a potential higher than that on the first line may be applied to the second line. In the semiconductor device, transitions may take place from a first period (corresponding to state ST_n1 in FIG. 19) where the target voltage is a positive voltage, through a second period (corresponding state ST_n2a in FIG. 19 and state ST_n2b in FIG. 20) where the target voltage falls from the positive voltage toward a negative voltage, to a third period (corresponding to state ST_n3 in FIG. 20) where the target voltage is the negative voltage. In the first period, a current may pass across the reference current path from the second line toward to the ground line so that the second detection signal generation circuit generates the second detection signal with a first value (in the example in FIG. 19, corresponding to a low-level signal Sig_n2) and in addition a current may pass across the other current path from the second line toward the first line so that the first detection signal generation circuit generates the first detection signal with the first value (in the example in FIG. 19, corresponding to a low-level signal Sig_n1). In the third period, a current may pass across the reference current path from the ground line toward the second line so that the second detection signal generation circuit generates the second detection signal with a second value (in the example in FIG. 20, corresponding to a high-level signal Sig_n2) and in addition, in the other current path, the first current mirror transistor is off so that the first detection signal generation circuit generates the first detection signal with the second value (in the example in FIG. 20, corresponding to a high-level signal Sig_n1). In the second period, the values of the first and second detection signals may each switch from the first value (e.g., corresponding to low level) to the second value (e.g., corresponding to high level). (Hereinafter referred to as Configuration $W_{B4}$.)

It is thus possible to properly generate the first and second detection signals.

In the semiconductor device of Configuration $W_{B4}$ described above, the first detection signal generation circuit may include: a first resistor unit (221 and 222) that is provided in series with the first current mirror transistor (211) in the other current path and that is inserted between a predetermined first node (n1_pre) and the first line; and a first binarizing circuit (224 and 225) configured to generate the first detection signal (Sig_n1) by binarizing the voltage at the first node relative to the potential on the first line. The second detection signal generation circuit may include: a second resistor unit (232) that is provided in series with the second current mirror transistor (212) in the reference current path and that is inserted between a predetermined second node (n2_pre) and the ground line; and a second binarizing circuit (233 and 234) configured to generate the second detection signal (Sig_n2) by binarizing the voltage at the second node relative to the potential on the ground line. (Hereinafter referred to as Configuration $W_{B5}$.)

It is thus possible to properly generate the first and second detection signals.

In the semiconductor device of Configuration $W_{B5}$ described above, the first detection signal generation circuit may include an adjustment circuit (223) for adjusting the resistance value between the first node and the first line, and may be configured to vary the resistance value between the first node and the first line according to whether the target voltage is higher than a positive threshold voltage. (Hereinafter referred to as Configuration $W_{B6}$.)

It is then possible, in the period in which the polarity of the target voltage is not negative, even if the target voltage is relatively high (corresponding to state ST_n1) or relatively low (corresponding to state ST_n4), to generate a first detection signal that indicates the correct detection result. It is also possible, during a transient response based on variation of the target voltage, to change the resistance value between the first node and the first line and thereby reduce the delay in detection.

In the semiconductor device of Configuration $W_{B6}$ described above, in the semiconductor device, transitions may take place from the first period, through the second period, to the third period, and then through a fourth period (corresponding to state ST_n4 in FIG. 21), to a fifth period (corresponding to state ST_n5), then returning to the first period, and this sequence may be repeated. In the fourth period, the target voltage may be a particular voltage (e.g., 0 V) that is lower than the positive voltage in the first period and that is higher than the negative voltage in the third period. The fifth period may be a period in which the target voltage is in the process of increasing from the particular voltage toward the positive voltage. In response to the transition from the third period to the fourth period, the values of the first and second detection signals may each switch from the second value (e.g., corresponding to high level) to the first value (e.g., corresponding to low level). In the fourth and fifth periods, the values of the first and second detection signals may each be kept equal to the first value (e.g., corresponding to low level). In the fourth period, a current may pass across the reference current path from the second line toward to the ground line so that the second detection signal generation circuit generates the second detection signal with the first value (in the example in FIG. 21, corresponding to a low-level signal Sig_n2) and in addition a current may pass across the other current path from the second line toward the first line so that the first detection signal generation circuit generates the first detection signal with the first value (in the example in FIG. 21, corresponding to a low-level signal Sig_n1). The magnitude of the current that passes across the reference current path may be lower in the fourth period than in the first period, and the magnitude of the current that passes across the other current path may be lower in the fourth period than in the first period. In the first period, the target voltage may be higher than the positive threshold voltage and, in the fourth period, the target voltage may be lower than the positive threshold voltage. Using the adjustment circuit, the first detection signal generation circuit may increase the resistance value between the first node and the first line in the fourth period as compared with in the first period. (Hereinafter referred to as Configuration $W_{B7}$.)

It is then possible, in the period in which the polarity of the target voltage is not negative, even if the target voltage is relatively high (corresponding to state ST_n1) or relatively low (corresponding to state ST_n4), to generate a first detection signal that indicates the correct detection result. It is also possible, during a transient response based on variation of the target voltage, to change the resistance value between the first node and the first line and thereby reduce the delay in detection.

In the semiconductor device of any of Configurations $W_{S5}$ to $W_{B7}$ described above, the first and second current mirror transistors may be a first MOSFET (211) and a second MOSFET (212), both of a P-channel type, of which the sources are connected together at the second line and of which the gates are connected together. A resistor (251) may be provided between the gates and the sources of the first and second MOSFETs, and the drain of the first MOSFET may be connected via the first resistor unit to the first line along the other current path. (Hereinafter referred to as Configuration $W_{B8}$.)

In the semiconductor device of any of Configurations $W_{S5}$ to $W_{B7}$ described above, the first and second current mirror transistors may be a first MOSFET (211) and a second MOSFET (212), both of a P-channel type, of which the sources are connected together at the second line and of which the gates are connected together. A resistor (251) may be provided between the gates and the sources of the first and second MOSFETs, and the drain of the first MOSFET may be connected via the first resistor unit to the first line along the other current path. The second detection signal generation circuit may include a third MOSFET (231) of an N-channel type that has a gate fed with the control supply voltage and a source connected to the second node. The drain of the second MOSFET may be connected via a resistor (240) to the drain of the third MOSFET along the reference current path. (Hereinafter referred to as Configuration $W_{B9}$.)

In the semiconductor device of any of Configurations $W_{B1}$ to $W_{B9}$ described above, the semiconductor device may include: a first output transistor (MH); and a second output transistor (ML) connected, at the low-potential side of the first output transistor, in series with the first output transistor. The first line (LN_VS) may be connected to the connection node between the first and second output transistors. The semiconductor device may include: a first driver (10) configured to drive the first output transistor based on the voltage between the first and second lines; a second driver (20) configured to drive the second output transistor; a first switching element (M1) configured with an N-channel MOSFET having a source connected to the second line; a second switching element (M2) configured with an N-channel MOSFET having a source fed with the control supply voltage (VCC) and a drain connected to the drain of the first switching element; and a switching control circuit (50) configured to control the first and second switching elements on or off according to the voltage (VS) on the first line. The switching control circuit may perform the above control according to whether the polarity of the target voltage is negative and whether the target voltage is higher than a positive threshold voltage. (Hereinafter referred to as Configuration $W_{B10}$.)

<<Notes 3>>

According to a third aspect of the present disclosure, a semiconductor device (the third embodiment; see FIGS. 14 and 26 to 29) includes: a first line (LN_VS) configured to be fed with a target voltage (VS) that varies; a second line (LN_VB) configured to be connected via a capacitor (CB) to the first line; a ground line (LN_GND) configured to be fed with a ground potential; a control supply line (LN_VCC) configured to be fed with a positive control supply voltage (VCC); and a high voltage detection circuit (52) that is connected to the first line, the second line, the ground line, and the control supply line and that is configured to detect whether the target voltage is higher than a positive threshold voltage (Vth_p). The high voltage detection circuit includes a current path (CP_pgnd) between the second line and the ground line. The magnitude of a current in the current path, and whether a current is present there, depend on the target voltage. The high voltage detection circuit is configured to, based on the current in the current path, output, as signals indicating the result of the detection, a first detection signal (Sig_p1) relative to the potential on the first line and a second detection signal (Sig_p2) relative to the ground potential. (Hereinafter referred to as Configuration $W_{C1}$.)

In a semiconductor device, it is often necessary to detect whether a given target voltage is higher than a positive threshold voltage and it is occasionally necessary to use a plurality of detection signals relative to a plurality of potentials. Such a situation can be coped with by first generating a first detection signal relative to one potential and then generating, using a level shifter fed with the first detection signal, a second detection signal relative to another potential. However, in a case where the target voltage varies in may ways, it is difficult to build a level shifter that generates the second detection signal from the first detection signal. With the semiconductor device of Configuration $W_{C1}$, it is possible to meet the requirements mentioned above.

In the semiconductor device of Configuration $W_{C1}$ described above, the high voltage detection circuit may be configured to output the first and second detection signals simultaneously. (Hereinafter referred to as Configuration $W_{C2}$.)

While a configuration is possible where one state requires only the first detection signal and another state requires only the second detection signal, a configuration is also possible that requires simultaneous output of the first and second detection signals. With the semiconductor device of Configuration $W_{C2}$, it is possible to meet the requirement for simultaneous output of the first and second detection signals.

In the semiconductor device of Configuration $W_{C1}$ or $W_{C2}$ described above (see FIG. 27), the high voltage detection circuit may include: a reference current path (CP_pgnd) as the current path; another current path (CP_pvs) provided between the second line and the first line; a current mirror circuit (310) composed of a first current mirror transistor (311) inserted in the other current path and a second current mirror transistor (312) inserted in the reference current path; a first detection signal generation circuit (320) configured to generate the first detection signal (Sig_p1) based on the current in the other current path; and a second detection signal generation circuit (330) configured to generate the second detection signal (Sig_p2) based on the current in the reference current path. (Hereinafter referred to as Configuration $W_{C3}$.)

It is thus possible to properly generate the first and second detection signals.

In the semiconductor device of Configuration $W_{C3}$ described above, a potential higher than that on the first line may be applied to the second line. In the semiconductor device, transitions may take place from a first period (corresponding to state ST_p1 in FIG. 30) where the target voltage is a particular voltage (e.g. 0 V) lower than the positive threshold voltage, through a second period (corresponding state ST_p2 in FIG. 30) where the target voltage is in the process of increasing from the particular voltage, to a third period (corresponding to state ST_p3 in FIG. 31) where the target voltage is higher than the positive threshold voltage. In the first period, a potential higher than the ground potential may be applied to the second line. A current limiter (340) that suppresses occurrence of a current in the reference current path in the first period may be provided in series with the second current mirror transistor (see state ST_p1 in FIG. 30). In the first period, the current limiter may suppress occurrence of the current in the reference current path so that the second detection signal generation circuit generates the second detection signal with a first value (in the example in FIG. 30, corresponding to a low-level signal Sig_p2) and in addition, in the other current path, the first current mirror transistor may be off so that the first detection signal generation circuit generates the first detection signal with the first value (in the example in FIG. 30, corresponding to a low-level signal Sig_p1). In the third period, a current may pass across the reference current path from the second line toward to the ground line so that the second detection signal generation circuit generates the second detection signal with a second value (in the example in FIG. 31, corresponding to a high-level signal Sig_p2) and in addition a current may pass across the other current path from the second line toward the first line so that the first detection signal generation circuit generates the first detection signal with the second value (in the example in FIG. 31, corresponding to a high-level signal Sig_p1). In the second period, the values of the first and second detection signals may each switch from the first value (e.g., corresponding to low level) to the second value (e.g., corresponding to high level). (Hereinafter referred to as Configuration $W_{C4}$.)

It is thus possible to properly generate the first and second detection signals.

In the semiconductor device of Configuration $W_{C4}$ described above, the first detection signal generation circuit may include: a first resistor unit (321 and 322) that is provided in series with the first current mirror transistor (311) in the other current path and that is inserted between a predetermined first node (p1_pre) and the first line; and a first binarizing circuit (324 to 327) configured to generate the first detection signal (Sig_p1) by binarizing the voltage at the first node relative to the potential on the first line. The second detection signal generation circuit may include: a second resistor unit (332) that is provided in series with the second current mirror transistor (312) in the reference current path and that is inserted between a predetermined second node (p2_pre) and the ground line; and a second binarizing circuit (333, 334, 337, and 338) configured to generate the second detection signal (Sig_p2) by binarizing the voltage at the second node relative to the potential on the ground line. (Hereinafter referred to as Configuration $W_{C5}$.)

It is thus possible to properly generate the first and second detection signals.

In the semiconductor device of Configuration $W_{C5}$ described above, the first detection signal generation circuit may include an adjustment circuit (323) for adjusting the resistance value between the first node and the first line, and may vary the resistance value between the first node and the first line according to whether the target voltage has a negative polarity. (Hereinafter referred to as Configuration $W_{C6}$.)

It is then possible, during a transient response based on variation of the target voltage, to change the resistance value between the first node and the first line and thereby reduce the delay in detection.

In the semiconductor device of Configuration $W_{C6}$ described above, in the semiconductor device, transitions may take place from the first period, through the second period, to the third period, and then through a fourth period (corresponding to state ST_p4a in FIG. 31 and state ST_p4b in FIG. 32), to a fifth period (corresponding to state ST_p5 in FIG. 32), then returning to the first period, and this sequence may be repeated. The fourth period may be a period in which the target voltage is in the process of falling from higher than the positive threshold voltage toward a negative voltage. In the fifth period, the target voltage may be the negative voltage. In the fourth period, the values of the first and second detection signals may each switch from the second value (e.g., corresponding to high level) to the first value (e.g., corresponding to low level). In the fifth period, the values of the first and second detection signals may each be kept equal to the first value (e.g., corresponding to low level). When the target voltage has a negative polarity, the first current mirror transistor may be off. Using the adjustment circuit, the first detection signal generation circuit may decrease the resistance value between the first node and the first line when the target voltage has a negative polarity as compared with when the target voltage has a positive polarity. (Hereinafter referred to as Configuration $W_{C7}$.)

It is then possible, during a transient response based on variation of the target voltage, to change the resistance value between the first node and the first line and thereby reduce the delay in detection.

In the semiconductor device of any of Configurations $W_{C5}$ to $W_{C7}$ described above, the first and second current mirror transistors may be a first MOSFET (311) and a second MOSFET (312), both of a P-channel type, of which the sources are connected together at the second line and of which the gates are connected together. A resistor (351) may be provided between the gates and the sources of the first and second MOSFETs, and the drain of the first MOSFET may be connected via the first resistor unit to the first line along the other current path. (Hereinafter referred to as Configuration $W_{C8}$.)

In the semiconductor device of any of Configurations $W_{C8}$ to $W_{C7}$ described above, the first and second current mirror transistors may be a first MOSFET (311) and a second MOSFET (312), both of a P-channel type, of which the sources are connected together at the second line and of which the gates are connected together. A resistor (351) may be provided between the gates and the sources of the first and second MOSFETs, and the drain of the first MOSFET may be connected via the first resistor unit to the first line along the other current path. The second detection signal generation circuit may include a third MOSFET (331) of an N-channel type that has a gate fed with the control supply voltage and a source connected to the second node. The drain of the second MOSFET may be connected via the current limiter (340) to the drain of the third MOSFET along the reference current path. (Hereinafter referred to as Configuration $W_{C9}$.)

In the semiconductor device of any of Configurations $W_{C1}$ to $W_{C9}$ described above, the semiconductor device may include: a first output transistor (MH); and a second output transistor (ML) connected, at the low-potential side of the first output transistor, in series with the first output transistor. The first line may be connected to the connection node between the first and second output transistors. The semiconductor device may include: a first driver (10) configured to drive the first output transistor based on the voltage between the first and second lines; a second driver (20) configured to drive the second output transistor; a first switching element (M1) configured with an N-channel MOSFET having a source connected to the second line; a second switching element (M2) configured with an N-channel MOSFET having a source fed with the control supply voltage (VCC) and a drain connected to the drain of the first switching element; and a switching control circuit (50) configured to control the first and second switching elements on or off according to the voltage (VS) on the first line. The switching control circuit performs the above control according to whether the target voltage is higher than the positive threshold voltage and whether the polarity of the target voltage is negative. (Hereinafter referred to as Configuration $W_{C10}$.)

<<Notes 4>>

According to a fourth aspect of the present disclosure, a charge pump circuit (the fourth embodiment; see FIG. 37 or 46) includes: a voltage supply circuit (INV0) configured to supply a first line (LN1) with a first voltage (V1) or a second voltage (V2) higher than the first voltage based on a control signal (INx) fed in; a first capacitor (C1) provided between the first line (LN1) and a second line (LN2); a first switching element (421) provided between the second line (LN2) and a third line (LN3); a second capacitor (C2) provided between the third line (LN3) and an output line (LNout); a first rectifying element (431 or 431') provided between a supply line (LN_V2) fed with the second voltage (V2) and the second line; a second rectifying element (432 or 432') provided between the second line and the output line or between the supply line and the output line; and a second switching element (422 or 422') that has a first electrode connected to the third line and a second electrode and that is configured to, when the first line is fed with the first voltage (V1), make the path between the first and second electrodes conduct to feed the first voltage (V1) fed to the second electrode to the third line and, when the first line is fed with the second voltage (V2), shut off the path between the first and second electrodes. The first rectifying element (431 or 431') includes a first diode having a cathode connected to the second line, and the second rectifying element (432 or 432') includes a second diode having a cathode connected to the output line. The first switching element (421) is a switching element that turns on and off based on a differential voltage between the voltage (Vc) on the second line and the second voltage (V2), and turns on in response to a rise of the voltage on the first line from the first voltage (V1) to the second voltage (V2). (Hereinafter referred to as Configuration W$_{D1}$.)

It is thus possible to perform desired voltage boosting with a simple configuration (e.g., with a small number of elements).

In the charge pump circuit of Configuration W$_{D1}$ described above (see FIG. 37 or 46), the first switching element may be configured with a P-channel MOSFET (421). The MOSFET as the first switching element may have a source connected to the second line, a gate connected to the supply line, and a drain connected to the third line. (Hereinafter referred to as Configuration W$_{D2}$.)

In the charge pump circuit of Configuration W$_{D1}$ or W$_{D2}$ described above (see FIG. 37), the second switching element may be configured with an N-channel MOSFET (422). The MOSFET as the second switching element may have a drain serving as the first electrode and connected to the third line, a source serving as the second electrode and connected to the first line, and a gate connected to the supply line. (Hereinafter referred to as Configuration W$_{D3}$.)

It is thus possible to keep low the withstand voltage required in the second switching element.

The charge pump circuit of any of Configurations W$_{D1}$ to W$_{D3}$ described above (see FIG. 37) may include a first rectifying element inverter circuit (INV1) configured to use the voltage on the second line as the positive-side supply voltage and the voltage on the first line as the negative-side supply voltage and to output the voltage (Va) on the first line or the voltage (Vc) on the second line according to the magnitude relationships between the second voltage and the voltages on the first and second lines. The first rectifying element (431) may be configured with a P-channel MOSFET. The first diode may include the parasitic capacitance of the MOSFET as the first rectifying element. The MOSFET as the first rectifying element may have a source connected to the second line, a drain connected to the supply line, and a gate fed with the output voltage of the first rectifying element inverter circuit. (Hereinafter referred to as Configuration W$_{D4}$.)

It is thus possible, in the period in which the first line is fed with the first voltage, to store an electric charge corresponding to the differential voltage between the first and second voltages in the first capacitor (it is possible to avoid the loss corresponding to the forward voltage of the diode).

The charge pump circuit of any of Configurations W$_{D1}$ to W$_{D4}$ described above (see FIG. 37) may include a second rectifying element inverter circuit (INV2) configured to use the voltage on the output line as the positive-side supply voltage and the voltage on the third line as the negative-side supply voltage and to output the voltage (Vd) on the third line or the voltage (Vout) on the output line according to the magnitude relationships between the voltage on the second line and the voltages on the output and third lines. The second rectifying element (432) may be configured with a P-channel MOSFET. The second diode may include the parasitic capacitance of the MOSFET as the second rectifying element. The MOSFET as the second rectifying element may have a source connected to the output line, a drain connected to the second line, and a gate fed with the output voltage of the second rectifying element inverter circuit. (Hereinafter referred to as Configuration W$_{D5}$.)

It is thus possible, in the period in which the first line is fed with the first voltage, to store an electric charge corresponding to the differential voltage between the first and second voltages in the second capacitor (it is possible to avoid the loss corresponding to the forward voltage of the diode).

In the charge pump circuit of Configuration W$_{D1}$, W$_{D2}$, W$_{D4}$, or W$_{D5}$ described above (see FIG. 46), the second switching element may be configured with an N-channel MOSFET (422'). The MOSFET as the second switching element may have a drain serving as the first electrode and connected to the third line, a source serving as the second electrode and fed with the first voltage, and a gate fed with the control signal. (Hereinafter referred to as Configuration W$_{D6}$.)

In the charge pump circuit of Configuration W$_{D1}$, W$_{D2}$, W$_{D3}$, W$_{D5}$, or W$_{D6}$ described above (see FIG. 46), the first rectifying element may be the first diode (431'), and the anode of the first diode may be connected to the supply line. (Hereinafter referred to as Configuration W$_{D7}$.)

In the charge pump circuit of Configuration W$_{D1}$, W$_{D2}$, W$_{D3}$, W$_{D4}$, W$_{D6}$, or W$_{D7}$ described above (see FIG. 46), the second rectifying element may be the second diode (432'), and the anode of the second diode may be connected to the supply line. (Hereinafter referred to as Configuration W$_{D8}$.)

A semiconductor device including the charge pump circuit of any of Configurations W$_{D1}$ to W$_{D8}$ described above (see FIGS. 1 and 6) may include: a first output transistor (MH); a second output transistor (ML) connected, at the low-potential side of the first output transistor, in series with the first output transistor; a first terminal (TM11) connected to the connection node between the first and second output transistors; a second terminal (TM12) configured to be connected via a bootstrap capacitor (CB) to the first terminal; a first driver (10) configured to drive the first output transistor based on the voltage between the first and second terminals; a second driver (20) configured to drive the second output transistor; a first switching element (M1) configured with an N-channel MOSFET having a source connected to the second terminal; a second switching element (M2) configured with an N-channel MOSFET having a source fed with a predetermined control supply (VCC) and a drain connected to the drain of the first switching element; and a switching control circuit (50) configured to control the first and second switching elements on or off according to the voltage (VS) at the first terminal. The first voltage (V1) may be the voltage (VS) at the first terminal, and the second voltage (V2) may be the voltage (VB) at the second terminal (see FIG. 38). The output line may be connected to the gate of the first switching element. The switching control circuit may be configured to feed the charge pump circuit (41, 401) with the control signal (Inx=IN1) to make the voltage on the first line turn from the first voltage (V1=VS) to the second voltage (V2=VB), thereby to produce on the output line a boosted voltage higher than the voltage at the second terminal and, with the boosted voltage, turn the first switching element on. (Hereinafter referred to as Configuration W$_{D9}$.)

With the semiconductor device of Configuration W$_{D9}$, it is possible to properly control the charge voltage of the bootstrap capacitor. Specifically, for example, if the bootstrap capacitor is overcharged, the withstand voltage of the first output transistor may be exceeded; the semiconductor device of Configuration W$_{D9}$ suppresses overcharging of the bootstrap capacitor, and this permits the first output transistor to be driven safely and properly. In a semiconductor device like this, by using the charge pump circuit of any of Configurations $W_{D1}$ to $W_{D8}$ described above, it is possible to obtain the desired boosted voltage for turning the first switching element on with a simple configuration (e.g., with a small number of elements).

A semiconductor device including the charge pump circuit of any of Configurations $W_{D1}$ to $W_{D8}$ described above (see FIGS. 1 and 6) may include: a first output transistor (MH); a second output transistor (ML) connected, at the low-potential side of the first output transistor, in series with the first output transistor; a first terminal (TM11) connected to the connection node between the first and second output transistors; a second terminal (TM12) configured to be connected via a bootstrap capacitor (CB) to the first terminal; a first driver (10) configured to drive the first output transistor based on the voltage between the first and second terminals; a second driver (20) configured to drive the second output transistor; a first switching element (M1) configured with an N-channel MOSFET having a source connected to the second terminal; a second switching element (M2) configured with an N-channel MOSFET having a source fed with a predetermined control supply voltage (VCC) and a drain connected to the drain of the first switching element; and a switching control circuit (50) configured to control the first and second switching elements on or off according to the voltage (VS) at the first terminal. The second output transistor may be provided between the first terminal and a reference conductor at a ground potential. The first voltage may have the ground potential, and the second voltage may be the control supply voltage (VCC) (see FIG. 39). The output line may be connected to the gate of the second switching element. The switching control circuit may be configured to feed the charge pump circuit (42, 402) with the control signal (Inx=IN2) to make the voltage on the first line turn from the first voltage (V1) to the second voltage (V2=VCC), thereby to produce on the output line a boosted voltage higher than the control supply voltage and, with the boosted voltage, turn the second switching element on. (Hereinafter referred to as Configuration $WD_{10}$.)

With the semiconductor device of Configuration $W_{D10}$, it is possible to properly control the charge voltage of the bootstrap capacitor. Specifically, for example, if the bootstrap capacitor is overcharged, the withstand voltage of the first output transistor may be exceeded; the semiconductor device of Configuration $W_{D10}$ suppresses overcharging of the bootstrap capacitor, and this permits the first output transistor to be driven safely and properly. In a semiconductor device like this, by using the charge pump circuit of any of Configurations $W_{D1}$ to $W_{D8}$, it is possible to obtain the desired boosted voltage for turning the second switching element on with a simple configuration (e.g., with a small number of elements).

<<Notes 5>>

According to a fifth aspect of the present disclosure, a semiconductor device (the fifth embodiment; see FIGS. 1 and 47) includes: a first output transistor (MH); a second output transistor (ML) connected, at the low-potential side of the first output transistor, in series with the first output transistor; a first terminal (TM11) connected to the connection node between the first and second output transistors; a second terminal (TM12) configured to be connected via a bootstrap capacitor (CB) to the first terminal; a first driver (10) configured to drive the first output transistor based on the voltage between the first and second terminals; a second driver (20) configured to drive the second output transistor; a switching circuit (30) provided between a control supply line (LN_VCC) fed with a predetermined control supply voltage (VCC) and the second terminal; and a switching control circuit (50) configured to control the switching circuit based on the voltage between the first and second terminals. (Hereinafter referred to as Configuration $W_{E1}$.)

It is thus possible to properly control the charge voltage of the bootstrap capacitor. Specifically, for example, if the bootstrap capacitor is overcharged, the withstand voltage of the first output transistor may be exceeded; the above configuration suppresses overcharging of the bootstrap capacitor, and this permits the first output transistor to be driven safely and properly.

Specifically, for example, in the semiconductor device of Configuration $W_{E1}$ described above, the switching control circuit may control the switching circuit so as to stabilize the differential voltage (VB−VS) between the first and second terminals. (Hereinafter referred to as Configuration $W_{E2}$.)

More specifically, for example, in the semiconductor device of Configuration $W_{E2}$ described above, the switching control circuit may stabilize the differential voltage by controlling, through the control of the switching circuit, the charging of the bootstrap capacitor via the switching circuit. (Hereinafter referred to as Configuration $W_{E3}$.)

In the semiconductor device of Configuration $W_{E3}$ described above (see FIG. 48), the switching circuit may include a first switching element (M1) configured with an N-channel MOSFET having a source connected to the second terminal; and a second switching element (M2) configured with an N-channel MOSFET having a source connected to the control supply line and a drain connected to the drain of the first switching element. The switching control circuit may stabilize the differential voltage by switching the first switching element between on and off according to the differential voltage (VB−VS) when the voltage at the first terminal has a negative polarity. (Hereinafter referred to as Configuration $W_{E4}$.)

When the voltage (VS) at the first terminal has a negative polarity, a high charge current can be supplied to the bootstrap capacitor. However, if in the period in which the voltage (VS) at the first terminal has a negative polarity the charge current is constantly supplied to the bootstrap capacitor, the bootstrap capacitor may be overcharged. By switching the first switching element between on and off according to the differential voltage mentioned above, it is possible to suppress overcharging of the bootstrap capacitor.

In the semiconductor device of Configuration $W_{E4}$ described above, when the voltage (VS) at the first terminal has a negative polarity, the switching control circuit may keep the first switching element on if the differential voltage is lower than a predetermined voltage (Vth_dff) and keep the first switching element off if the differential voltage is higher than the predetermined voltage. (Hereinafter referred to as Configuration $W_{E5}$.)

It is thus possible to suppress charging of the bootstrap capacitor over the predetermined voltage. That is, it is possible to suppress overcharging of the bootstrap capacitor.

In the semiconductor device of Configurations $W_{E4}$ or $W_{E5}$ described above, the switching control circuit may keep the second switching element off if the voltage (VS) at the first terminal is higher than a positive threshold voltage (Vth_p). (Hereinafter referred to as Configuration $W_{E6}$.)

It is thus possible to suppress discharging of the bootstrap capacitor via the first and second switching elements.

In the semiconductor device of any of Configurations $W_{E4}$ to $W_{E6}$ described above, the switching control circuit may keep the first and second switching elements on if the first output transistor is off and the second output transistor is on. (Hereinafter referred to as Configuration $W_{E7}$.)

It is then possible, in the period in which the first output transistor is off and the second output transistor is on, to supply the necessary current to the bootstrap capacitor. In the period in which the first output transistor is off and the second output transistor is on, the current that passes through the bootstrap capacitor is comparatively low. Thus, there is no risk of the bootstrap capacitor being overcharged with the current in this period.

In the semiconductor device of any of Configurations $W_{E2}$ to $W_{E7}$ described above, the switching control circuit may include: a comparator (520) configured to compare a feedback voltage (Vfb) corresponding to the differential voltage with a reference voltage (Vref); and a logic circuit (540) configured to generate a control signal (Sig_5$d$) for controlling the state of the switching circuit based on the comparison result from the comparator. Thus, the switching control circuit may forms a feedback loop that includes the comparator and the logic circuit (Hereinafter referred to as Configuration $W_{E8}$.)

Forming a feedback loop helps keep an adequate charge voltage for the bootstrap capacitor.

In the semiconductor device of configuration $W_{E8}$ described above, the switching control circuit may have, inserted between the comparator and the logic circuit, a gain adjustment circuit (530) that can adjust the gain of the feedback loop. (Hereinafter referred to as Configuration $W_{E9}$.)

It is thus possible to obtain desired response characteristics with respect to the feedback control on the charge voltage of the bootstrap capacitor.

The invention claimed is:

1. A semiconductor device, comprising:
a first output transistor;
a second output transistor connected, at a low-potential side of the first output transistor, in series with the first output transistor;
a first terminal connected to a connection node between the first and second output transistors;
a second terminal configured to be connected via a bootstrap capacitor to the first terminal;
a first driver configured to drive the first output transistor based on a voltage between the first and second terminals;
a second driver configured to drive the second output transistor;
a first switching element configured with an N-channel MOSFET having a source connected to the second terminal;
a second switching element configured with an N-channel MOSFET having
a source fed with a predetermined control supply voltage and
a drain connected to a drain of the first switching element;

a switching control circuit configured to turn the first and second switching elements on or off according to a voltage at the first terminal;
a first charge pump circuit having a first output node, the first charge pump circuit being capable of generating at the first output node a first boosted voltage higher than a voltage at the second terminal by performing first charge pump operation based on the voltage at the second terminal relative to a potential at the first terminal; and
a second charge pump circuit having a second output node, the second charge pump circuit being capable of generating at the second output node a second boosted voltage higher than the control supply voltage by performing second charge pump operation based on the control supply voltage relative to a ground potential,
wherein the first output node is connected to a gate of the first switching element,
the second output node is connected to a gate of the second switching element,
the switching control circuit is configured to
turn the first switching element on by making the first charge pump circuit perform the first charge pump operation, and
turn the second switching element on by making the second charge pump circuit perform the second charge pump operation.

2. The semiconductor device according to claim 1, wherein
when the voltage at the first terminal has a negative polarity, the switching control circuit switches the first switching element between on and off according to a differential voltage between the first and second terminals relative to a potential at the first terminal.

3. The semiconductor device according to claim 2, wherein
when the voltage at the first terminal has a negative polarity, the switching control circuit
keeps the first switching element on if the differential voltage is lower than a predetermined voltage and
keeps the first switching element off if the differential voltage is higher than the predetermined voltage.

4. The semiconductor device according to claim 1, wherein
the switching control circuit keeps the second switching element off if the voltage at the first terminal is higher than a positive threshold voltage.

5. The semiconductor device according to claim 1, wherein
the switching control circuit keeps the first and second switching elements on if the first output transistor is off and the second output transistor is on.

6. The semiconductor device according to claim 1, wherein
the second output transistor is provided between the first terminal and a reference conductor at a ground potential.

* * * * *